United States Patent [19]
Hyatt

[11] Patent Number: 4,829,419
[45] Date of Patent: May 9, 1989

[54] MICROCOMPUTER CONTROL OF MACHINES

[76] Inventor: Gilbert P. Hyatt, 7841 Jennifer Cir., La Palma, Calif. 90623

[21] Appl. No.: 860,256

[22] Filed: Dec. 14, 1977

Related U.S. Application Data

[63] Continuation-in-part of Ser. No. 354,590, Apr. 24, 1973, Pat. No. 4,038,640, and a continuation-in-part of Ser. No. 101,449, Dec. 28, 1970, abandoned, and a continuation-in-part of Ser. No. 101,881, Dec. 28, 1970, abandoned, and a continuation-in-part of Ser. No. 879,293, Nov. 24, 1969, abandoned.

[51] Int. Cl.[4] .............................................. G06F 15/46
[52] U.S. Cl. ................................ 364/188; 364/474.01
[58] Field of Search ............... 364/107, 474, 120, 130, 364/167-171, 188, 189, 475; 318/570, 573, 574

[56] References Cited

U.S. PATENT DOCUMENTS

| | | | |
|---|---|---|---|
| 3,088,661 | 5/1963 | Brigham et al. | |
| 3,142,820 | 7/1964 | Daniels. | |
| 3,187,321 | 6/1965 | Kameny. | |
| 3,209,074 | 9/1965 | French. | |
| 3,297,107 | 1/1967 | Shipp. | |
| 3,315,235 | 4/1967 | Carnevale et al. | 364/200 |
| 3,332,071 | 7/1967 | Goldman et al. | |
| 3,346,853 | 10/1967 | Koster. | |
| 3,356,836 | 12/1967 | Stenby. | |
| 3,389,404 | 6/1968 | Koster. | |
| 3,398,241 | 8/1968 | Lee. | |
| 3,462,742 | 8/1969 | Miller et al. | 364/200 |
| 3,569,814 | 3/1971 | Rosenberg | 364/107 |
| 3,573,738 | 4/1971 | Bottles et al. | 364/107 |
| 3,593,313 | 7/1971 | Tomaszewski | 364/200 |
| 3,629,560 | 12/1971 | Slawson | 364/107 |
| 3,634,662 | 1/1972 | Slawson | 364/107 |
| 3,646,522 | 2/1972 | Furman | 364/200 |
| 3,668,653 | 6/1972 | Fair et al. | 364/474 |
| 3,699,317 | 10/1972 | Middleditch | 364/107 |
| 3,702,988 | 11/1972 | Haney | 364/200 |

OTHER PUBLICATIONS

Boysel–"Adder on a Chip: LSI Helps Reduce Cost of Small Machine,"–*Electronics*, Mar. 18, 1968, pp. 119–124.
Hopkins–"Electronic Navigator Charts Man's Path to the Moon" *Electronics*, Jan. 9, 1967, pp. 109–118.
Levy et al.–"System Utilization of Large Scale Integration," Oct. 1967–*IEEE Trans. on Electronic Computers*, vol. EC-16, No. 5, pp. 562, 566.
Beelitz et al.–"System Architecture for Large Scale Integration"–AFIPS Conf. Pro., vol. 31, pp. 185–200, Nov. 1967.

*Primary Examiner*—Joseph Ruggiero
*Attorney, Agent, or Firm*—Gilbert P. Hyatt

[57] ABSTRACT

A microcomputer system is provided that facilitates system interaction with a machine. System architecture provides for processing machine inputs and generating machine outputs under microcomputer program control to enhance capability and flexibility and to reduce special purpose interface circuitry. Use of a microcomputer having an integrated circuit read only memory for program storage, an integrated circuit RAM or scratch pad memory for alterable operand storage, and integrated circuit logic enhances cost, performance, reliability, and other considerations.

48 Claims, 30 Drawing Sheets

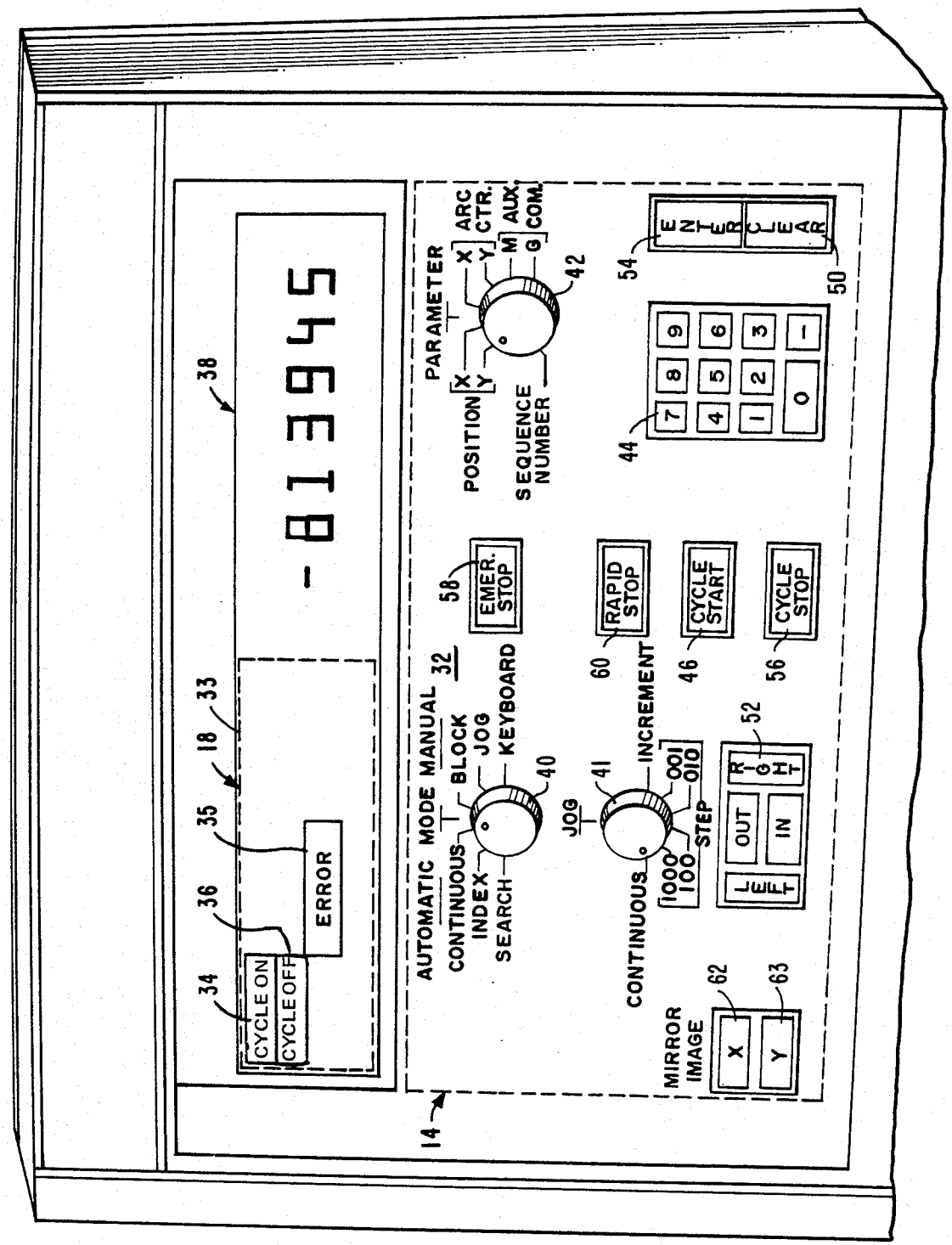
FIG.—2A

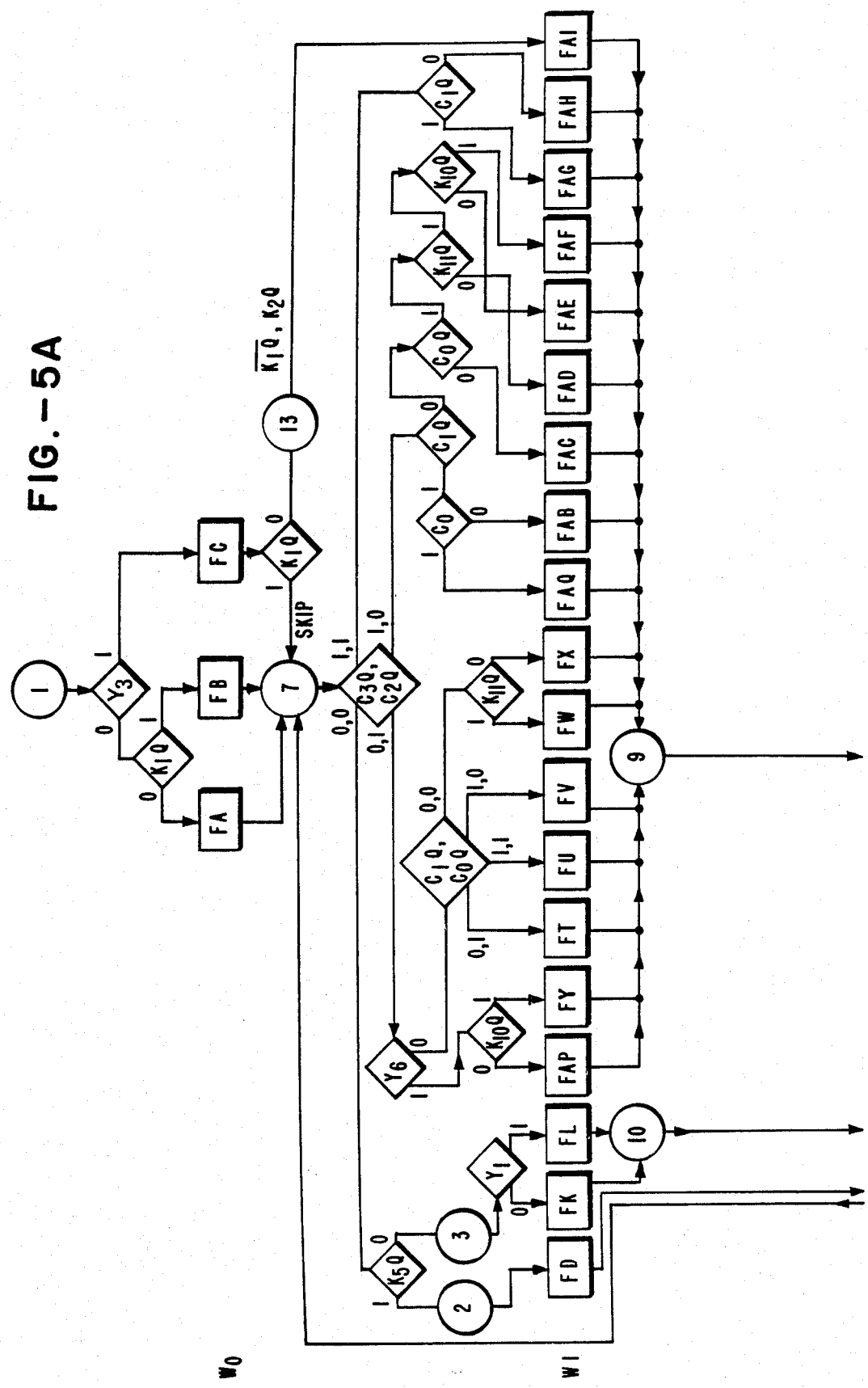
FIG.—5A

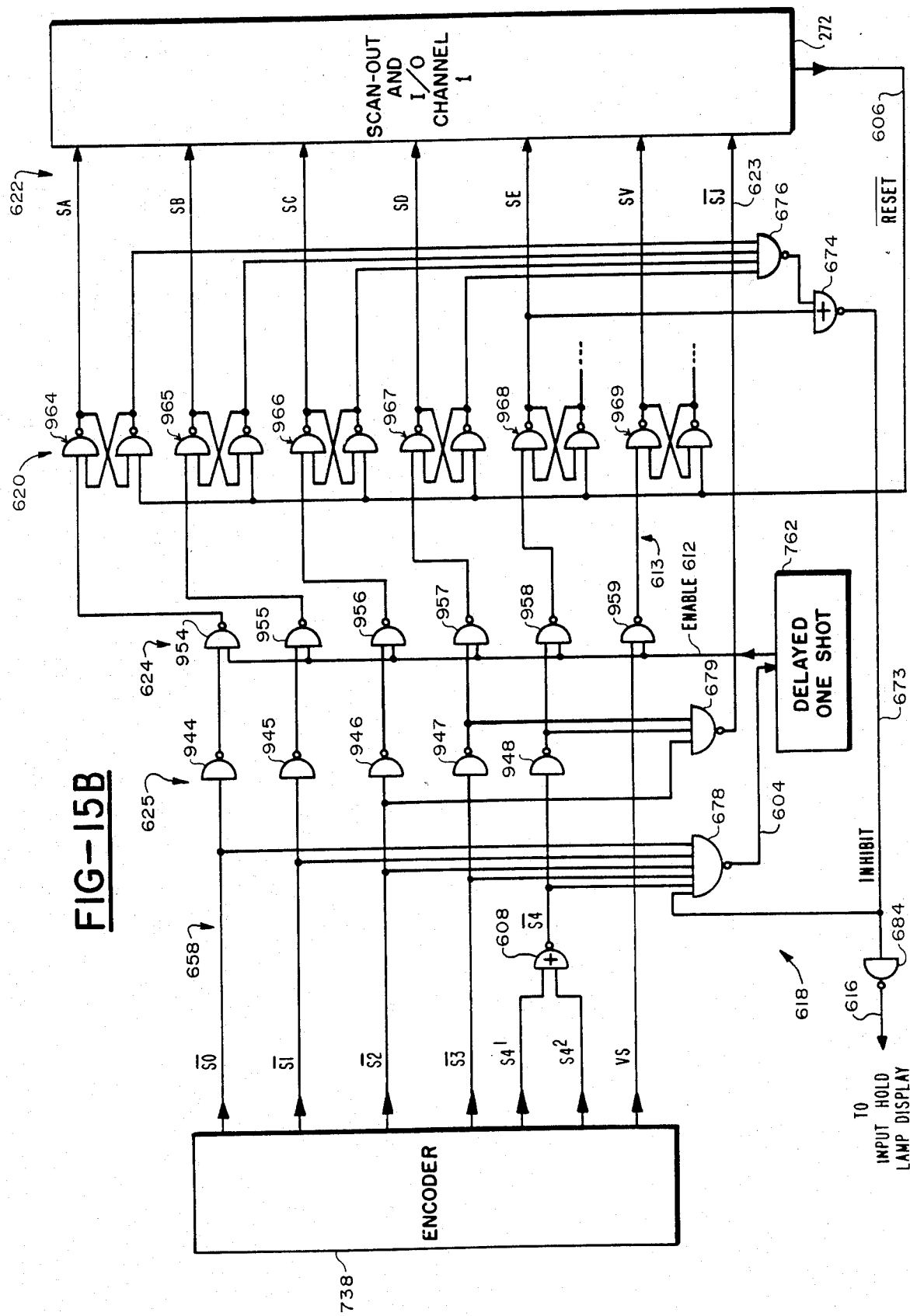

MICROCOMPUTER CONTROL OF MACHINES

CROSS-REFERENCE TO RELTATED APPLICATIONS

This application is a continuation-in-part of the chain of copending applications including 1. METHOD AND APPARATUS FOR PROCESSING THE DIGITAL OUTPUT OF AN INPUT MEANS Ser. No. 879,293 filed on Nov. 24, 1969 by Gilbert P. Hyatt now abandoned in favor of continuing application Ser. No. 101,881 and 2. FACTORED DATA PROCESSING SYSTEM FOR DEDICATED APPLICATIONS Ser. No. 101,881 filed on Dec. 28, 1970 by Gilbert P. Hyatt;

wherein the benefit of the filing dates of these two applications is herein claimed under 35 USC 120, 35 USC 121, and other authorities provided therefor;

wherein the instant application is further related to applications

3. INTERACTIVE CONTROL SYSTEM Ser. No. 101,449 filed on Dec. 28, 1970 by Lee, Cole, Hirsch, Hyatt, and Wimmer now abandoned in favor of continuing application Ser. No. 354,590 and 4. INTERACTIVE CONTROL SYSTEM Ser. No. 354,590 filed on Apr. 24, 1973 by Lee, Cole, Hirsch, Hyatt, and Wimmer now U.S. Pat. No. 4,038,640 issued on July 26, 1977; and wherein said applications Ser. No. 879,293; Ser. No. 101,881; and Ser. No. 101,449 are herein incorporated-by-reference as if fully set forth at length herein.

BACKGROUND OF THE INVENTION

1. Field of the Invention

This invention relates to electronic data processing systems and more particularly to machine control systems.

2. History of the Prior Art

Interaction with a machine in prior art systems is typically performed with special purpose interface logic, even if a computer is available in the system. The computer is typically protected from direct real time interaction with special purpose circuits which receive inputs and generate outputs in real time to relieve the computer of interface tasks that were considered not suited to computer capability.

A further discussion of the prior art is set forth in parent application Ser. No. 101,881 as-amended at page 1 line 29 to page 3 line 29; which discussion is herein incorporated by reference.

SUMMARY OF THE INVENTION

A computer systems architecture is provided where a microcomputer is used for direct interaction with a machine to enhance communication and to reduce special purpose interface circuitry. In a preferred embodiment, the microcomputer monitors machine inputs and interprets the machine information under program control thereby reducing machine interface circuits and the microcomputer packs and outputs machine control information under program control thereby reducing machine control interface circuits.

A computer architecture is provided that can be fully implemented with integrated circuits. An integrated circuit ROM is used for program storage and an integrated circuit scratch pad memory is used for alterable storage of operands. This invention considers that a fully integrated circuit computer may require non-volatile and electrically alterable capability such as provided with prior art core memories. Integrated circuit memories having both non-volatile and alterable capability did not exist at the effective filing date of the instant application. Therefore, a combination of memories is used to overcome the limitations of existing memories. An integrated circuit ROM is used to provide non-volatile storage capability, but the ROM is not able to provide alterable capability. Therefore, an integrated circuit alterable memory is used to provide alterable storage capability even though the storage is volatile. A computer architecture is provided for accessing instructions stored in ROM for processing operands stored in alterable scratch pad memory to utilize the advantages of both memory types and to compensate for the disadvantages of both memory types.

A further summary of the present invention is set forth in parent application Ser. No. 101,881 as-amended at page 4 line 2 to page 6 line 13; which summary is herein incorporated by reference.

BRIEF DESCRIPTION OF THE DRAWINGS

A better understanding of the invention may be had from a consideration of the following detailed description, taken in conjunction with the accompanying drawings, in which:

FIG. 5 comprising FIGS. 5A and 5B is a micro-operation flow chart for the data processor shown in FIG. 4;

FIG. 6 comprising

FIG. 16 comprising

FIG. 17 comprising

FIG. 20 illustrates the manner in which the separate sheets of drawings of FIGS. 5A and 5B, FIGS. 6A and 6B, FIGS. 14A and 14B, FIGS. 16A and 16B, and FIGS. 17A and 17B are combined for form FIGS. 5, 6, 14, 16 and 17 respectively.

DETAILED DESCRIPTION

Introduction

Figure 1:
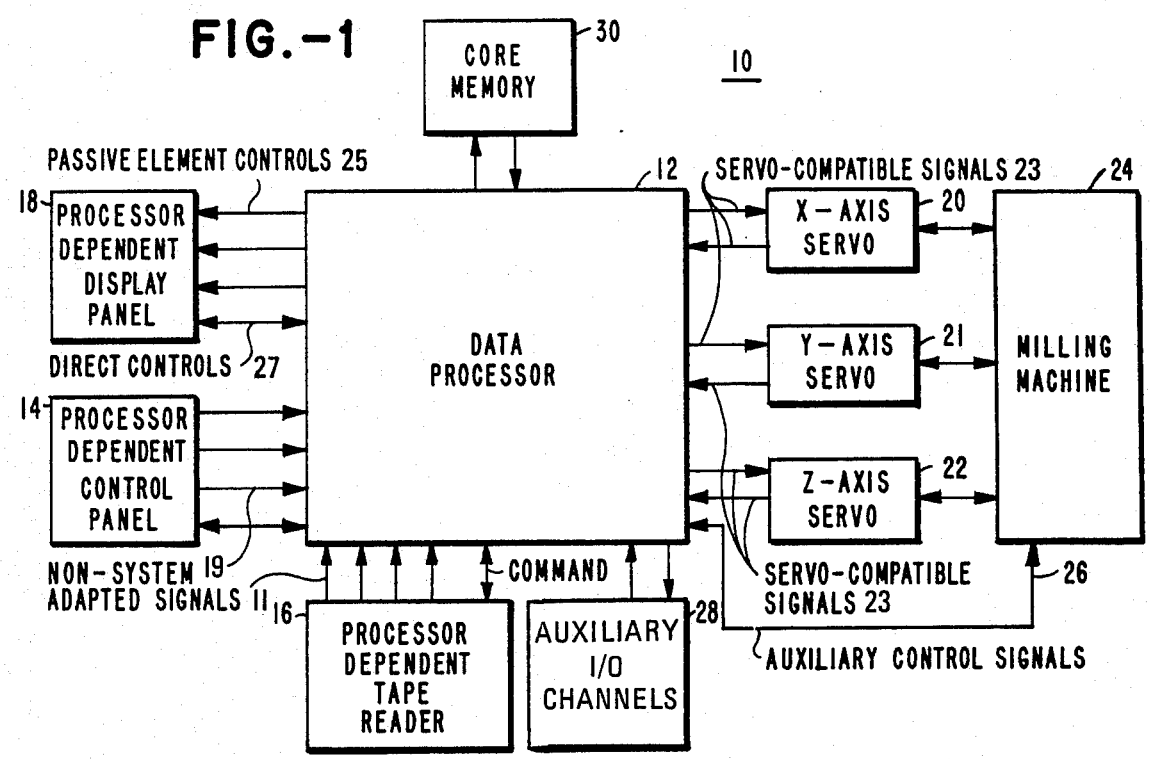
FIG. 1 is a block diagram representation of a numerical control system in accordance with the invention.

A computer system in accordance with the present invention is represented in block diagram form in FIG. 1 as a numerical control system 10, including an electronic data processor 12, arranged in accordance with the invention. The specific example referred to here and described hereafter relates to a three-axis controlled milling machine, but it will readily be appreciated that systems in accordance with the invention may be applied to a wide variety of tasks including communication, process control, processing of business data and other control operations such as photo-optical pattern generators and multi-turret machines.

In accordance with the basic concepts of a factored electronics system, the numerical control system (FIG. 1) provides an illustration of this factoring process. The data processor is used in conjunction with the various extremities of the system where some of these extremities are elemental extremities. The data processor has a distributed characteristic, where the raw instruction signals comprised of micro operation and operand address signals are communicated in intrinsic signal form to the interface assembly which is physically distributed and set apart from the data processor 12 and the various extremities that communicate with the data processor through this input-output structure.

The data processor 12 is shown by way of this example to be used in conjunction with a core memory 30. The basic architecture of this data processor will permit an integrated circuit memory, such as a read-only memory (ROM), or a random-access memory (RAM) or flip-flop type memory to be substituted for the core memory 30 to provide a completely integrated circuit computer which might be called a monolithic computer. This monolithic data processor can be implemented on a single integrated circuit chip which can include a read only memory, an alterable memory, and program execution circuitry on the same chip.

The architecture of the computer is oriented towards a factored computer system to permit the data processor to operate in close conjunction with the extremities for this factored computer system. The special organization and instruction repertoire aid in implementing this factored computer system.

The control panel operates with the data processor in a mutually interdependent fashion to yield interactive capability for operator functions.

The photoelectric tape reader 16 is an extremity that inputs part programs to define the part to be cut by the milling machine 24. The real-time non-adapted signal from 19 intrinsic to the tape reader 16 includes not only data but tape reader characteristics caused by photo-optical, electro-mechanical, and electric effects that are inherent to the tape reader, described in the referenced application A Method And Apparatus For Processing The Digital Output Of An Input Means Ser. No. 879,293 filed on Nov. 24, 1969. The data processor accepts these instrinsic signal forms directly from the tape reader and derives the required data from the ambiguity and errors present in this intrinsic signal form.

The milling machine 24 is an extremity of the system which can be implemented as an elemental extremity in conjunction with the data processor. Direct control of the various machine functions, such as storing the tool positions, compensating for tool characteristics, and controlling a turret motor for tool selection reduce the machine interface that is often implemented with relay logic and other such "magnetics". The machine axes pickoffs in the square-wave servo loop can be used directly by the data processor to derive position, velocity and acceleration information pertaining to the motion of machine axes.

The axes servos 20, 21, and 22 are a typical example of elemental extremities. The communication between the data processor and the axes servos is in a signal form wherein the whole number aspect is intrinsic to the data processor and wherein the square-wave aspect is intrinsic to the axes servos. This intrinsic signal form simplifies the communication interface between the data processor and the axes servos and relieves limitations previously imposed on servos for numerically controlled machines.

The operative dispersion associated with this factored computer system is typified by the multi-axes contouring capability of the system. The data processor performs the contouring computations in whole number form intrinsic to the data processor and generates the resultant whole number commands for the axes servos. The operative dispersion provides extremely high levels of performance with a significant reduction in hardware and a reduction in the computational burden placed on the data processor. The intrinsic signal forms of the servos have a whole-number square-wave characteristic that is acceptable to the data processor in a non-adapted form to provide interactive communication between the data processor and the axes servos to provide adaptive control capability with this elemental extremity. The axes servos illustrate an elemental extremity that can yield a high level of economy and versatility with a reduced burden on the data processor together with the additional capability of adaptive control.

The present invention more particularly incorporates the normal computer functions of controlling, performing mathematical computations, and storing data into a physically distributed, operatively dispersed system providing concurrent internal control of coation with associated extremities.

The substantially direct communication between the computer and the extremities permits the reduction or elimination of interface logic and interface controllers required in prior art systems.

Specific data processor features include an adaptive memory control power interrupt technique preventing detrimental system operation and a memory protect technique creating inalterable fields in an electrically alterable memory. Functional modifiers permit shortened program instructions without sacrifice of program capability or flexibility.

One technical area in which systems in accordance with the invention have particlular advantage is in the control of multi-axis machine tools and the control of photo-optical plotters to provide output products. Other areas of particular advantage include the processing of communications and business data, for instance, payroll processing and inventory control. In all of these applications the system can receive rudimentary data in real-time intrinsic signal form from an elemental extremity such as an axis servo, process the nonadapted intrinsic signals, and provide data to the system. The system in turn commands an output device in a signal form which may be readily usable by or intrinsic to the output device, such as a servo system. Use of the physical distribution and operative dispersion of the system in conjunction with processor-dependent elemental extremities operating in nonadapted language modes permit great versatility to be attained with low manufacturing cost. Furthermore, orientation of the system to a different class of tasks involves no significant redesign, but primarily involves changes in the data processor program.

A general-purpose data processor in accordance with this invention may include multiple data and program registers, a random access memory and a scratch pad memory, and nonbuffered, directly coupled input-output lines connected to elemental input-output devices. These elements perform basic or prime functions and are physically distributed at different locations in the system, with operative dispersion making them functionally available throughout the system. This system comprises a numerical control machine, e.g., for three axis controlled milling machine, and closely integrates the operator and other input and output operations into the numerical control tasks. Minimal structure input-output extremities in this particular example comprise an elemental tape reader 16 and operator panels 14 and 18, servos 20, 21, and 22 for independent tool axis control and a passive data display 18. The data processor in real time concurrently monitors these extremities, pre-processes the external manifestations into machine-adaptable or intrinsic data, and generates extremity intrinsic or extremity-adapted extrinsic commands. The data processor concurrently operates under program control to perform the other aspects of the task, including carrying out complex computations for tool path control, generating servo commands for each of the controlled axes, sequencing through the program, providing other machine controls and generating graphical and printed output data if needed.

Part program inputs are provided by a photoelectric punched tape reader having Model No. RRS0304RA, manufactured by Remex Electronics. The manual for this tape reader is TRM-902U and is incorporated herein by reference.

Data and program storage is provided by a core memory 30 which may be commercially available memory having Part No. 909838-A01, manufactured by Electronic Memories, Inc. Electronic Memories Inc. drawings 909811–909819 and 910792 show this memory in detail and are incorporated herein by reference. This is an 8-bit 4096 word core memory which is primarily devoted to program storage. Remaining portions may be used for data storage if desired. In this application, the core memory 30 (CM) may be replaced by a read-only memory (ROM) such as a MOS FET read-only memory sold commecially by General Instruments Corporation of Hicksville, N.Y. or a flip-flop memory.

In a typical, very generalized example of the operation of the system of FIG. 1 for control of a milling machine 24, the data processor 12 accepts part program data from the tape reader 16 and operator inputs from the control panel 14 to commence the computation of servo commands. As the reader 16 and panel 14 are operated, the processor 12 is under program control to monitor the operative states of these devices and pre-processes the rudimentary data itself. Concurrently, and also under program control, the display panel 18 is activated by exciting the passive elements to form desired characters at a flicker-free rate. These time-related monitoring and pre-processing subtask functions concerned with the extremities continue to be carried out as needed as the processor 12 enters into its computational and processing operations concerned with its main task, that of executing the part program in real time. Thereafter, command data is translated into servo commands for the individual servos 20, 21, and 22, in intrinsic servo signal form. Feedback signals in the intrinsic servo format are likewise returned to the processor 12, pre-processed for conversion into the processor base language and utilized in further computations.

Programming of computers is a well-known art and is described in detail in the prior art literature such as PROGRAMMING: AN INTRODUCTION TO COMPUTER LANGUAGES AND TECHNIQUES by Ward Douglas Maurer for Holden Day Inc. (1968); PROGRAMMING FOR DIGITAL COMPUTERS by Joachim Jeenel for McGraw Hill (1959); FUNDAMENTALS OF FLOWCHARTING by Thomas J. Schriber for John Wily and Sons (1969); and ELEMENTS OF COMPUTER PROGRAMMING by Swallow and Price for Holt, Rinehart, and Winston (1965); incorporated herein by reference. The programs to provide data processor operations described hereinafter will be obvious to those skilled in the programming art from the descriptions of these desired operations. Further, coding of programs for use with the particular computer described herein will be obvious to those skilled in the programming art from the description of computer instructions provided hereinafter.

There are profound differences between systems thus arranged and operated and systems of the prior art. In the physical and operational sense, the data processor 12 is a much greater portion of the whole, and the associated units 14, 16, 18, 20, 21 and 22 are extremities of the processor 12. These extremities, which may not be independent in terms of control, are largely directly coupled to the processor 12. Each elemental extremity has certain characteristic relationships to the system, although other differences necessarily exist. Each relies essentially upon the operatively dispersed program capabilities of the processor 12. Each further effectively relies upon the processor 12 for pre-processing of the nonadapted signal forms for interpretation of signals and meaningful time-related data transfer. In this respect, digital buffering, conversion, and signal conditioning operations ordinarily provided by interface logic circuits are also avoided. Furthermore, the processor 12 itself need not be tailored in configuration to cooperate with predetermined interface formats and requirements. In a further respect, the data processor presents data or accepts data in real time from/to system extremities in intrinsic signal forms such that the processor itself can effect the significance of such terms.

Elimination of physical identities are representative of what is herein termed physical distribution, where the processor 12 can be distributed throughout the preponderance of the task-performing system. Yet, by virtue of the operational dispersion of the system and other prime functions, this task-performing system may readily be modified, with a minimum of hardware changes to perform another task. Such change entails the essential modification of the system program, and also modification of the subtask programs and their relation to the task-pertinent program. It should be appreciated that the operative dispersion of the system encompasses and eliminates much of the interface circuitry that is redundant when used in conjunction with a data processor.

For the performance of many tasks, as in the numerical control field, systems in accordance with the invention can utilize a relatively small-scale computer without overloading. Concurrent performance of the subtasks does not in the usual instance result in excessive demands on the processor. To the contrary for numerical control systems, the general-purpose computational capability of the system hereafter described can generally be utilized to perform many functions such as contouring functions.

The data processor 12 is organized to operate in a manner somewhat similar to presently known stored program digital computers. The fundamental theory and technology of such presently known systems are described in Chapter 11 of *Digital Computer Design Fundamentals*, Yaohan Chu, McGraw-Hill Book Co., Inc. (New York, 1962) incorporated herein by reference.

The data processor 12 is organized to process 8-bit words with most working and storage registers having a 16-bit capacity permitting the storage of two words. Serial transfer of data is used throughout the data processor 12 to minimize the logic and interconnections required.

The data processor 12 includes a 12-bit memory address register (M Register) which defines a memory location being accessed in the main memory 30. A memory data register (D-Register) defines an operand location such as in the scratch pad memory and input/output (I/O) channels. Thirty-two Scratch Pad Memory (SPM) Registers provide convenient intermediate storage, independent of the main memory. A three-bit counter divides the execution of program instructions into word times and a four-bit counter subdivides the word times into bit times, the basic operating intervals.

Figure 5B:
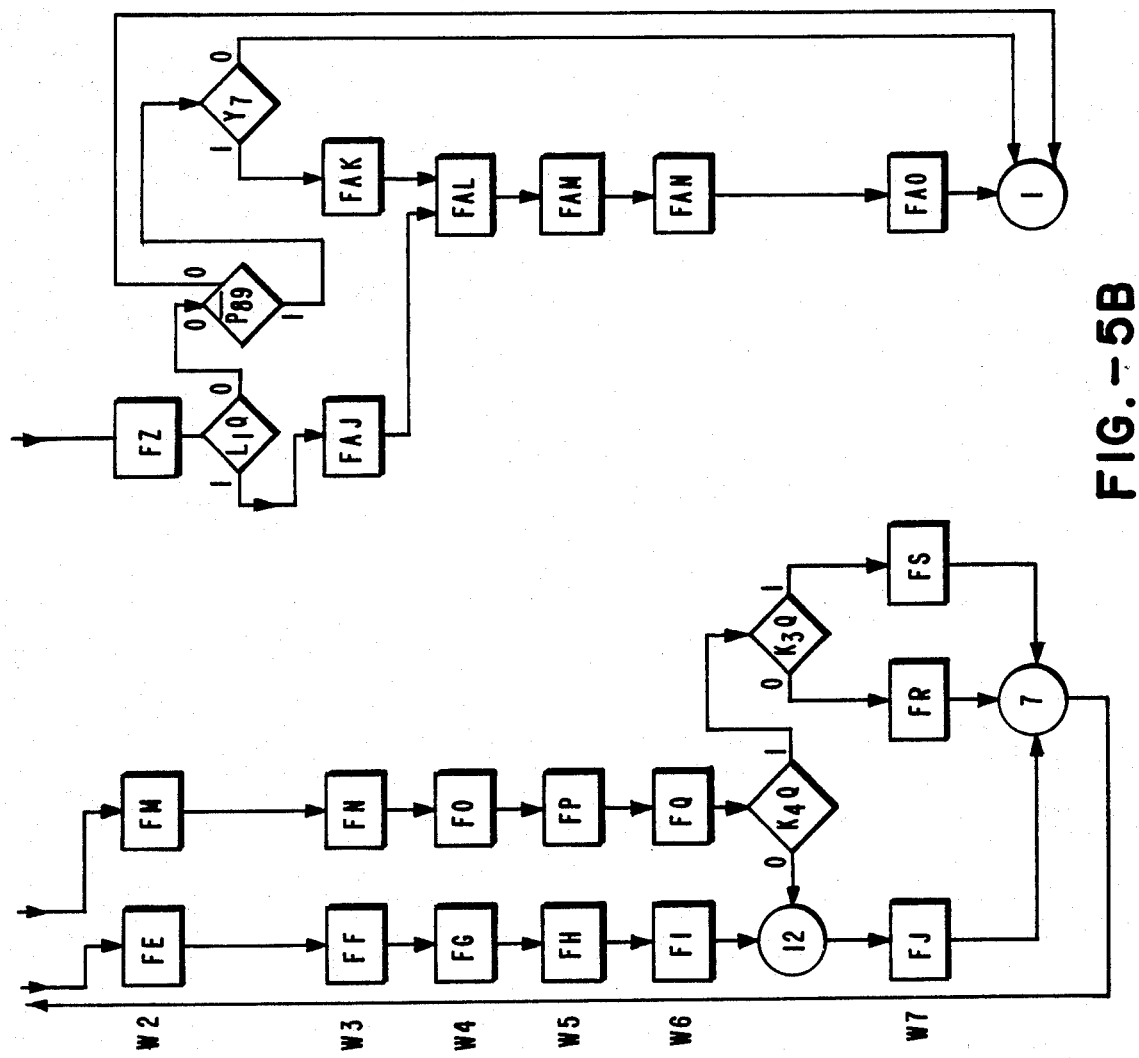

The data processor operates by executing programmed instructions received from the main memory. When an instruction is received, control logic causes the data processor to progress through a matrix of micro operations, the exact path varying with the instruction being executed. Each micro operation occurs during one of the eight possible word times, 0 thru 7, and performs a micro operation portion of the instruction being executed. Upon completion of the FZ micro operation, the data processor recycles through the matrix including flow diagram paths LIQ and P89; or LIQ, P89, and Y7; or LIQ, FAJ, FAL, FAM, FAN, and FAO; or LIQ, P89, Y7, FAK, FAL, FAM, FAN, and FAO as shown in FIG. 5B to begin execution of the next instruction.

The following description of the system, as will be evident to those skilled in the art, comprises a complete definition of a preferred embodiment in accordance with the invention. In order to simplify the description and drawings, extensive use has been made of logical equations, which per se are definitive of detailed circuit elements and interconnections for a specific system, in accordance with modern integrated circuit techniques and is well known to those skilled in the art. In order to simplify the description, extensive and orderly reference is made to principal micro operations, both in the form of the states of major subsystems at particular points in time during these micro operations as well as in the form of the sequences and purposes of each micro operation. The totality of these principal micro operations completely define the operation of this processor system.

It will also be recognized by those skilled in the art that the description of details of structure and operation of a general-purpose computer system is of necessity extended and complex. For convenience and ease of understanding the following description commences with those units most apparent to and used by an operator.

CONTROL PANEL AND DISPLAY PANEL

A control system for an electronic data processing system minimizes hardwiring and specialized components and circuits and provides bidirectional communication between a data processor within the data processing system and an operator via intermediary binary digital input and output words. A separate aspect is the provision of a master control panel configuration including means for receiving input and output elements having generalized identities, in conjunction with encoder and decoder means interposed in the circuitry and reducing the interconnections between the panel and the data processing system. The control system converts the status of selector switches and momentary switches to signals representing an intermediary input word. The data processor processes and interprets the signals representing the input word and generates appropriate system responses. The data processor also generates and processes intermediary output words having a selected format for controlling lamp displays and segmented elements generating numeric displays. Consequently, the panel and system have relatively few interconnections but the use of generalized terms permits input positions and output displays to have varying and selectable meanings, as determined by the data processing system itself. The interactive control system includes decoders and drivers which illuminate displays in response to the output words. Circuitry is reduced by using a single numeric display register to control illumination of several numeric displays by sequentially illuminating the numeric displays at a flicker-free rate. Each numeric display is excited at a rate of 30 cycles per second, requiring the contents of the numeric display register to be changed at a cyclic rate of 240 cycles per second.

Interactive control systems in accordance with the invention provide bidirectional communication between an operator and a data processing system via intermediary binary digital words. The interactive control system is an elemental extremity of the data processing system, providing unprocessed rudimentary data for a data processor and receiving preprocessed data for control of display illumination from the data processor. This elemental control system is dependent on processor coaction for performance of the task of interactive communication with an operator. The data processor operates under the control of a selected stored program to interpret input words and produce an appropriate system response, and provide output words having an appropriate format.

An elemental panel for use in systems of the type disclosed herein are processor dependent structures having means for receiving panel elements and having circuit conductors for coupling elements, and having electronic means in the conductive paths for signal processing. By this arrangement, uncommitted elements can be added or changed and the significance of given panel positions can be determined at processor option under program control without being previously committed through wired operation. The outputs of operator controllable selector switches and momentary switches are transformed to binary codes for greater efficiency. The coded outputs from the momentary switches may be gated to latches which hold the information until samples by the data processor. Appropriate interlocks and interlock overrides may be used to control the effect of continuous depression of a momentary switch. The binary coded outputs of each selector switch and the combined momentary switch are combined to form a single intermediary input word with each binary coded output occupying a different portion of the word. The word is then sampled and interpreted by the data processor.

A display panel is composed of both lamp displays and numeric displays. Each lamp display driver is connected to a different bit of a lamp display register such that when that bit stores a binary "1" or is "set" the lamp display is lighted. The data processor provides an output word to the lamp display register comprising packed discrete lamp control bits to cause appropriate lamp displays to be lighted.

The numeric display elements may be segmented tubes, Nixie tubes, or similar devices displaying a selected character. A single numeric character display register is used to control all of the numeric displays. Output words are transferred to the numeric display register at a rapid periodic rate. One portion of these words contains a tube (element) select code identifying a particular element and a second part of the word contains a code identifying the character to be displayed. Appropriate decoding logic responsive to the numeric display register causes the appropriate segment drivers of the selected numeric display tube to be activated to display the output character. Each numeric display is then driven in turn to display a selected character. In order to refresh the numeric display at a flicker-free rate of 30 times per second, the processor places a new word in the numeric register at a cyclic rate of 30 times the number of numeric word displays desired each second. Assuming 8 numeric displays, the rate would be 240 times per second and would consume only a small part of the operating time of a modern high speed data processor.

The reduction of direct wiring connections between the interactive control system and the data processing system not only reduces manufacturing costs but provides tremendous versatility for changing system tasks to which the data processing system may be committed. Panel elements are not committed by wired connection to system circuits but are committed under program control of the data processor, providing generalized elements whose significance may be readily changed through changes in the task defining program. System controls and outputs can be varied by merely adding or deleting switches and displays and by changing associated captions in the interactive control system. Corresponding changes in data processor responses are accomplished by making appropriate changes in the stored program.

This invention provides an interactive control system establishing bidirectional communication between an operator and a data processing system. All control and data information passing between an operator and the system passes through an electronic data processor via the medium of intermediary binary digital words.

Figure 2B:
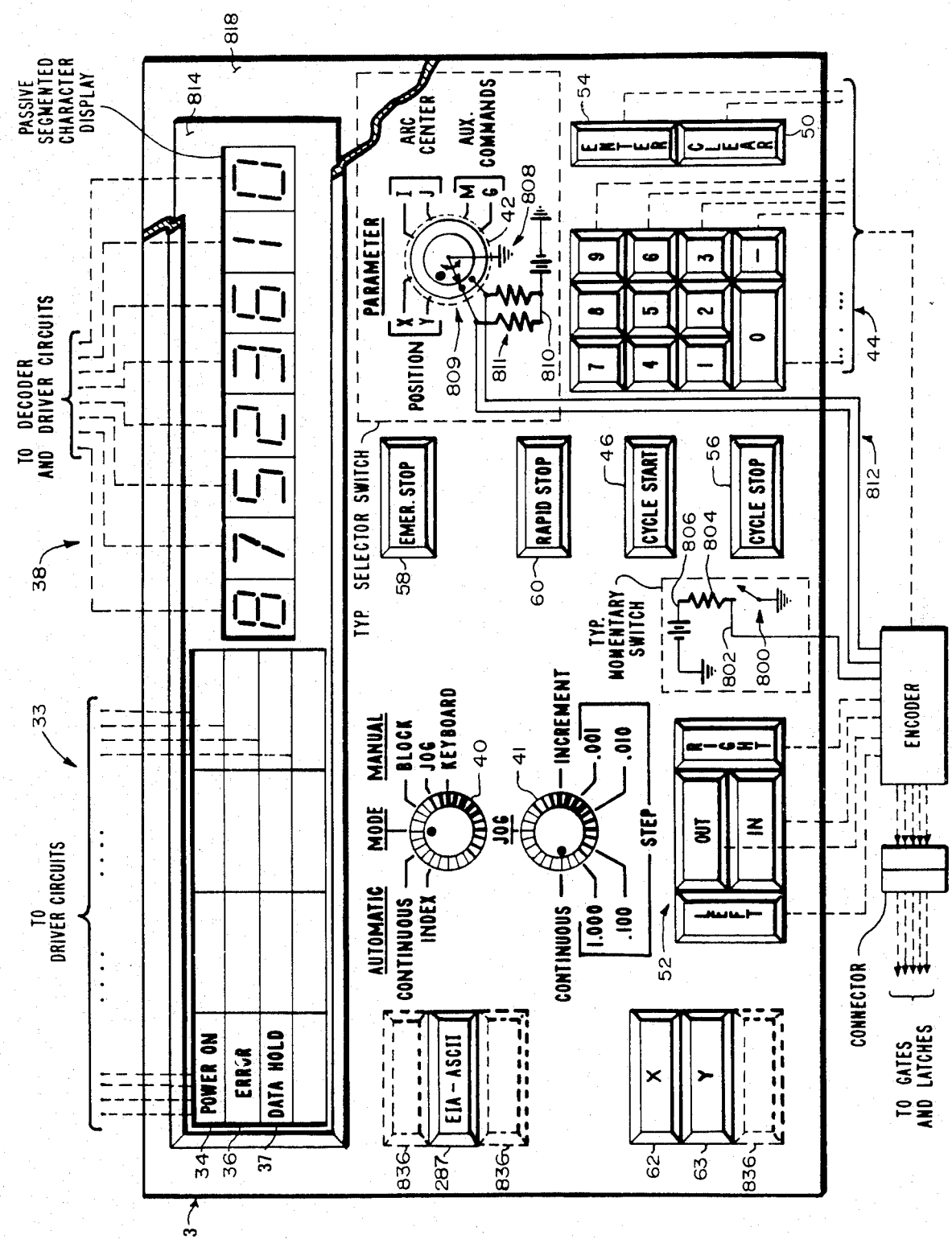
FIG. 2 shows a control panel and display panel making up part of the numerical control system of FIG. 1 comprising FIG. 2A showing a front view of the control panel and display panel, FIG. 2B showing a partly broken away front view of the control and display panel, FIG. 2C showing the interrelation between the control panel and display panel and the data processing system, and FIG. 2D showing the data processor dependent arrangement for refreshing the numeric displays.
Figure 2C:
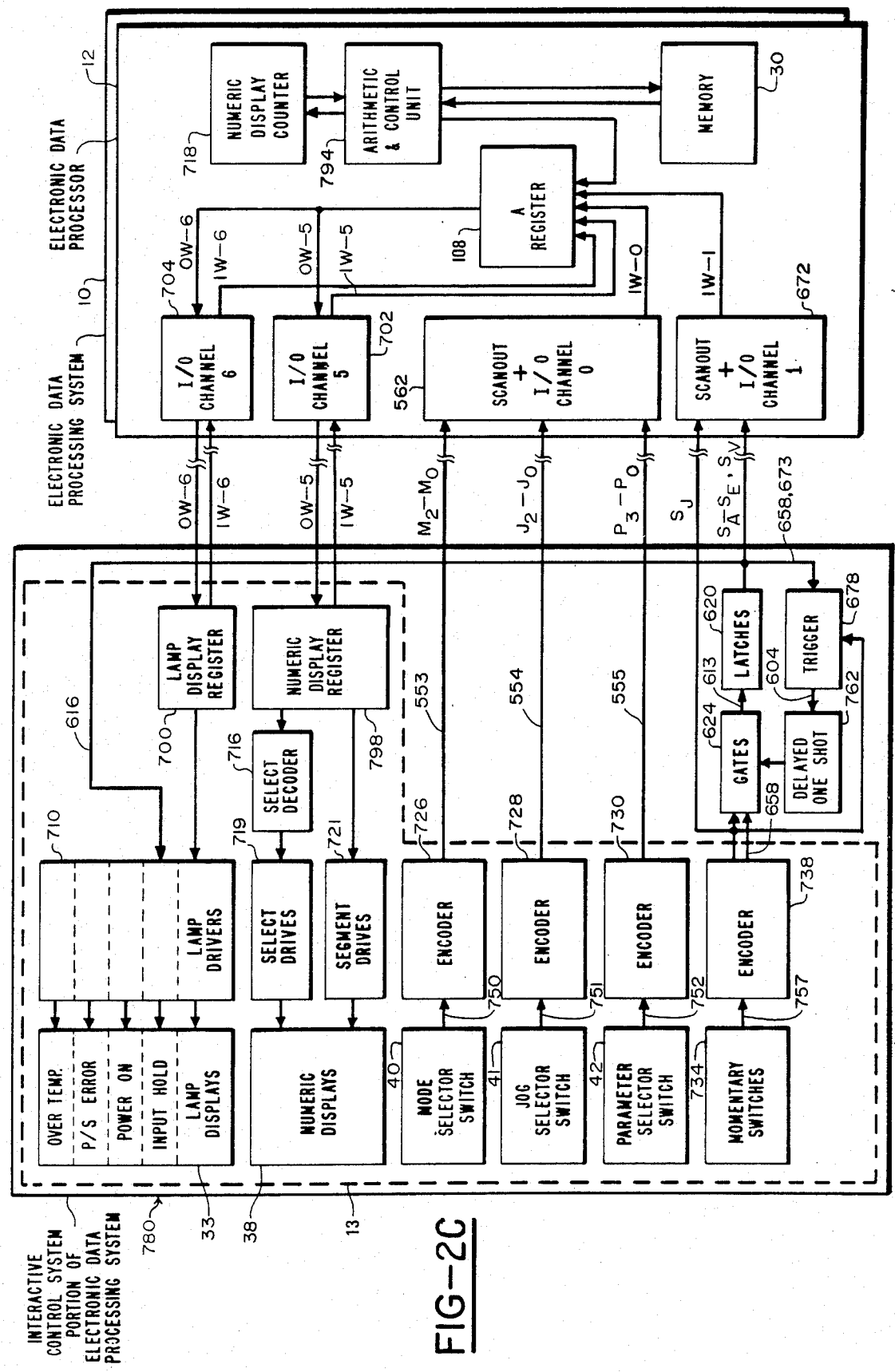

As shown in FIGS. 1 and 2C an electronic data processing system 10 includes an electronic data processor 12 and an interactive control system 780. In general, the electronic data processing system may be any such system but the full advantages of this invention are best realized when used in conjunction with a system which has been committed or dedicated to a specific task or family or tasks, such as numerical control, payroll, accounting, or inventory control. It will be assumed herein, however, that the electronic data processing system 10 is committed to the task of numerical control of a milling machine.

The interactive control system 780 (FIG. 2C) includes a control panel 13 as well as gates 624 and latches 620 which are physically located on available space of a printed circuit board within the electronic data processor 12 but functionally operate as part of the interactive control system 780.

As shown in FIG. 2B a master panel board 818 supports components and circuits, including a display portion 118 of the control system. The panel board 818 may be a printed circuit board having conventional spaced apart apertures or receptacles 36 (FIG. 2B) on the front side into which selector switches and momentary switches may be inserted. Printed circuit wiring to each of the element positions and a minimal amount of electronic circuitry is mounted on the back of the panel board 818 to facilitate error free communication with the data processor. By placing this circuitry in close proximity to the switches and displays, signal lines are held to a minimum length, thereby minimizing costs and errors.

The elemental nature of system subsystems and the related data processor coaction under program control may be utilized to simplify system setup procedures, thereby minimizing setup time as well as errors. One of the major problems that every user of sophisticated control equipment has is that of familiarizing a new operator with the complex maze of switches, lights and other controls. This is particularly important to a company which has a high turnover of personnel. Even experienced operators, on occasion will neglect to set a switch properly or overlook a procedure which could have a disastrous result.

This control panel provides a means for interactivity between the data processor and an operator. Included in this interactivity is a unique feature which permits the data processor to "lead the operator by the hand" through various operations and procedures the operator must perform for proper machine operation.

For this purpose, an operator's manual may be used in conjunction with the numeric displays on the control panel and a special program in the data processor. The operator's manual is divided into several sections, each pertaining to a particular mode of machine operation. The parameter switch would be set to a specified position defining an interactive system initialization condition. This condition would cause the data processor to sense system conditions and respond under selected program control by causing the numeric displays to display a code number identifying a section in the operator's manual. The operator would look up the number in the operator's manual to identify the machine condition or status and the next step of the procedure to place the system into its desired mode. As each procedural step is taken, a new code number appears, showing whether the last step was properly performed until the system can be started. This permits a totally inexperienced operator to sequentially perform the entire system set up or initialization.

As illustrated in FIG. 2, the control panel 14 and the display panel 18 are mounted in a signal rectangular plane with the display panel 18 occupying the upper portion of the plane and the control panel 14 occupying the lower portion of the plane. The lefthand portion of the display panel 18 is occupied by status indicator lamp displays 33 such as the Cycle On indicator lamp 34 and an error indicator lamp 35. These lamp displays provide feedback to the operator by indicating system modes and conditions. All status indicator lamp displays 33 are enhanced with a special filter to suppress glare and provide an easy to read, aesthetically pleasing presentation. Displays and legends that are not illuminated are obscured beind the filter, simplifying rapid appraisal of system conditions and eliminating the need to mentally separate illuminated displays from non-illuminated but visible displays. Included within the status indicator lamp displays 33 are a bank of troubleshooting lamps such as an error indication lamp 35, which are normally obscured behind the filter, but become flashing displays if a malfunction or error should occur. The righthand portion of the display panel 18 is composed of eight numeric displays 38 which may be used to identify the magnitude of system parameters.

DISPLAY PANEL

As described more fully in copending application "Interactive Control System", Ser. No. 101,449, filed Dec. 28, 1970 by Lee et al, and incorporated herein by reference, each lamp display 33 is driven by a well known lamp driver circuit which is controlled by one bit in a lamp display register. The lamp display register stores an intermediary output word output from the data processor 12 which defines the status of the lamp displays 33. In contrast, the numeric displays 38 are driven sequentially in accordance with an intermediary output word stored in a numeric display register.

The display system may be considered to have physical distribution, operative dispersion, and operates with intrinsic signal forms in accordance with the invention. The operative dispersion of the system permits the elemental processor dependent display panel to operate in conjunction with other elements performing prime functions to accomplish a subtask, the communication of information with an operator.

Each numeric display lamp 38 is excited at a 30 cycle per secondflicker free rate under program control in accordance with information contained within a numeric display register. Since the numeric display register controls the excitation of all eight numeric display tubes 38, its content must change at a cyclic rate of 8×30=240 times per second. When an intermediary output word is clocked into the numeric display register, the first three bits select the one of eight lamps to be driven. The remaining bits within the numeric display register select the segments within the driven numeric display which are to be excited. This arrangement affords high versatility with reduced hardware. The operation of each numeric display is under program control and only one numeric display register is needed to drive all eight numeric displays.

The data processor also generates preprocessed intermediary output words having selected formats and transfers them from the A-Register to a numeric display register 798 and a lamp display register 700 through I/O Channel-5 702 and I/O Channel-6 704, respectively. These channels provide bidirectional communication of intermediary output words with the A-Register, permitting previously output words to be returned to the A-Register to check for errors occurring during transmission. The interpretation and processing of intermediary words takes place within the data processor.

The displays include both lamp displays 33 and numeric displays 38. As shown in FIG. 2B both the lamp displays 33 and the numeric displays 38 are mounted on the display subpanel board 814 which is in turn mounted on the mother panel board 818. The lamp displays may be conventional bayonet type lamps and the display subpanel board 18 contains a batch fabricated block of lamp spockets which receive the lamps. These lamp sockets provide the multiple functions of mounting, electrical connection and heat sink. Each lamp may be selectively connected to ground either directly or through a flasher bus. The lamp displays are enhanced with a special filter to suppress glare and provide an easy to read, aesthetically pleasing presentation. Displays and legends that are not illuminated are obscured beind the filter, simplifying rapid appraisal of system conditions and eliminating the need to mentally separate illuminated displays from non-illuminated but visible displays.

The numeric display elements are conventional 9 segment displays capable of displaying all numerical characters and some alphabetic characters. However, the interactive control system has sufficient data capacity to accommodate 13 segment tubes capable of displaying all numeric and alphabetic characters if desired. The eight numeric display elements of this embodiment are mounted horizontally on the display subpanel board 818.

Coupled to the lamp displays 33 are lamp drivers 710 which are coupled to the lamp display register 700. With the exception of a few lamp drivers 710 which are hard-wired to respond to special functions such as over temperature, P/S error, Power on and input hold, each lamp driver responds to a selected bit of an intermediary binary digital output word stored in the lamp display register 700.

Figure 2D:
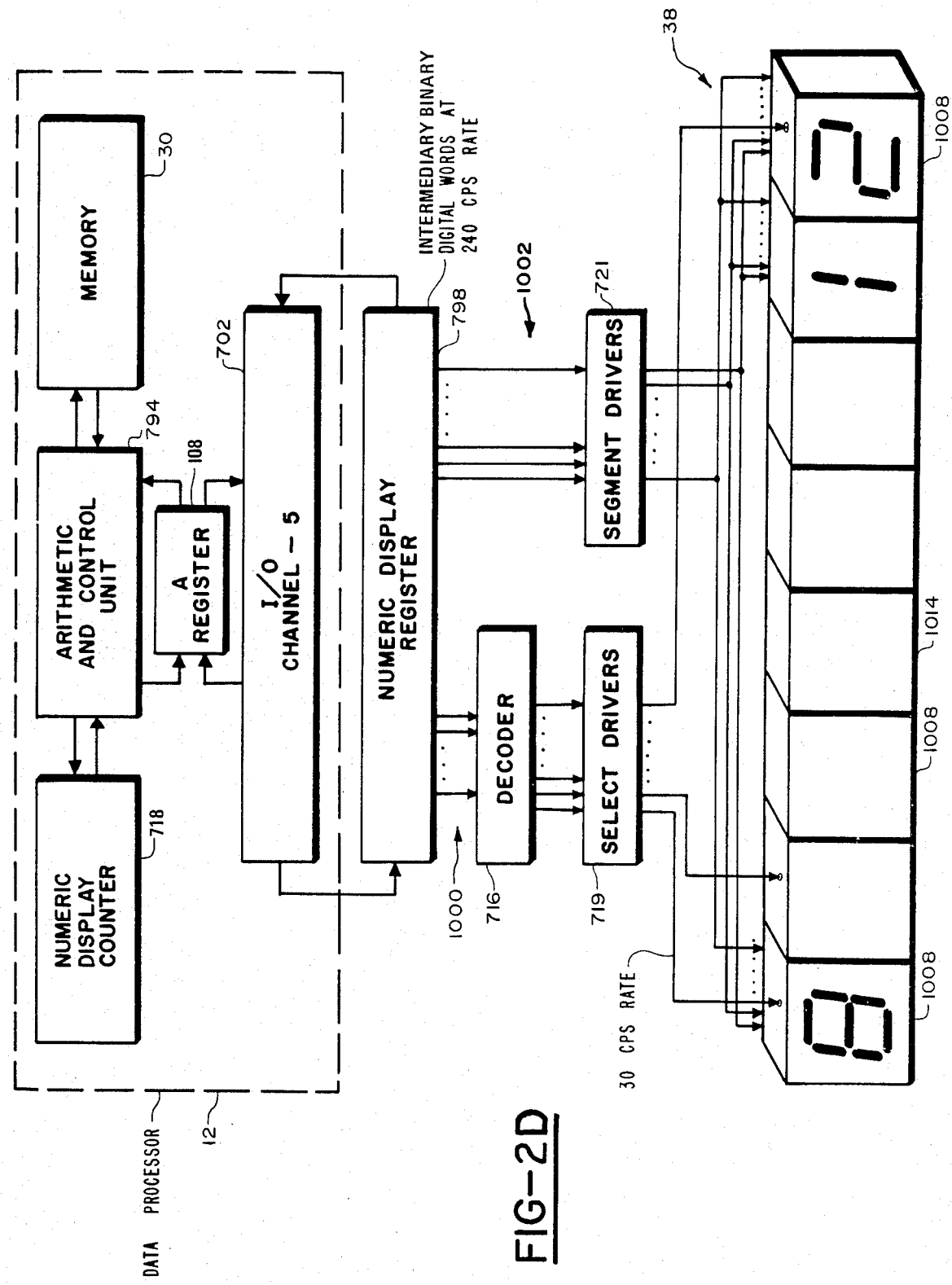

As shown in greater detail in FIG. 2D, the implementation of the 8 numeric display elements 38 is considerably more complex than that used for the lamp displays. Because each numeric display element 1008 requires multi-bit control signals a cyclic technique is used to drive all eight numeric display elements 1008 from a single numeric display register 798, thereby greatly reducing the amount of circuitry required. To accomplish this the eight numeric display elements are sequentially excited at a flicker-free 30 cps rate. In order to excite each numeric display element 1008 at a rate of 30 cps the contents of the numeric display register must change at a cyclic rate of 240 cps.

The numeric display functions are performed in the data processor 12 under program control and include the numeric display counter 718, the update control, the refresh control, and the data registers. These functions are not physically identifiable, but are implemented under program control of the data processor. The display parameter is converted from a binary to a BCD code, then modified for the special segment code requirements of the numeric display tube. The tube identification code is packed into the word, which is output to the numeric display register in the interactive control system.

In order to excite one of the numeric display elements 1008 the data processor 12 utilizes the count of the numeric display counter 718 implemented under program control, for example, binary 3 indicating that the third numeric display element 1014 is to be excited, to access a location in the memory 30 storing information to excite the third numeric display with the proper character. This information is transferred from the memory 30 to a least significant portion of the A-Register 108 where it is joined by the binary count from the numeric display counter parameter (3) stored in memory in the most significant portion to form the intermediary digital output word.

This output word is transferred from the A-Register 108 through I/O Channel-5 702 to the numeric display register 798. As the word is output the numeric display counter is incremented so that the fourth numeric display element will be excited next. In addition to providing intermediary output words to the numeric display register at a rate of 240 cps, the data processor also updates the locations in the memory 30 which store the information determining the character to be displayed by each numeric display element. This updating occurs at a cyclic rate of 16 cps or twice per second for each memory location. This is about as fast as the eye of the operator can follow changes in the characters displayed by the numeric display elements 1008.

The contents of the three numeric display select bits in the most significant portion of the numeric display register 798 are communicated by three pairs of lines, each pair representing the Q and Q̄ outputs from a flip-flop, to a decoder 716. The decoder activates one of eight select drivers 719, the third select driver in this instance. Simultaneously, nine segment drivers 721 are selectively excited according to the character information stored in the least significant portion of the word in the numeric display register 798, each driver being responsive to a different bit. In some circumstances, it may be desirable to convert the character information to a binary code, thereby reducing the number of bits required to define a character, but necessitating the use of a decoder between the numeric display register 798 and the segment driver 721. However, such a coded technique is not used in this application.

The segment drivers 721 present drive signals forming the stored character to the appropriate segments of all eight numeric display elements 1008. However, only the third numeric display element 1014, which receives a select signal from the select drivers 719, displays the selected character.

CONTROL PANEL

The control panel, which is also described in co-epending application Interactive Control System, Ser. No. 101,449, filed Dec. 28, 1970 by Lee et al, has three selector switches and a plurality of momentary switches as shown in FIG. 2. The three selector switches, a Mode switch 40, a Jog switch 41 and a Parameter switch 42, are multiple position rotary switches. The Mode selector switch 40 defines one of the six operating modes of the system, the Jog switch 41 defines the machine displacement for each jog command executed when in the jog mode, and the Parameter switch 42 defines the parameter to be displayed on the numeric displays 38 and, when in the keyboard mode, defines the address of the parameter to be entered through the keyboard. The remaining switches are momentary switches which maintain contact only so long as they are held down. The Mode selector switch 40 defines the major operating conditions of the system which are: (1) Search, (2) Index, (3) Continuous, (4) Block, (5) Jog, and (6) Keyboard. The Search position of the Mode selector switch permits an operator to identify a desired part program block of commands from a punched tape or from a self-contained parts program memory such as the core member 30, and then initiate an automatic search for that block of commands. A sequence number, which is used to identify the selected block of commands, is entered through a keyboard 44 made up of momentary switches. The number which is entered through the keyboard 44 is displayed on the numeric displays 38 to permit the operator to verify the number which has been entered.

The control panel embodiment shown in FIG. 2A, FIG. 2B, FIG. 2C, FIG. 2D FIG. 15A, and FIG. 15B is discussed din detail in related application Single Chip Integrated Circuit Microcomputer Architecture Ser. No. 860,253 filed on Dec. 14, 1977 by Gilbert P. Hyatt at page 37 line 29 to page 54 line 31 therein, which is herein incorporated by reference.

TAPE READER

Punched tape readers are used extensively to load programs into digital computers and to program many types of special purpose digital equipment, such as numerical controls for machine tools. In a typical photoelectric punched tape reader, the tape is luminated as it passes by the read head assembly and photosensors on the opposite side of the tape optically detect the holes in the tape. As the tape is moved past the read head assembly, the tape characters are sequentially read into the digital equipment, where each tape character is available in parallel form on a number (e.g. eight) of data lines. A sprocket hole (e.g. mechanical, optical, magnetic) is available on the tape, which is normally used to strobe the tape character into the digital equipment. Thus, data is available from the tape in a bit parallel, character serial form, where the bits pertaining to each tape character are available simultaneously and the tape characters are available sequentially.

The tape reader embodiment shown in FIG. 14C, FIG. 14D, FIG. 14E, and FIG. 14F is discussed in detail in related application INTELLIGENT TAPE READER Ser. No. 860,251 filed Dec. 14, 1977 by Gilbert P. Hyatt at page 59 to page 83 therein, which is herein incorporated by reference.

SERVOS

Figure 3:
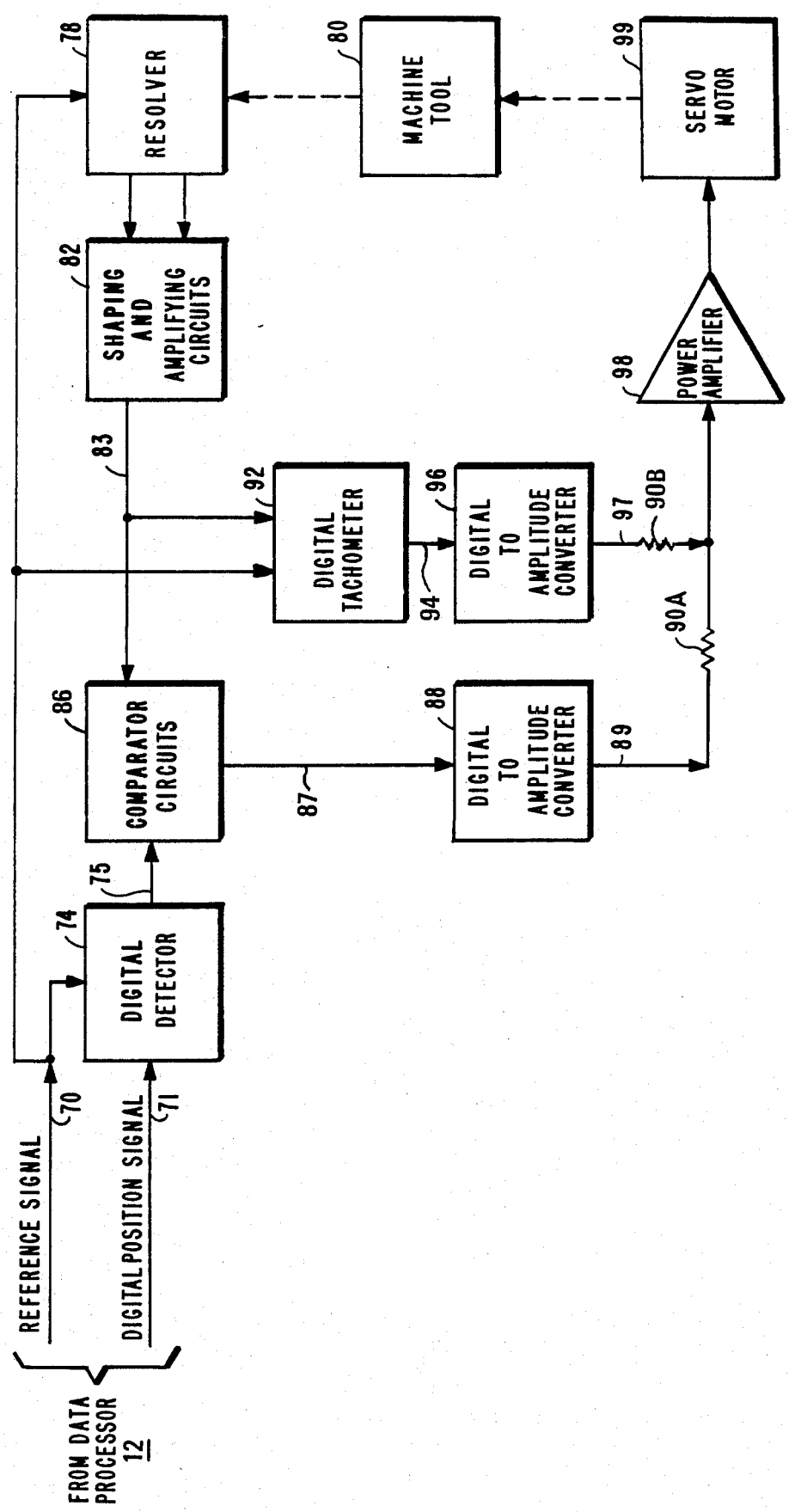
FIG. 3 is a block diagram representation of a servo drive shown in FIG. 1.

The servos 20, 21 and 22 may be identical and are described with reference to the servo 20 only. As shown in block diagram form in FIG. 3 and in schematic form in FIG. 17, the servo 20 is able to attain the accuracy of digital control by operating with squarewave or digital signals. A squarewave reference signal 70 is provided with respect to which the phase of the encoded signals are measured. The data processor produces a digital position signal 71 which indicates a commanded servo position. The signal 71 is a completely digital whole word signal produced under program control and having a characteristic defined as an intrinsic signal form. The reference signal 70 and digital position information signal 71 are applied to a digital detector 74 which produces pulse width position difference command signals 75. The reference signal 70 is applied to a rotor of a resolver 78 which is mechanically linked to a machine tool 80 which is being controlled. The stator of the resolver then produces a signal, the phase of which depends upon the position of the rotor as controlled by the machine tool 80. The stator signal passes to an adding, shaping and amplifying circuit 82 which produces a position defining squarewave feedback signal 83 indicating the actual position of the machine tool 80. The position feedback signal is passed to comparator circuits 86 along with the position command signal 75. The comparator circuits 86 produce plus or minus pulse width squarewave signals 87 with the duration of the positive portion of the signals indicating the difference between the commanded position and the actual position. A digital-to-amplitude converter 88 converts this signal to a servo control error signal 89 which is presented to one side of a summing resistor 90A.

The digital-to-amplitude converters 88 and 96 (FIGS. 3 and 17) accept pulse width modulated signals 87 and 94, respectively, and provide analog voltages 89 and 97, respectively, proportional to the cuty cycle or width of the input pulses. These converters 88 and 96 are well known to those skilled in the art and may be configured with an analog switch controlled by the pulse width input signal to gate charge into a filter network for the time that the signal is true. The filter network averages this signal with respect to time to provide the analog voltage.

By comparing the half cycle period of the position feedback signal 83 with the half cycle period of the reference signal 70, a digital tachometer 92 produces plus or minus squarewave signals 94 with the duration of the positive portion of the signal indicating velocity. This signal passes to a digital-to-amplitude conveter 96 which produces a velocity feedback signal 97 which is connected to summing resistor 90B. The junction of the summing resistors 90A and 90B is connected to a power amplifier 98 which drives a servo motor 99 to control the position of the machine tool 80. By using this squarewave technique, the servo 20 incorporates the combined accuracy of digital and analog signals with the simplicity of analog signals and is typical of an Elemental Extremity with Intrinsic Signal Form implementation.

DATA PROCESSOR

As shown in FIG. 1, the data processor 12 receives data from the various input sources, performs calculations or otherwise manipulates data in accordance with the input information and outputs processed information to control the milling machine 24 through servos 20, 21, and 22 and auxiliary control signals 26. The data processor is built from series SN7400 integrated circuits manufactured by Texas Instruments, Inc. which are located on a series of printed circuit boards. These printed circuit boards plug into a motherboard which provides necessary interconnections between the terminals of the printed circuit boards.

The architecture of the data processor 12 lends itself to a fully integrated circuit computer mainframe where all of the logic may be implemented with integrated circuits in a conventional manner and additionally includes an integrated circuit scratch pad memory (SPM). Further, this data processor 12 has the architecture to use an integrated circuit read-only memory (ROM) in place of or in addition to a core memory such as for the main memory 30 providing a data processor with the digital portion constructed wholly of integrated circuit components.

Figure 4:
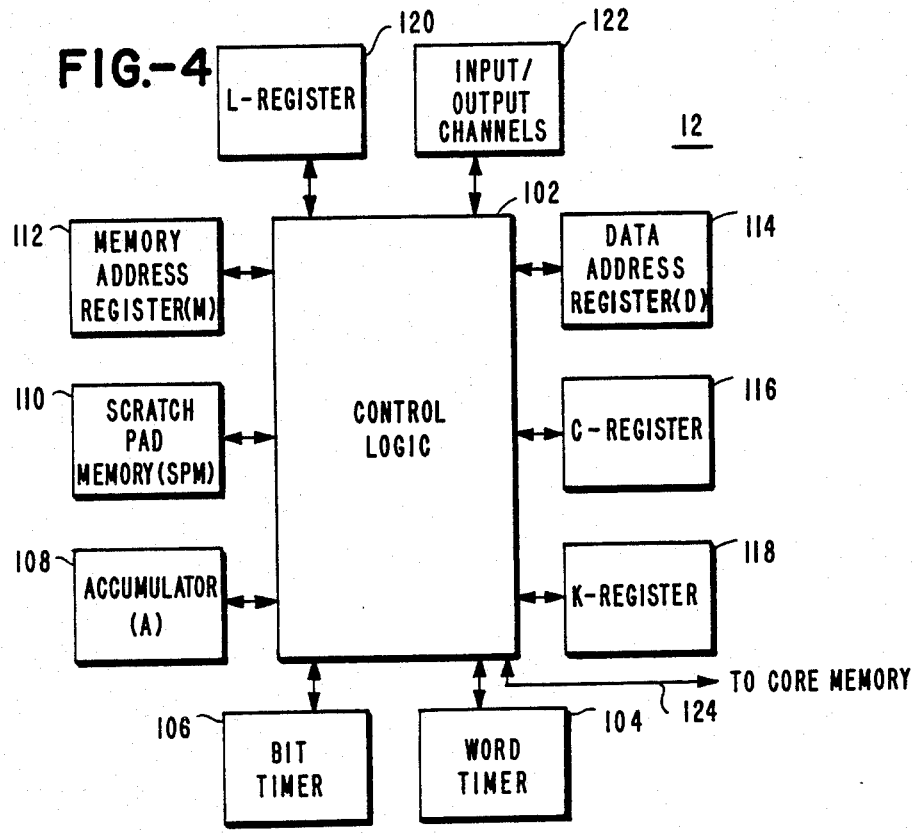
FIG. 4 is a block diagram representation of the data processor shown in FIG. 1.

In a somewhat simplified block diagram, the data processor 12 is shown in FIG. 4 as control logic 102 interconnecting registers, timers and communication channels. Common signal definitions are provided to permit those knowledgeable in the art to identify the various connections between boards.

Figure 7:
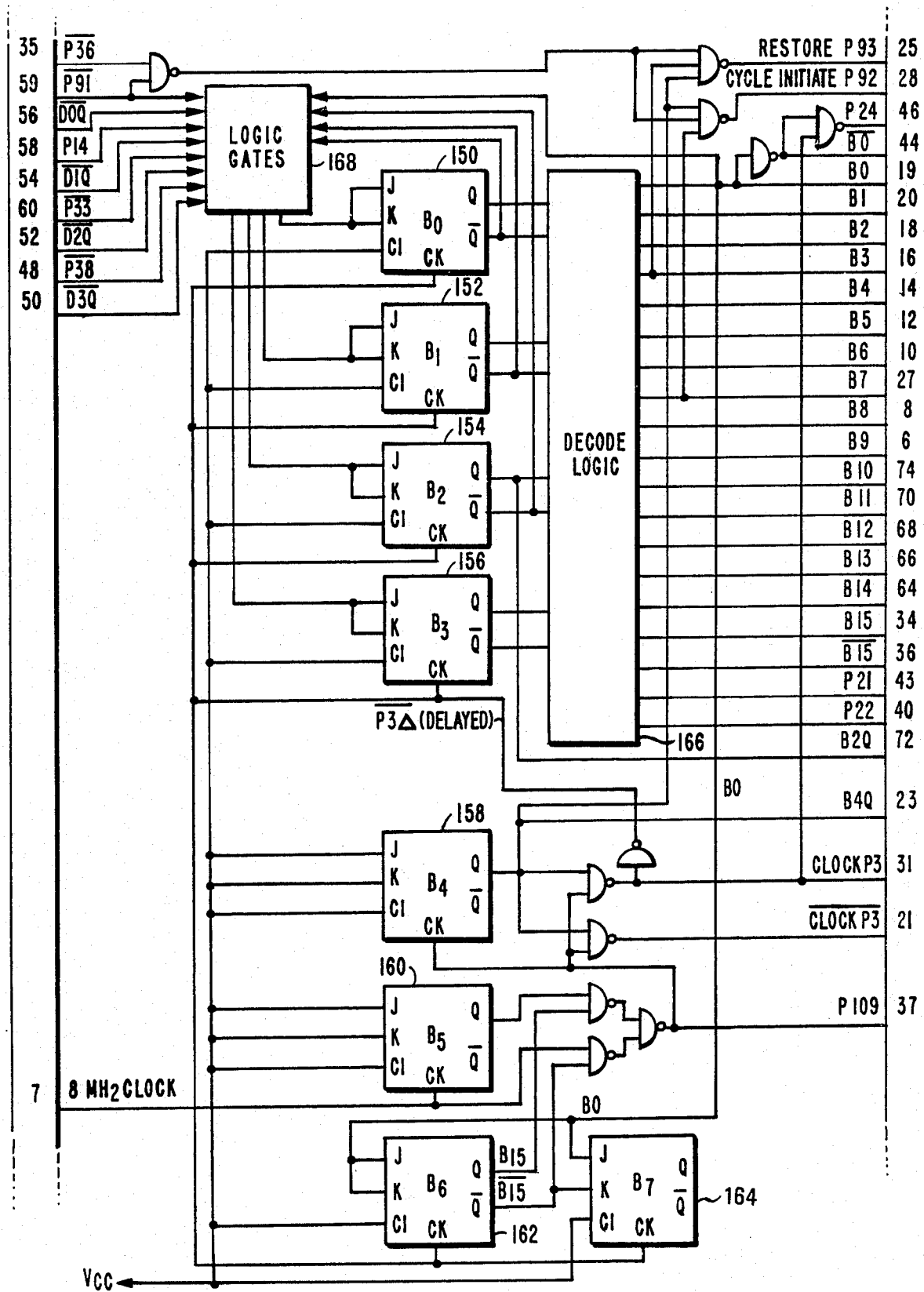
FIG. 7 is a schematic and block diagram representation of the B logic circuit board.
Figure 11:
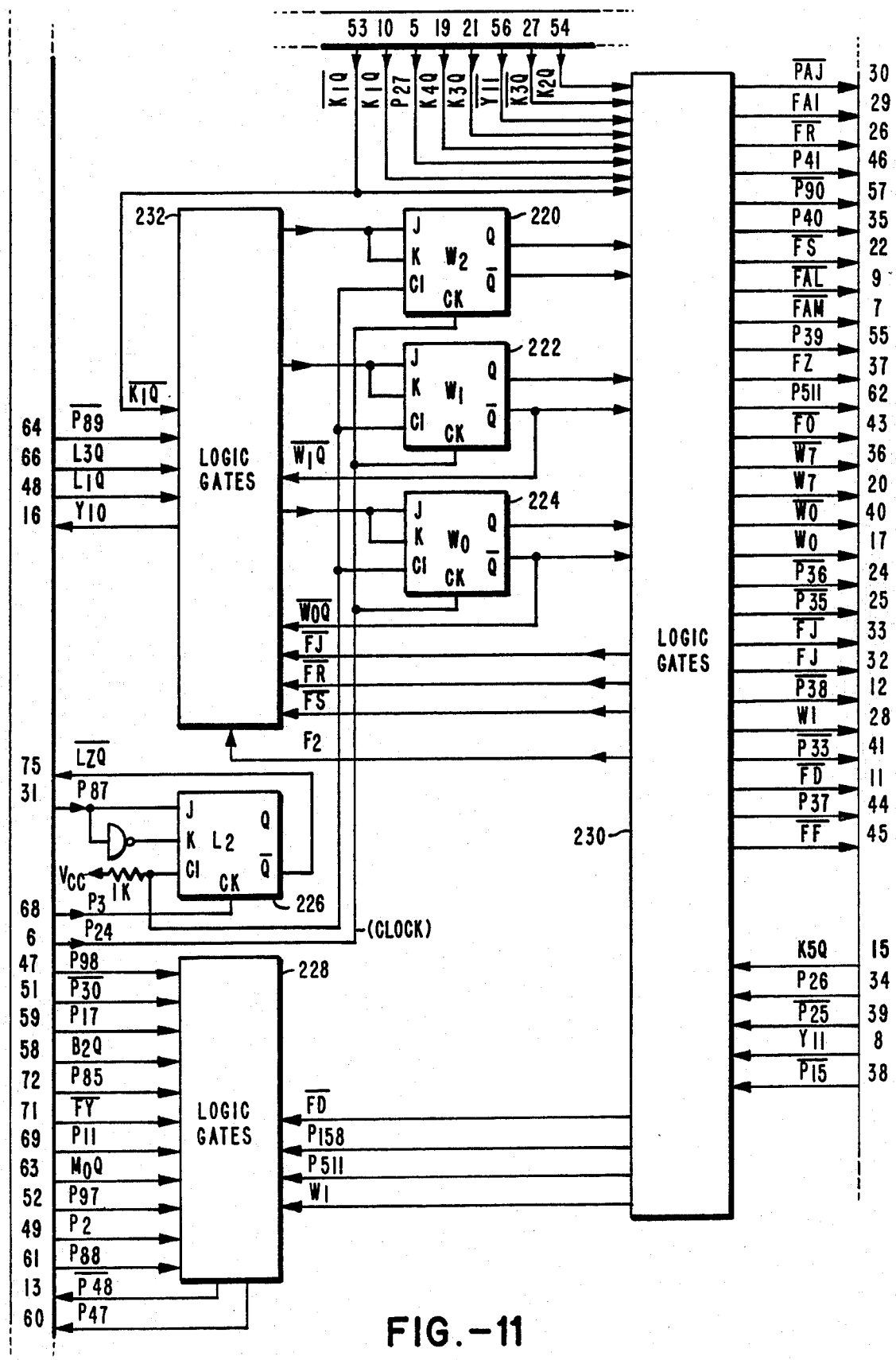
FIG. 11 is a schematic and block diagram representation of the W logic circuit board.

The basic timing functions of the data processor 12 are performed by a word timer 104 (FIG. 4) and $W_0$-$W_2$ (FIG. 11) and a bit timer 106 (FIG. 4) and $B_0$-$B_3$ (FIG. 7). The fundamental synchronization of the central processor 12 is provided by an 8 MHz clock signal (FIG. 7) which is included as part of the control logic 102. The synchronizing clock signal is an asymmetric squarewave, the positive portion of which is designated $P_3$ and the negative portion of which is designated $\overline{P_3}$. The asymmetrical character of the clock signal permits a longer clock period for stabilization of propogation delays without sacrifice of processing speed. The word timer 104 (FIG. 4) and $W_0$-$W_3$ (FIG. 11) is a three-bit counter $W_0$-$W_2$ (FIG. 11) with associated decode logic. It counts from 0 to 7 as the data processor cycles through the micro operations during the performance of an instruction with each micro operation being performed in a different word time. The associated decode logic provides eight output lines, each being true during one of the eight different counting states of the word timer 104 (FIG. 4) and $W_0$-$W_2$ (FIG. 11). These output signals are used by the control logic 102 (FIG. 4) including logic gates 230 (FIG. 11) for sequencing the data processor through the micro operations associated with an instruction. The bit timer 106 (FIG. 4) and $B_0$-$B_3$ (FIG. 7) is a four-bit binary counter $B_0$-$B_3$ (FIG. 7) with associated decode logic. The bit timer 106 (FIG. 4) and $B_0$-$B_3$ (FIG. 7) counts down from 15 thru 0 and consequently the associated decode logic 166 (FIG. 7) has 16 output lines $B_0$-$B_{15}$ (FIG. 7), each going true during a different one of the 16 possible counts of the bit timer 106 (FIG. 4) and $B_0$-$B_3$ (FIG. 7). The bit timer 106 (FIG. 4) and $B_0$-$B_3$ (FIG. 7) provides sequencing and timing within a given micro operation or word time.

An accumulator (A-register) 108 (FIG. 4) and 130 (FIG. 6A) is the basic arithmetic register and is used as the repository of the results of arithmetic and logical operations. It is also the source and destination of the input/output (I/O) parameters. The A-register 108 (FIG. 4) and 130 (FIG. 6A) is a 16-bit serial in serial out shift register. Associated with the A-register 108 (FIG.

4) and 130 (FIG. 6A) is a serial full adder 132 (FIG. 6A) which in FIG. 4 is included within the control logic 102.

A scratch pad memory (SPM) 110 (FIGS. 4 and 12) provides storage for intermediate parameters such as computational results, return addresses, indexes and other pertinent information. The SPM 110 (FIGS. 4 and 12) provides rapid internal storage without the need for transferring data to the main memory 30. It is a group of 32 16-bit serial in, serial out registers which are divided into two pages with 16 registers 234 (FIG. 12) on each page. Paging is accomplished by toggling the $I_1$ flip-flop (FIG. 13) which is automatically set to page 0 when the power is turned on. When the SPM 110 (FIGS. 4 and 12) is set to page 0, the data processor acts as if page 1 did not exist; and similarly, when the SPM is set to page 1, the data processor acts as if page 0 did not exist. All of the SPM registers can be used for the storage of information, but some of them are primarily associated with specific functions to increase the efficiency of the data processor. The $SPM_0$ register is automatically assumed and need not be programmed in conjunction with the TX instruction. The $SPM_2$ register is used for the return address associated with the execution of transfer-type instructions. In addition, the $SPM_2$ register is used as the intermediate register for operands obtained from the constant memory portion of the main memory. The first eight SPM registers can be used for index or TX instructions in addition to scratch pad operations.

Figure 6A:
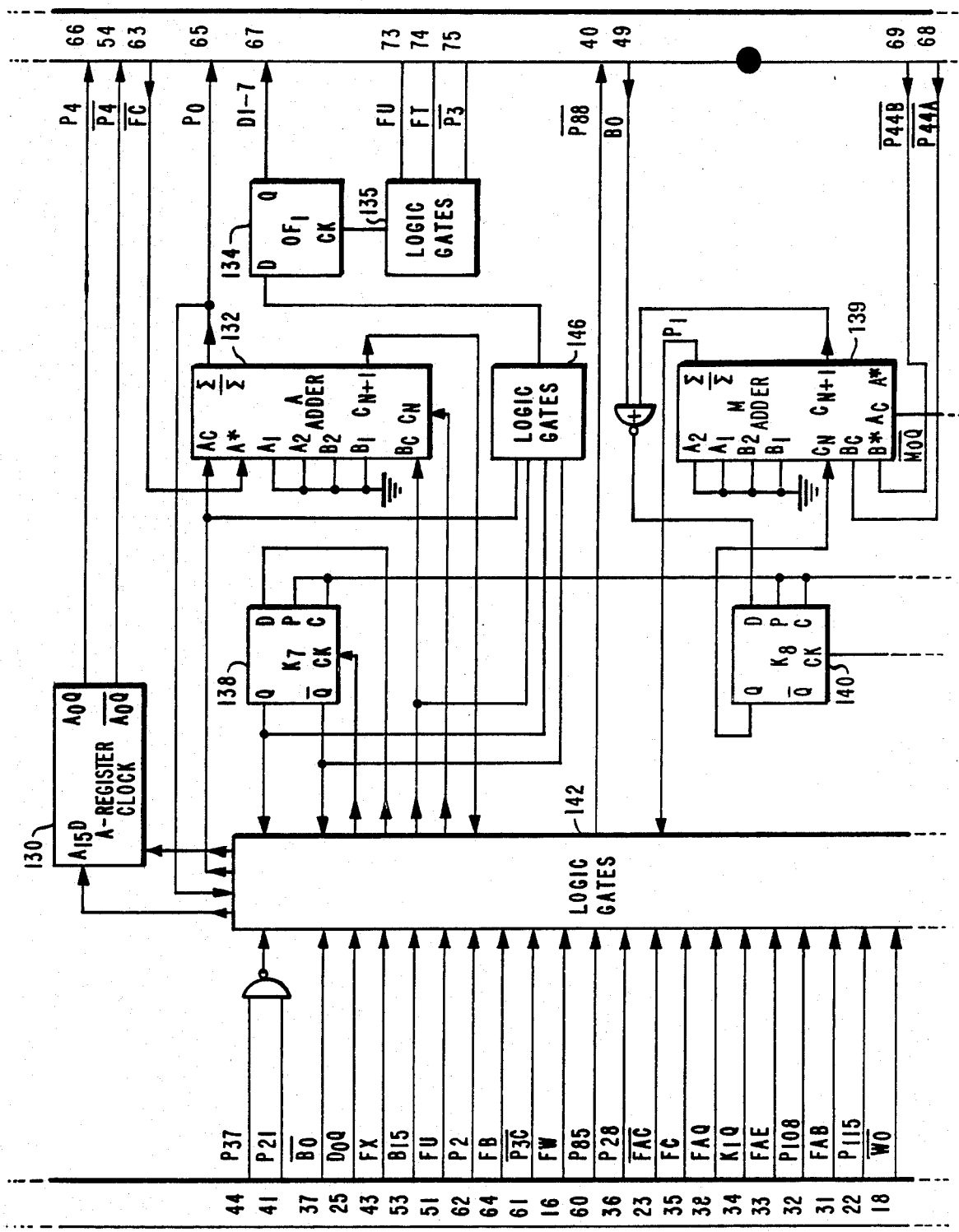
FIGS. 6A and 6B is a schematic and block diagram representation of the A logic circuit board.
Figure 6B:
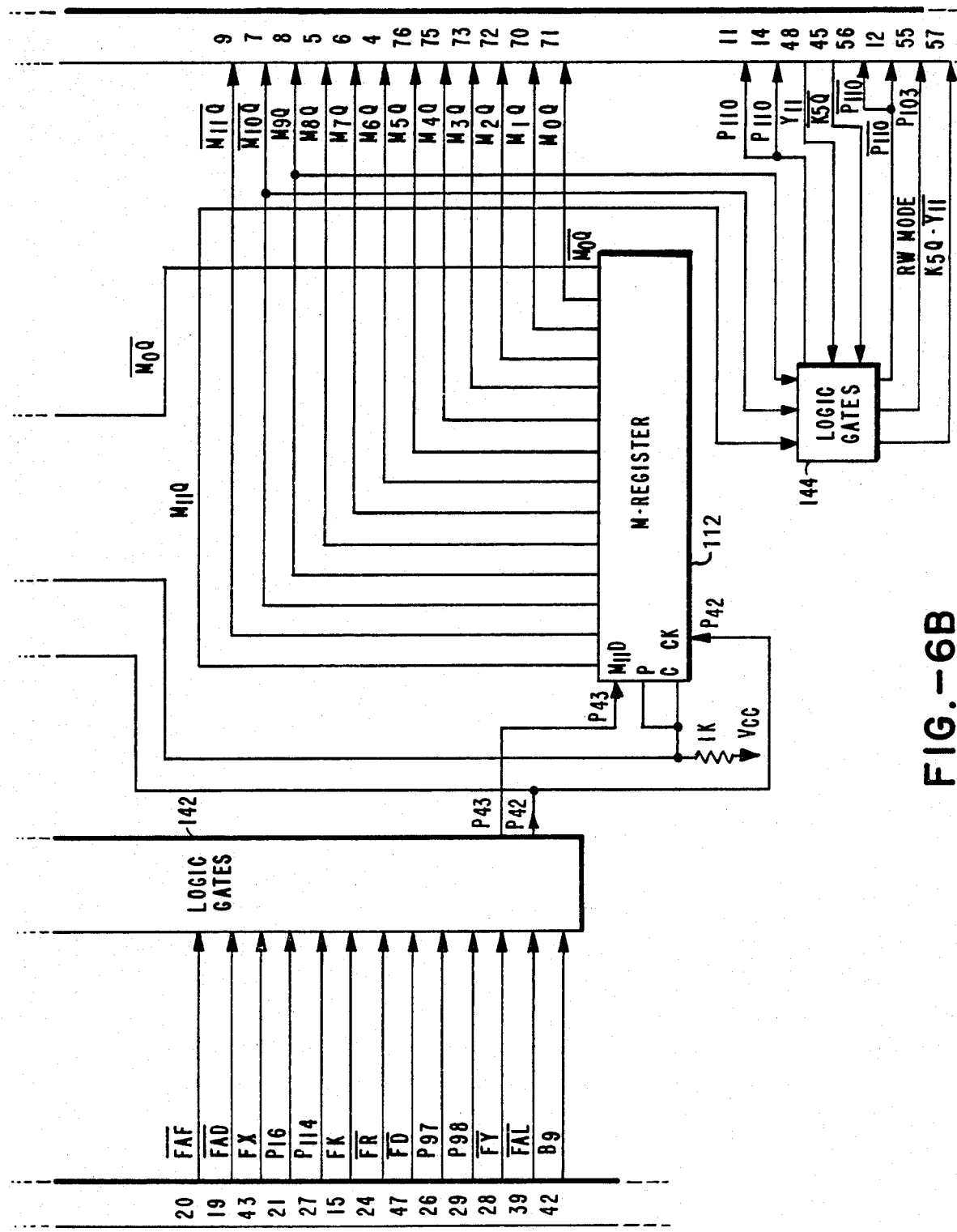

A memory address register (M-register) 112 (FIGS. 4 and 6B) holds the 12-bit address of $M_0Q$–$M_9Q$, $\overline{M_{10}Q}$, and $M_{11}Q$ (FIG. 6B) of an eight-bit byte to be accessed from the program memory. The M-register 112 (FIGS. 4 and 6B) is a 12-bit shift register having the capacity to address up to 4,096 different memory locations. It has a serial input $M_{11}D$ (FIG. 6B) and both serial and parallel outputs $M_0Q$–$M_9Q$, $\overline{M_{10}Q}$ and $\overline{M_{11}Q}$ (FIG. 6B). Associated with the M-register 112 (FIG. 4 and 6B) but represented as being within the control logic 102 is a serial full adder 139 (FIG. 6A) which increments the M-register 112 (FIGS. 4 and 6B) to access sequential instructions or, as applicable, the next two bytes of in-line instructions. The M-register 112 (FIGS. 4 and 6B) is incremented by two for a TX instruction when the condition for that transfer is not met, resulting in a skip of two bytes. The M-register 112 (FIGS. 4 and 6B) is incremented by three for a skip on-discrete (SD) instruction. The M-register 112 (FIGS. 4 and 6B) is exchanged with the $SPM_2$ register for transfer-type instructions and exchanged with a data address register (D-register) 114 (FIG. 4) and 186 (FIG. 9) to access operands from the main memory. The M-register 112 (FIGS. 4 and 6B) is also exchanged with the $SPM_2$ register at the start of an ST instruction which causes the contents of the A-register 108 (FIG. 4) and 130 (FIG. 6A) to be stored in the main memory when implemented with a core memory.

The data address register (D-register) 114 (FIG. 4) and 186 (FIG. 9) is a 12-bit shift register 186 (FIG. 9) that usually contains an operand address and is used to select: (a) SPM register, (b) I/O channel, and (c) number of shifts, depending upon the type of instruction being executed. The D-register 114 (FIG. 4) and 186 (FIG. 9) has a serial input $D_{11}$ (FIG. 9) and serial output $D_0Q$ (FIG. 9), with the eight least significant bits $D_0Q$–$D_7Q$ (FIG. 9) having parallel outputs in addition.

A C-register 116 (FIG. 4) is composed of six flip-flops designated $C_3$, $C_2$, $C_1$, $C_0$, $K_{11}$, and $K_{10}$ (FIG. 8) which store the six most significant bits of an eight-bit instruction byte obtained from program memory. The flip-flops $C_3$ through $K_{10}$ store the instruction bits designated $I_7$, $I_6$ (included in the P111 signal), $I_5$, $I_4$, $I_3$ and $I_2$, respectively as received from the main memory interface lines (I). These instruction bits are held by the C-register 116 (FIGS. 4 and 8) during the performance of an instruction to control the sequence of micro operations executed during the performance of the instruction.

Figure 8:
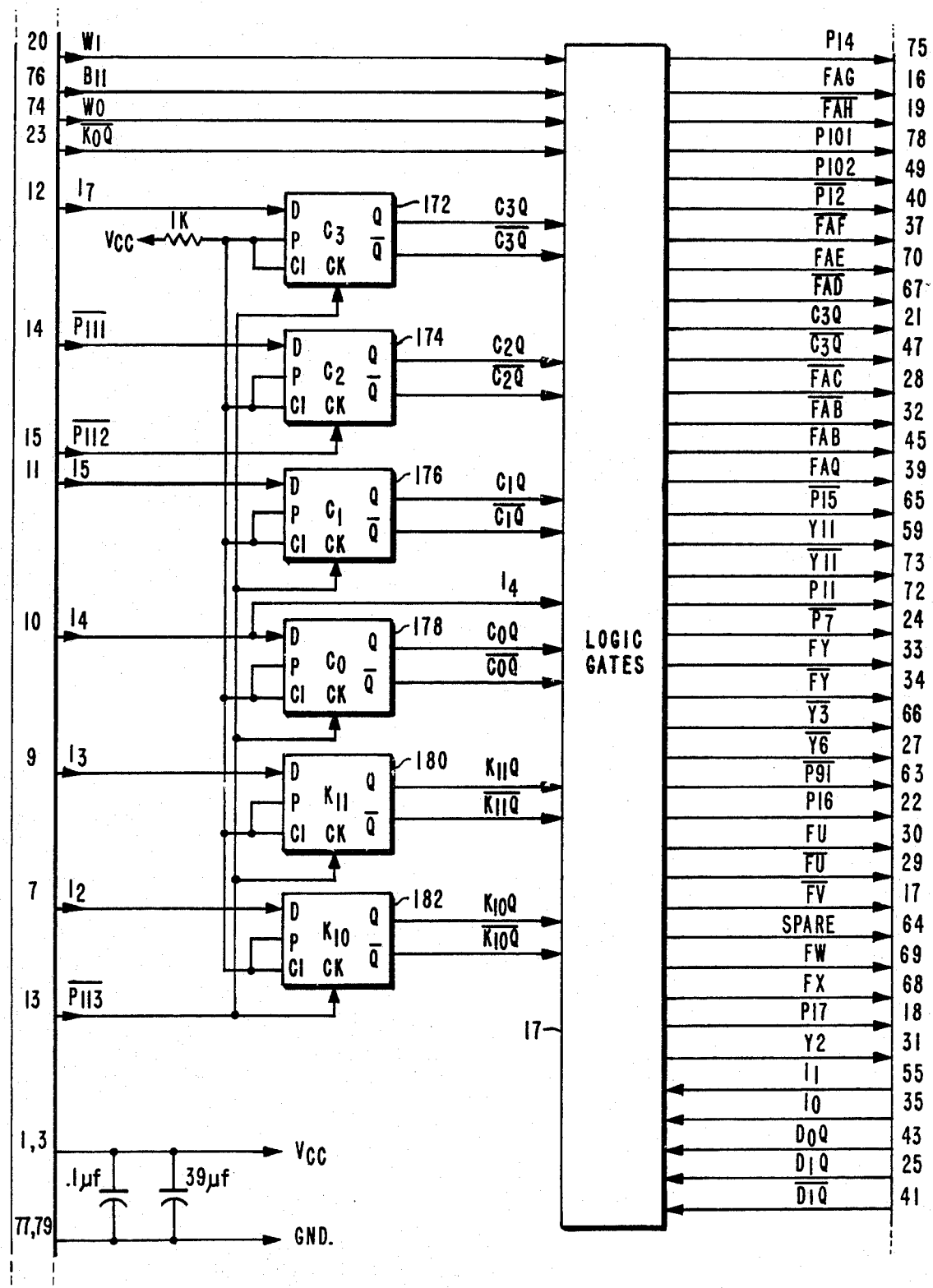
FIG. 8 is a schematic and block diagram representation of the C logic circuit board.

An element designated K-register 118 (FIGS. 4 and 10) is a group of miscellaneous flip-flops for various functions. The $K_0$, $K_1$ and $K_2$ flip-flops (FIG. 10) are used to control sequencing through the micro operations. The $K_1$ flip-flop is also used to store the sign of the operand in the A-register 108 (FIG. 4) and 130 (FIG. 6A) and the sign of a decremented number during a TX instruction. The $K_2$ flip-flop is also used to extend the A-register during a shift left operation where the $K_2$ register acts as the $A_{-1}$ stage of the A-register. The $K_3$, $K_4$, and $K_5$ flip-flops (FIG. 10) may be grouped together and designated the KA-register and may be used to store the address of the index. The KA-register is also used as an extension of the A-register during a shift left operation with $K_3$ as the $A_{-1}$ stage, $K_4$ as the $A_{-3}$ stage, and $K_5$ as the $A_{-4}$ stage of the A-register 108 (FIG. 4) and 130 (FIG. 6A). The $K_7$ flip-flop 138 (FIG. 6A) is used as a carry flip-flop in conjunction with the A-register 108 (FIG. 4) and 130 (FIG. 6A) full adder 132 (FIG. 6A). It is also used in the FK micro operation in the transfer of the D-register 114 (FIG. 4) and 186 (FIG. 9) contents to the M-register 112 (FIGS. 4 and 6B) as a shift left operation to multiply the D-register word address by two to obtain the M-register byte address. The $K_8$ flip-flop 140 (FIG. 6A) is used as a carry flip-flop in conjunction with the M-register full adder 139 (FIG. 6A). As previously described, the $K_{10}$ and $K_{11}$ flip-flops 182 and 180 (FIG. 8) form the two least significant bits of the C-register 116 (FIGS. 4 and 8).

An element designated L-register 120 (FIG. 4) is, like the K-register 118 (FIGS. 4 and 10), a group of miscellaneous flip-flops performing control functions. The most significant is the $L_1$ flip-flop 210 (FIG. 10) which controls turn-on and turn-off of the data processor.

Input/output (I/O) channels 122 (FIGS. 4 and 13) include whole number and discrete channels. The whole number channels connect the A-register 108 (FIG. 4) and 130 (FIG. 6A) with the various entities and extremities. The whole number I/O channels 122 (FIGs. 4 and 13) are arranged in pairs so that as the output from the least significant bit ($A_0Q$) (FIGS. 6A and 13) of the A-register 108 (FIG. 4) and 130 (FIG. 6A) shifts information to an output channel (OW) with a corresponding input channel (IW) simultaneously shifting information into the A-register 108 (FIG. 4) and 130 (FIG. 6A) through the input to the most significant bit ($A_{15}D$) (FIG. 6A).

A data path 124 provides two-way communication between the data processor and the main memory. This path carries the main memory address stored in the M-register and transfers operands to or from the main memory.

MICRO-OPERATIONS

The operation of the data processor in carrying out an instruction can best be understood by examining the microoperation flow chart shown in FIG. 5. The small rectangles represent micro-operations in accordance with the letter designation therein and the diamonds represent alternative conditions. If the condition or function contained within a diamond is true, the path designated 1 is taken. Otherwise, the path designated 0 is taken. The micro-operations are arranged in parallel rows according to the word time in which they occur. For instance, the FA, FB and FC micro-operations occur in word time W0, while the row of micro-operations beginning with FD and FK occur during the W1 word time. Each micro-operation consists of one or more bit times to define the number of clock pulses used to execute that micro-operation. The word and bit times are presented with the following description of each micro-operation and summarized in Table V. The circled numbers are provided as references for ease of understanding and discussion.

During the execution of a program instruction, the data processor begins at point 1 at the top center of FIG. 5. The first branch condition is $$Y3 = \overline{C_3Q} \cdot \overline{C_2Q} \cdot C_1Q \cdot \overline{C_0Q} \cdot \overline{K_{11}Q} \cdot K_{10}Q \cdot I_1 \cdot \overline{I_0}$$

which represents the operation code for a TX instruction. If this term is true, the FC micro-operation is performed; if not true, a second control condition is tested. If flip-flop $K_1$ is in the 0 state, the FA micro-operation is executed and if it is in the 1 state, the FB micro-operation is executed. In similar fashion, a series of micro-operations are executed in accordance with the programmed instruction until the micro-operation FZ is completed. At this point the power-interrupt flip-flop $L_1$ determines whether or not the execution of programmed instructions continues to reference point 1. If the $L_1$ flip-flop is in the 1 state indicating an interrupt, a series of micro-operations is entered which place the return address in $SPM_2$ and loads the interrupt routine address into the M-register. If the $L_1$ flip-flop is in the 0 state indicating a non-interrupt condition, the processor returns to point 1 and begins the execution of another program instruction unless an X5 signal indicates that there is an external interrupt. If there is an external interrupt, the data processor ignores it, returning to point 1 unless the interrupt override flip-flop $L_3$ is true and the flip-flop $K_1$ is in the false state.

Each micro-operation will now be described in detail including the logical equations (summarized in Table III) which determines whether a micro-operation is true or false, the word time in which it occurs (summarized in Table V), the bit times in each micro-operation (summarized in Table V), a brief written description of the micro-operation, and a shorthand notation of what functional operations are performed by each micro-operation. In describing the micro-operations and throughout this application, a flip-flop or register bit designation followed by a Q indicates an output. If there is no bar over the term, the true or 1 state of the output is indicated; and if there is a bar over the term, the 0 or false state of the output is indicated. Similarly, a flip-flop or register bit designation followed by a D, T, J, or K indicates the input to the designated flip-flop and the flip-flop synchronizing clock pulse input is designated "clock". For instance, the term $L_1T$ indicates the toggle input to the $L_1$ flip-flop while the term $\overline{A_0Q}$ indicates a 0 or false output from the $A_0$ bit of the A-register which is the least significant bit. In addition, the following commonly used symbols will be used throughout this application:

| Symbol | Description of Symbol |
|---|---|
| ( ) | Parentheses denote contents of a register. |
| [ ] | Square brackets denote a portion of a register, the contents of which has a functional dependence upon a register. Thus I[D] means instruction part of the D-Register. Op[D] means operation part of D-Register. Ad[M] means address part of M-Register. Sn[A] and Mg[A] means sign and magnitude parts of A-Register, respectively. |
| M<A> | This symbol denotes a location of a memory word addressed by the A-Register. |
| (M<A>) | This symbol denotes the contents of a memory word addressed by the A-Register. |
| → | Denotes transfer of a word from one register to another. Thus, (A)→M means that the contents of the A-Register is transferred to the M-Register. (A)→PM<M> means that the contents of the A-Register is transferred to the program memory location addressed by the M-Register. |
| + | This symbol represents a logical-OR operation. |
| . | This symbol represents a logical-AND operation. |
| : | Colon following a variable (representing a state or the command) denotes the occurrence of the subsequent statement when the value of the variable is 1 |
| PM | Program (main) memory which may be a core memory or an ROM. |
| SPM | Scratch pad memory. |

A detailed description of each micro-operation follows.

$FA = W0 \cdot \overline{K_1Q} \cdot (\overline{B15 \cdot Y3} + K_2Q)$ The FA micro-operation occurs in the W0 word time and has a length of 16 bit times. It is used for all instructions that are not preceded by an index byte nor are TX (decrement and transfer) instructions. The following operations take place during this micro-operation:

(M)+1→M at B11 thru B0 The address in the M-Register is incremented by 1 in the last 12 bit times to eliminate a race, if a ROM is used, with the scanout of the instruction bits ($I_i$) from the memory instruction register into the D-Register.

Ad[I]→D at B15 thru B11

If dynamic MOS-FET type integrated circuits are used, they are refreshed by recirculation at bit times B15 thru B0.

Sn[A]·$C_3Q$→$K_1$ at B0 The A-Register is recirculated to refresh it if MOS-FET type integrated circuits are used and to make the sign bit, which is the most significant bit, available to $K_1$ in case $C_3Q$ is true.

0→$K_3$,$K_4$,$K_5$ at B0

0→$K_8$ at B0 This is the M carry flip-flop which is used to increment the address in the M-Register during this micro-operation and it is reset at B0.

$FB = W0 \cdot K_1Q \cdot (\overline{B15 \cdot Y3} + K_2Q)$ The FB micro-operation occurs during the W0 word time and has a duration of 16 bit times. It is used for all instructions preceded by an index byte with the exception of the TX (decrement and transfer) instruction. The following operations take place during this micro-operation:

(M)+1→M at B11 thru B0 The address stored in the M-Register is incremented during the last 12 bit times to eliminate a race, if a ROM is used, with the scanout of the contents of the memory instruction register (I) into the D-Register.

Ad[I]+(SPM<$K_3$,$K_4$,$K_5$>)→D at B15 thru B0 This operation clocks the index which was stored in the designated SPM-Register, causing it to be added to the instruction operand address. The sum is loaded into the D-Register.

$C_3Q$: $Sn[A] \rightarrow K_1$ at B0 The A-Register is recirculated to refresh if dynamic MOS-FET type integrated circuits are used and to clock the sign bit of the A-Register, which is the most significant bit, into the $K_1$ flip-flop.

$0 \rightarrow K_3, K_4$ at B0

$Y_2 \rightarrow K_5$ at B0 The $K_3$, $K_4$ and $K_5$ flip-flops hold the address of the selected SPM-Register during this micro-operation and are reset at the end. The Y terms are defined in Table II.

$0 \rightarrow K_7$ at B0 This is the A carry flip-flop which is not used during this micro-operation.

$0 \rightarrow K_8$ at B0 This is the M carry flip-flop which is used to increment the address stored in the M-Register and is reset at B0.

$FC = \overline{W0} \cdot (B15 \cdot \overline{C_3Q} \cdot \overline{C_2Q} \cdot C_1Q \cdot \overline{C_0Q} \cdot \overline{K_{11}Q} \cdot K_{10}Q \cdot I_1 \overline{I_0} + K_2Q)$ The FC micro-operation occurs during the W0 word time and has a duration of 16 bit times. It is used for all TX (decrement and transfer) instructions. The operations executed during this micro-operation are as follows:

(M)+1→M at B11 thru B0 The address in the M-Register is incremented in the last 12 bit times to eliminate a race, if a ROM is used, with the scanout of the instruction bits ($I_i$) from the memory instruction register into the D-Register.

Ad[I]→D at B15 thru B11 The address portion of the memory instruction register (I) is scanned into the D-Register during the last six bit times.

The SPM-Registers are circulated to refresh them if dynamic MOS-FET type integrated circuits are used.

$0 \rightarrow K_3, K_4, K_5$ at B0 These flip-flops hold the address of the index register during this micro-operation and are reset at B0.

$0 \rightarrow K_7$ at B0 This is the A-Register carry flip-flop and is reset at B0.

$0 \rightarrow K_8$ at B0 This is the M-Register carry flip-flop and is reset at B0.

$FD = \overline{C_3Q} \cdot \overline{C_2Q} \cdot K_5Q \cdot W1$ The FD micro-operation occurs at word time 1 and has a duration of 12 bit times. It is used for a core memory ST (store) instruction. The operations executed during this micro-operation are as follows:

(SPM<2>)$_{lsb}$→M at B11 thru B0 The 12 least significant bits of the SPM-2 Register are clocked into the M-Register as these two registers are interchanged.

(M)→SPM<2> at B11 thru B0 The contents of the M-Register is clocked into the 12 most significant bit positions of the SPM-2 Register as part of the interchange of these two registers.

(A)$_{lsh}$→A$_{msh}$ at B11 thru B4

(A)$_{lsh}$→D$_{msb}$ at B11 thru B4

(A)$_{msh}$→A$_{lsh}$ at B11 thru B4 During the first eight bit times the A-Register is half circulated, moving the most significant half (msh) to the least significant half (lsh) and the least significant half to the most significant half. At the same time, the contents of the least significant half of the A-Register are transferred to the eight most significant bit positions (msb) of the D-Register.

0,0,0,0→D at B3 thru B0 During the last four bit times, the operand stored in the most significant bit positions of the D-Register are shifted into the least significant bit positions and four zeros are shifted into the D-Register.

$FE = \overline{C_3Q} \cdot \overline{C_2Q} \cdot K_5Q \cdot W2$ The FE micro-operation occurs during the W2 word time and has a duration of eight bit times. It is used for a core memory ST (store) instruction. The operations executed within this micro-operation are as follows:

(D)$_{lsb}$→PM<M> at B7 thru B0

Write Strobe at B7 This write strobe at the beginning of the micro-operation permits the eight least significant bits of the D-Register to be clocked into the memory as they are clocked out of the D-Register.

0→SPM<2> at B7 thru B4 The contents of the M-Register transferred to the most significant bit positions during the FD micro-operation are shifted into the 12 least significant bit positions.

$FF = \overline{C_3Q} \cdot \overline{C_2Q} \cdot K_5Q \cdot W3$ The FF micro-operation occurs during the W3 word time and has a duration of 1 bit time. It is used to fill out the word times and no operations take place during this micro-operation.

$FG = \overline{C_3Q} \cdot \overline{C_2Q} \cdot K_5Q \cdot W4$ The FG micro-operation occurs during the W4 word time and has a duration of 12 bit times. It is used with a core memory ST (store) instruction and loads the second operand byte into the D-Register while incrementing the M-Register to address the main memory location where the second byte is to be stored. The operations performed within this micro-operation are as follows:

(M)+1→M at B11 thru B0

(A)$_{lsh}$→A$_{msh}$ at B11 thru B4 This completes the recirculation of the A-Register begun in the FD micro-operation.

(A)$_{lsh}$→D$_{msb}$ at B11 thru B4 As recirculation of the A-Register is completed, the second byte of the operand is recirculated and shifted into the most significant bit positions of the D-Register.

0→D at B3 thru B0 The second byte of the operand is shifted into the eight least significant bit positions and zeros are shifted into the most significant bit positions of the D-Register.

0→$K_8$ at B0 This is the M carry flip-flop which is reset after the M-Register is incremented.

$FH = \overline{C_3Q} \cdot \overline{C_2Q} \cdot K_5Q \cdot W5$ The FH micro-operation occurs during the W5 word time and has a duration of eight bit times. It is a continuation of a core memory ST (store) instruction and places the second byte of the operand into core memory. The operations executed during this micro-operation are as follows:

Write Strobe at B7

(D)$_{lsb}$→PM<M> at B7 thru B0 Following a Write Strobe, the second byte of the operand is shifted from the D-Register into the location in core memory addressed by the M-Register.

$FI = \overline{C_3Q} \cdot \overline{C_2Q} \cdot K_5Q \cdot W6$ The FI micro-operation occurs during the W6 word time and has a duration of eight bit times. It is used to fill out the eight word times of a core memory ST (store) instruction cycle and no functions are executed.

$FJ = \overline{C_3Q} \cdot \overline{C_2Q} \cdot (K_4Q + K_5Q) \cdot W7$ The FJ micro-operation occurs during the W7 word time and has a duration of 12 bit times. This micro-operation sets the necessary control flip-flops to cause the FY or FAP micro-operations to be executed next. The functions executed are:

0001→$D_3D_2D_1D_0$ at B12 thru B0 This makes Y6 true so that the proper branch will be followed after point 7 on the micro-operation flow chart, FIG. 5.

$1 \to C_2$ at B0 This sets the $C_3$, $C_2$ flip-flops to the 0, 1 state causing the proper micro-operation flow path to be followed after point 7 on the micro-operation flow chart, FIG. 5.

$0 \to K_1, K_2, K_3, K_4, K_5$ at B0

$0,0,1 \to W_2, W_1, W_0$ at B0 The word timer is set to word time 1 to cause the next micro-operations executed to be the FAP and FY micro-operations which follow.

$FK = \overline{C_3Q} \cdot \overline{C_2Q} \cdot \overline{K_5Q} \cdot (B11 \cdot Y1 + K_3Q) \cdot \overline{FAI} \cdot W1$ The FK micro-operation occurs in the W1 word time and has a duration of 12 bit times. It is used exclusively for the instructions that obtain the operand or transfer address from program memory. This micro-operation is used during the DP, BP, XP, and AP instructions that obtain the operand from the constant memory portion of the program memory. This micro-operation is used to place the operand word address, multiplied by two to provide the operand byte address, in the M-Register and to preserve the next instruction-address in the D-Register. The operations which are executed are as follows:

(D)$\to K_7$ at B11 thru B0

($K_7$)$\to$M at B11 thru B0

(M)$\to$D at B11 thru B7 The effect of these three transfers is to exchange the contents of the D- and M-Registers. By shifting the contents of the D-Register indirectly through the $K_7$ flip-flop to the M-Register, the contents of the M-Register is shifted 1 bit to the left (multiplied by 2) and the most significant bit is stored in the $K_7$ flip-flop at the end of this micro-operation. This multiplication by 2 converts a word address to a byte address.

$FL = \overline{C_3Q} \cdot \overline{C_2Q} \cdot \overline{K_5Q} \cdot (B11 \cdot Y1 + K_3Q) \cdot W1$ The FL micro-operation occurs in word time 1 and has a duration of 1 bit time. It sets selected flip-flops to control subsequent micro-operations. The operations executed are:

$0 \to K_1$ at B0

$1 \to K_3$ at B0

$Y4 \to K_4$ at B0

$FM = \overline{C_3Q} \cdot \overline{C_2Q} \cdot \overline{K_5Q} \cdot \overline{K_1Q} \cdot W2$ The FM micro-operation occurs at word time 2 and has a duration of 8 bit times. It is used to access a first of the two bytes for the instructions that use the FK or FL micro-operations. The operations executed are as follows:

Read Strobe at B7

(PM > M >) $\to$ I

Restore Strobe at B3

$FN = \overline{C_3Q} \cdot \overline{C_2Q} \cdot \overline{K_5Q} \cdot \overline{K_1Q} \cdot W3$ The FN micro-operation occurs at word time 3 and has a duration of eight bit times. It causes an eight-bit byte accessed from the program memory in the FM micro-operation to be scanned out of the memory data lines (I) into the SPM-2 Register. The operations executed are as follows:

(I)$\to$SPM$<2>_{msh}$ at B7 thru B0

(SPM$>2>_{msh}$)$\to$SPM$<2>_{lsh}$ at B7 thru B0 These steps scan the contents of the I lines into the most significant half of the SPM-2 Register and the most significant half of the SPM-2 Register into the least significant half of the SPM-2 Register.

$FO = \overline{C_3Q} \cdot \overline{C_2Q} \cdot \overline{K_5Q} \cdot \overline{K_1Q} \cdot W4$ The FO micro-operation occurs in word time 4 and has a duration of 12 bit times. It is used to increment the M-Register to permit the second of the two bytes to be accessed from program memory. This operation can be executed simultaneously with the FN micro operation if a core memory is used, but is performed after the FN micro-operation to permit a ROM to be used in place of a core memory. The operations executed are as follows:

(M)+1$\to$M at B11 thru B0

$0 \to K_8$ at B0 The M carry flip-flop is used to increment the M-Register and then reset at the end of this micro-operation.

$FP = \overline{C_3Q} \cdot \overline{C_2Q} \cdot \overline{K_5Q} \cdot \overline{K_1Q} \cdot W5$ The FP micro-operation occurs in word time 5 and has a duration of eight bit times. It is used to access the second byte from program memory. The operations executed are as follows:

Read Strobe at B7

(PM > M >) $\to$ I

Restore Strobe at B3 This micro-operation transfers the second byte into the memory data lines (I) and then restores the information to the memory.

$FQ = \overline{C_3Q} \cdot \overline{C_2Q} \cdot \overline{K_5Q} \cdot \overline{K_1Q} \cdot W6$ This micro-operation occurs in word time 6 and has a duration of eight bit times. The second byte is scanned out of the I lines and into the SPM-2 Register. The operations executed are as follows:

(I)$\to$SPM$<2>_{msh}$ at B7 thru B0

(SPM$<2>_{msh}$)$\to$SPM$<2>_{lsh}$ at B7 thru B0 These operations complete the transfer of the two bytes from memory into the SPM-2 Register.

$FR = \overline{C_3Q} \cdot \overline{C_2Q} \cdot \overline{K_5Q} \cdot K_4Q \cdot \overline{K_3Q} \cdot \overline{K_1Q} \cdot W7$ The FR micro-operation occurs in word time 7 and has a duration of 12 bit times. It is used to set the proper flip-flops to guide the data processor through subsequent micro-operations in executing the instruction. This operation could be executed simultaneously with the FQ micro-operation if a core memory is used, but is performed after the FQ micro-operation to permit a ROM to be used in place of a core memory. The operations executed are as follows:

$0,0,1,0 \to$D at B11 thru B0 A binary 2 is shifted into the least significant bit positions of the D-Register to address the SPM-2 Register which contains the two operand bytes being processed.

$1 \to C_2$ at B0

$0,0 \to K_2, K_1$ at B0

$0,0,0 \to K_5, K_4, K_3$ at B0

$FS = \overline{C_3Q} \cdot \overline{C_2Q} \cdot \overline{K_5Q} \cdot K_4Q \cdot K_3Q \cdot \overline{K_1Q} \cdot W7$ The FS micro-operation occurs in word time 7 and has a duration of twelve bit times. It is used to set the proper flip-flop to guide the data processor through subsequent micro-operations in executing the instructions.

$0,0,1,0 \to$D at B11 thru B0 A binary 2 is shifted into the least significant bit of the D-Register to address the SPM-2 Registers which store the two operand bytes.

$1 \to C_2$ at B0

$0,0 \to K_2, K_1$ at B0

$0,0,0 \to K_5, K_4, K_3$ at B0

$FT = Y38 \cdot \overline{C_1Q} \cdot C_0Q$ The FT micro-operation occurs in word time 1 and has a duration of 16 bit times. It is used to add the contents of the A-Register to the contents of an SPM-Register addressed by the D-Register which contains an operand and stores the sum in the A-Register. The contents of the SPM-Register are preserved. The executed operations are as follows:

(A)+(SPM$<$D$>$)$\to$A at B16 thru B0

(SPM$<$D$>$)$\to$SPM$<$D$>$ at B16 thru B0

(B0$\cdot C_{n+1}$)$\to K_0$ at B0 Any overflow from the addition operation is stored in the $K_0$ flip-flop.

$0 \to K_7$ at B0 The A adder carry flip-flop is used during this micro-operation and reset at B0.

$FU = Y38 \cdot C_1Q \cdot C_0Q$ The FU micro-operation occurs at word time 1 and has a duration of 16 bit times. It is used to subtract an operand stored in the SPM-Register from the contents of the A-Register and stores the difference in the A-Register. The contents of the SPM-Register are preserved. Subtraction is implemented by adding the contents of the A-Register to the ones complement of the operand in the SPM-Register and also adding a least significant bit to convert the ones complement to a twos complement number. The executed operations are as follows:

(A)+$\overline{(SPM<D>)}$+($1 \times 2^{-n}$)→A at B16 thru B0

(B0·$C_{n+1}$)→K0 at B0 Store overflow.

0→$K_7$ at B0 The A adder carry flip-flop is used during this micro-operation and reset upon its completion.

($C_n$+1)→$K_8$ at B0 The final carry term is stored in the carry flip-flop for the M adder $FV = Y38 \cdot C_1Q \cdot \overline{C_0Q}$ The FV micro-operation occurs in word time 1 and has a duration of 16 bit times. It is used for index instructions to transfer the address of the SPM-Register containing the operand from the D-Register to the $K_5$, $K_4$, and $K_3$ flip-flops. This makes the D-Register available for the operand address of the next instruction. The executed micro-operations are as follows:

1→$K_1$ at B0 The $K_1$ flip-flop is one set to identify an index byte. This will insure that the next instruction will be processed through the FB micro operation, which adds the contents of the selected SPM-Register (identified by the contents of the $K_5$, $K_4$, and $K_3$ flip-flops) to the operand address and stores the sum into the D-Register.

($D_2,D_1,D_0$)→$K_5,K_4,K_3$ at B0

$FW = Y38 \cdot \overline{C_1Q} \cdot \overline{C_0Q} \cdot K_{11}Q$ The FW micro-operation occurs in word time 1 and has a duration of 16 bit times. It is used to perform the logical AND operation between the contents of the A-Register and an operand stored in an addressed SPM-Register. The executed operations are as follows:

(A)·(SPM<D>)→A at B15 thru B0

(SPM<D>)→SPM<D> at B15 thru B0

$FX = Y38 \cdot \overline{C_1Q} \cdot \overline{C_0Q} \cdot \overline{K_{11}Q}$ The FX micro-operation occurs in word time 1 and has a duration of 16 bit times. It is used to EXCLUSIVE-OR the contents of the A-Register and an operand stored in an addressed SPM-Register and store the results in the A-Register. The contents of the addressed SPM-Register are preserved.

(A)⊕(SPM<D>)→A (SPM<D>)→SPM<D>

$FY = \overline{C_3Q} \cdot C_2Q \cdot C_1Q \cdot \overline{C_0Q} \cdot \overline{K_{11}Q} \cdot K_{10}Q \cdot D_0Q \cdot W1$ The FY micro-operation occurs in word time 1 and has a duration of 16 bit times. It is used during transfer type instruction. The next instruction address, contained in the SPM-2 Register, is exchanged with the return address from the M-Register. Thus, the next instruction address for the transfer is placed in the M-Register and the return address is placed in the SPM-2 Register. The executed operations are as follows:

(SPM<2>)$_{1sh}$→M at B15 thru B4

(M)→SPM<2>$_{lsb}$ at B15 thru B4

0→SPM<2>$_{msb}$ at B3 thru B0

$FZ = (C_3Q + C_2Q) \cdot W2$ The FZ micro-operation occurs in word time 2 and has a duration of eight bit times. It is used to access the next program instruction from the memory. The executed operations are as follows:

Read Strobe at B7

Restore Strobe at B3

Op[I]→C at B0

$C_3Q \cdot L_1Q \cdot \overline{(K_1Q + interrupt)}$:0→$K_1$ at B0

$L_1Q + K_1Q$·interrupt:1→$K_1$ at B0

0→$K_2$ at B0

$C_3Q$:0,0,0→$K_5,K_4,K_3$ at B0

$I_3,I_2$→$K_{11},K_{10}$ at B0

$FAB = C_3 Q \overline{C_2Q} \overline{C_0Q} W1$ The FAB micro-operation occurs in word time 1 and has a duration of 16 bit times. The contents of the A-Register are shifted to a selected output channel while the contents of a selected input channel are simultaneously shifted into the A-Register. Executed operations are as follows:

(A)→I/O<D> at B15 thru B0

(I/O<D>)→A at B15 thru B0

$FAC = C_3Q \cdot \overline{C_2Q} \cdot C_1Q \cdot \overline{C_0Q} \cdot W1$ The FAC micro-operation occurs at word time 1 and has a duration of 16 bit times. It is used to store the contents of the A-Register in an addressed SPM-Register. The executed operations are as follows:

(A)→SPM<D> at B15 through B0

(A)→A at B15 thru B0 The A-Register is recirculated.

Sn[A]→$K_1$ at B0 The sign of the operand stored in the A-Register, which is the most significant bit, is placed in the $K_1$ flip-flop but not used.

$FAD = C_3Q \cdot \overline{C_2Q} \cdot \overline{C_1Q} \cdot C_0Q \cdot \overline{K_{11}Q} \cdot W1$ The FAC micro-operation occurs in word time 1 and has a duration of 16 bit times. It is used for a shift lift operation on the A-Register and is implemented by extending the least significant portion of the A-Register with flip-flops $K_2$, $K_3$, $K_4$ and $K_5$. The A-Register is then shifted right for 16 bit times through these extra four flip-flops. The number of shifts left is selected and implemented by recirculating the output from a selected K flip-flop back to the input of the A-Register. This effectively increases the recirculation path by the required number of bit times delays thereby implementing a left shift after the 16 clock pulses. For instance, if the output of the second flip-flop ($K_3Q$) is selected, the contents will be shifted left two positions, and if the third flip-flip ($K_4$) is selected, the output will be shifted left three positions. For the left shift, the sign bit is shifted into the least significant bit of the A-Register by preloading the $K_2$–$K_5$ flip-flops with the sign bit contained in the $K_1$ flip flop. The executed operations are as follows:

($K_1Q$)→$K_2$–$K_5$ at B15

($A_i$)→$A_i$−1 at B15 thru B0

($A_0Q$)→$K_2$ at B15 thru B0

($K_2Q$)→$K_3$ at B15 thru B0

($K_3Q$)→$K_4$ at B15 thru B0

($K_4Q$)→$K_5$ at B15 thru B0

$\overline{D_1Q},\overline{D_0Q}$0:($K_2Q$)→A at B15 thru B0

$\overline{D_1Q},D_0Q$:($K_3Q$)→A at B15 thru B0

$D_1Q,\overline{D_0Q}$:($K_4Q$)→A at B15 thru B0

$D_1Q,D_0Q$:($K_5Q$)→A at B15 thru B0

$FAE = C_3Q \cdot \overline{C_2Q} \cdot \overline{C_1Q} \cdot C_0Q \cdot K_{11}Q \cdot \overline{K_{10}Q} \cdot W1$ The FAE micro-operation occurs in word time 1 and has a variable duration ranging from 1 to 16 bit times. It is used for a right shift and is implemented by preloading the bit counter with the contents of the D-Register. The bit counter 1 then clocks the A-Register for the selected number of shifts. For the right shift, the sign bit is shifted into the most significant portion of the accumulator. Executed operations are as follows:

($A_i$)→$A_i$−1 at B<$D_3,D_2,D_1, D_0$> thru B0

($K_1$)→$A_{15}$ at B<$D_3,D_2,D_1, D_0$> thru B0 The sign bit is loaded into the A-Register.

$FAF = C_3Q \cdot \overline{C_2Q} \cdot \overline{C_1Q} \cdot C_0Q \cdot K_{11}Q \cdot K_{10}Q \cdot W1$ The FAF micro-operation occurs in word time 1 and has a variable duration from 1 to 16 bit times. It is used for end around shift. The D-Register is used to set the bit timer to the selected number of end around shifts. The bit timer then clocks the A-Register as it counts down. The executed operations are as follows:

($A_i$)→$A_i$−1 at B<$D_3,D_2,D_1,D_0$> through B0

($A_0$)→$A_{15}$ at B<$D_3,D_2,D_1,D_0$> thru B0

$FAG = C_3Q \cdot C_2Q \cdot C_1Q \cdot W1$ The FAG micro-operation occurs in word time 1 and has a duration of 12 bit times. It is used for the skip on discrete instruction. If the selected discrete is true, the M-Register is clocked and incremented by three. If the selected discrete is false, the M-Register is not clocked and is therefore not incremented. The executed operations are as follows:

DSI<D>:(M)+3→M at B11 thru B0

0→$K_8$ at B0 The M carry flip-flop is used to increment the M-Register and reset at the end of the micro-operation.

$FAH = C_3Q \cdot C_2Q \cdot \overline{C_1Q} \cdot W1$ The FAH micro-operation occurs in word time 1 and has a duration of 12 bit times. It is used to implement the discrete output instruction. The operation executed is as follows:

1→DSO<D< at B11 thru B0

$FAI = \overline{C_3Q} \cdot \overline{C_2Q} \cdot K_2Q \cdot \overline{K_1Q} \cdot W1$ The FAI micro-operation occurs in word time 1 and has a duration of 12 bit times. It is used during the decrement and transfer instruction when the contents of a selected index register has been decremented to a negative number. It should be noted that an alternate path is taken when the contents of the selected index register remain positive. This alternate path is through the FL micro-operation as with other transfer type instructions. The executed operations are as follows:

(M)=2→M at B11 thru B0

1→$C_2$ at B0

0→$K_8$ at B0 The M-carry register is used to increment the M-Register and reset to zero at the end of the micro-operation.

$FAH = L_1Q \cdot W3$ The FAJ micro-operation occurs in word time 3 and has a duration of 16 bit times. It is entered for a turn-on interrupt (identified by the $L_1Q$ signal) and is, effectively, a no operation. The operations executed are:

0→$L_1$ at B0

$FAK = \overline{L_1Q} \cdot \overline{P89} \cdot Y7 \cdot W3$ The FAK micro-operation occurs in word time 3 and has a duration of 16 bit times. It is used for external interrupts and is entered if there is an external interrupt, $\overline{P89}$, and there is no interrupt disable, $L_3Q$, or there is a preceding index instruction identified by $K_1Q$. It acts as a spacer for the word counter and no operations take place.

$FAL = K_1Q \cdot W4$ The FAL micro-operation occurs in word time 4 and has a duration of 16 bit times. It is used for the start of the interrupt routine, preloading the M-Register with memory address $040_{16}$ and storing the return address in the SPM-2 Register. Operations executed are as follows:

$040_{16}$→M at B15 thru B0

(M)→SPM<2>$_{lsb}$ at B15 thru B0

$FAM = K_1Q \cdot W5$ The FAM micro-operation occurs in word time 5 and has a duration of eight bit times. It is used to access the contents of the program memory portion of the memory at location $040_{16}$, which is the start of the interrupt routine. Operations executed are as follows:

Read Strobe at B7
Restore Strobe at B3
(PM<M=64>)→I at B7
Op[I]→$C_3,C_2,C_1,C_0,K_{11},K_{10}$ at B0

0→$L_3$ at B0 The interrupt disable flip-flop is cleared.

$FAN = K_1Q \cdot W6$ FAN is a no-op.

$FAO = K_1Q \cdot W7$ The FAO micro-operation occurs in word time 7 and has a duration of 12 bit times. It is effectively a no op, merely setting the control flip-flops for a new word time cycle. Operations executed are:

0→$W_2,W_1,W_0$ at B0 The word counter is reset.

0→$K_5,K_4,K_3,K_2,K_1$, at B0

$FAP = \overline{C_3Q} \cdot C_2Q \cdot Y_6 \cdot \overline{K_{10}Q} \cdot W1$ FAP is a no-op.

$FAQ = C_1Q \cdot C_0Q \cdot Y39$ The FAQ micro-operation occurs in word time 1 and has a duration of 16 bit times. The contents of the selected SPM Register is preserved by recirculation and also transfer to the A Register.

(SPM<D>)→SPM D at B15 thru B0

(SPM<D>)→A at B15 thru B0

INITIALIZATION

During initialization of the data processor 12, the following operations are executed:

1. $L_1$ is in the true state due to the power turn-on condition.
2. FAJ is always automatically entered for start-up to initialize the following functions:
   A. The M-Register is preset to the PM address $040_{16}$ in FAL.
   B. All SPM Registers are cleared under program control.
   C. The D-Register is loaded from PM<M>=$040_{16}$.
   D. The C-Register ($C_3,C_2, C_1, C_0, K_{11}, K_{10}$) is loaded from PM<M>=040.
   E. The PM Read and Restore Strobes are generated in FAM.
   F. The A-Register is cleared under program control.
   G. The $K_1$ flip-flop is cleared in FAO.
   H. The $K_2$ flip-flop is cleared in FAO.
   I. Flip-flops $K_5, K_4, K_3$ are cleared in FAO.
   J. Flip-flops $K_8, K_7$, the M-Register and A-Register carry flip-flops are reset at every BO.

DISCRETE OUTPUTS

The data processor 12 can generate discrete outputs (DO) to meet specific requirements under program control. The DO assignments are:

DO-0 Set interrupt enable.

DO-1 Provide clock pulses to ASR-33 (TELETYPEWRITER).

DO-2 Provides a clock to set the power turn-on interrupt, $L_1$. A DO-2 instruction (1100-0010) will be contained in program memory location $40_{16}$ to rest $L_1$ during power turn-on.

DO-3 Iteration timer reset.

DO-4 Trigger to $I_2$ latch, the discrete input 4 (DI-4) toggle. The $I_2$ flip-flop is automatically zero set during the power on sequence.

DO-5 Trigger to $I_3$ latch, the discrete input-5 (DI-5) toggle. The $I_3$ flip-flop is automatically zero set during the power turn-on sequence.

DO-6 Trigger to the $I_4$ latch, the discrete input-6 (DI-6) toggle. The $I_4$ flip-flop is automatically zero set during the power turn-on sequence.

DO-7 Intensity control.

DO-8 Toggles the $I_1$ flip-flop causing scratch pad memory paging.

DO-9 Main memory paging.

DO-10 Spare.

DO-11 Servo set.

DISCRETE INPUTS

The data processor 12 can operate on a discrete input (DI) with a skip-on-discrete instruction under program control. The discrete inputs are various low frequency digital signals. The purpose of the discrete inputs is to define a status or condition. The DI assignments are:

DI-0 Spare
DI-1 Skip unconditional.
DI-2 Skip on ASR-33 (TELETYPEWRITER).
DI-3 Skip on the sign of (A).
DI-4 Skip on the $I_2Q$ latch (DO-4 trigger).
DI-5 Skip on $I_3Q$ latch (DO-5 trigger).
DI-6 Skip on $I_4Q$ latch (DO-6 trigger).
DI-7 Skip on logical overflow in A-Register.
DI-8 Used for troubleshooting.
DI-9 Skip on arthmetic carry from A-Register.
DI-10 Skip on positive.
DI-11 Skip on servo ready.

INTERRUPTS

Interrupts may be added virtually without limit. All interrupts are logically ORed together (X5) to transfer operation of the data processor 12 to an interrupt subroutine starting in memory location $040_{16}$. The return address is preserved in SPM-2. The interrupt subroutine will scan the discrete interrupt inputs and operate on each interrupt.

The interrupt enable flip-flop ($L_3$) will automatically disable interrupts within interrupts, but may be set with a DO-0 after the return address in SPM-2 has been stored elsewhere under program control, thereby permitting interrupts within interrupts. The end of the interrupt subroutine requires the transfer to the return address, the setting of the interrupt enable flip-flop ($L_3$) if required, and the transfer indirect (TI) to the return address contained in SPM-2.

The interrupt enable flip-flop ($L_3$) may be used to preserve the contents of SPM-2 against the contingency of an interrupt to permit time shared use of SPM-2.

DATA-SAVE

The power supply generates a C signal which indicates the power supply is out of tolerance limits and requests the data processor 12 to generate a data-save signal in the event of a power dropout. Following a delay of sufficient duration to insure the completion of a memory cycle, the data processor generates a data-save signal ($\overline{L_2Q}$) in response to the C signal generated by the power supply. The delay will range from 20 nonoseconds to 35 microseconds and will have an average duration of 7 microseconds. The data-save operation constitutes the power turn-off interrupt, where the C signal will always initiate a data-save function which will terminate normal computer operation.

ADAPTIVE MEMORY CONTROL

The data processor 12 incorporates an adaptive memory control that adds additional memory protection to insure that the power turn-on condition does not cause detrimental system operation and provide protection from loss of program. In the data processor, this power condition is detected and used to initiate a power interrupt ($L_1Q$); which forces the data processor to look at a specific memory address (040 HEXADECIMAL) by preloading this address into the M-Register. The data processor will continue to access this address until the power interrupt condition is alleviated. In prior art systems, the power interrupt is eliminated when the voltages come within tolerance. In this invention, adaptive techniques are used that insures that not only are the voltages back into tolerance levels, but memory can be properly accessed. This technique is implemented with a memory access interlock implemented by requiring that an instruction that generates a discrete output (DO-2) be located in the first location of the power interrupt program in memory. This discrete output (DO-2) instruction provides the adpative interlock to insure that memory cannot be accessed before the power interrupt is exited.

MEMORY PROTECT

A memory protect scheme greatly reduces problems with loss of program and protects against the program wiping out part of the program. This is accomplished by logically processing the memory address register outputs to produce a signal P110 (Table II) disabling the write mode (associated with the memory read-write logic) when the M-Register is addressing protected parts of the memory. This technique effectively permits an electrically alterable (core type) memory to be configured as a read-only memory in selected locations for additional protection of the program stored in that memory.

INSTRUCTION REPERTOIRE

The program instructions for the numerical control system 10 are encoded as 8-bit bytes, each byte being stored in a different program memory location of the program memory. The instructions may have multiple bytes, but most have a length of only 1 byte. Each instruction contains an operation code in the most significant portion, and, when required, an operand address in the least significant portion. Indexing is achieved with an index functional modifier byte preceding the instruction whose operand address is to be indexed. Operands can be located in any of the SPM Registers, the constant memory part of the program memory, or in the two program memory bytes following an instruction (in line).

FUNCTIONAL MODIFIER

The program instructions follow a functional modifier concept which yields a high degree of flexibility and economy. This concept permits conservation of memory by the use of short instructions without sacrifice of flexibility or capability. As an example, extensive indexing capability is available when required even though an index field is not required in an instruction. This indexing capability is implemented by programming an index functional modifier prior to an instruction to be indexed. This functional modifier indicates that the following instruction is to be indexed and identifies the location of the index. A functional modifier may also be used to make available double precision shifting capability. The short instruction word length which is configured for efficient use of memory permits only enough instructions for single precision shifting operations. A double precision shift capability is implemented by preceding the shift instructions with a functional modifier to indicate that the subsequent shift instruction is a double precision shift. Thus, both single and double precision shifting capability may be implemented without use of excessively long instruction words.

DETAILED DESCRIPTION OF INSTRUCTIONS

For convenience of discussion, the instructions are divided into four categories A, B, C, and D. During the execution of Group A instructions, operands are obtained from the constant memory portion of the main memory with SPM-2 used as an intermediate working register. Therefore, SPM-2 contents must be expendable when using Group A instructions. The operand address pertains to the corresponding locations in the constant memory portion of the main memory, and are defined as double byte locations 0 through 15, but are indexable through many additional pages of double byte locations. Double byte operands are used becausee two 8-bit bytes are used for each 16 bit operand, each memory location storing one byte. Therefore operand word address 0 defines memory byte address locations 0 and 1, operand word address 1 defines memory byte address locations 2 and 3. Thus, twice the operand word address defines the first of the two operand byte address locations. Certain operand addresses pertain to the two bytes following the instruction. Constants and parameters can be stored in the main memory with the least significant half (msh) of a word in the second byte. The constant memory portion of the main memory is composed of many 16 word pages where each word is composed of two 8-bit bytes. The Group A instructions can be indexed to select required constants or parameters.

The Group A instructions are as follows:

1. LS (load SPM-2 with next two bytes) 0010-0001.

This is a three-byte instruction having the above operation code contained in the zero byte. It causes the subsequent byte 1 and byte 2 containing the least significant half and most significant half, respectively, of an in line operand to be loaded into SPM-2. This instruction is not indexable, it uses micro-operations FA, FL, FM, FN, FO, FP, FQ, FJ, FAP, and FZ.

2. ST (store (A) in PM) 0010-0001.

This is a one byte instruction having the above operation code. It causes a two-byte operand previously stored in the A-Register to be stored in a main memory location whose address is stored in the 12 least significant bits of the SPM-2 register. The first byte (lsh) of the operand is loaded into the memory location addressed by SPM-2 and the second byte (msh) of the operand is loaded into the memory location following the first byte. The operand is also preserved in A. The operand address is incremented twice, identifying the memory location following the second byte, and returned to SPM-2 where it is preserved. This permits a second operand to be loaded into the A-Register and then transferred to the next-in-line memory location with a second ST instruction. The next instruction address is also preserved and can be used to access the next instruction. The micro-operations used during this instruction are FA, FD, FE, FG, FF, FH, FI, FJ, FY, and FZ.

3. TX (decrement and transfer on non-negative) 0010-0110.

This may be either a three or a four-byte instruction. The first byte is an optional index byte and defines an index register. The absence of an index byte defines the SPM-0 Register. The second byte contains the above operation code and the third and fourth bytes define a transfer address. A non-negative decremented number will cause the next instruction to be accessed from the transfer address location defined by the last two bytes of this instruction. The return address is stored in the SPM-2 Register.

A negative decremented number will cause the next instruction to be accessed from the byte following the last byte (address byte 2). The transfer address (which is not used) is preserved in SPM-2.

This instruction is used to guide the data processor through a loop one or more times. The desired number of transfers, less one, is initially loaded into the appropriate index register. This number will then be decremented through zero to a negative number before the loop is exited.

As long as the decremented number is non-negative, the TX instruction goes through micro-operations FC, FL, FM, FN, FO, FP, FQ, FJ, FY and FZ.

As soon as the decremented number becomes negative, the TX instruction goes through micro-operations FC, FAI, and FZ.

4. TR (unconditional transfer) 0010-0111.

This is a three-byte instruction in which the above operation code is contained in the first byte and a transfer address defined by the second and third bytes. This instruction will cause the next instruction to be accessed from the transfer address location defined by the second and third bytes. The return address is preserved in SPM-2. This instruction goes through micro-operations, FA, FL, FM, FN, FO, FP, FQ, FY and FZ.

5. IP (index) 0010-1$I_2I_1I_0$

This is a one-byte indexable functional modifier containing the operation code in the five most significant bits and an operand address in the three least significant bits. A first index (IP or IS) instruction preceding a second index (IP or IS) instruction will cause the operand address of the second index (IP or IS) instruction to be indexed by the operand of the first index (IP or IS). Thus, mutilevel indexing is permissible without limit and index parameters can be obtained from locations throughout the memory.

This instruction goes through micro-operations FA, FK, FM, FN, FO, FP, FQ, FR, FV, and FZ.

6. IP-7 (index) 0010-1111

When an index instruction identifies address location 111 it becomes a three-byte non-indexable instruction wherein an operand is contained in the second and third bytes. The operand is transferred to the SPM-2 Register. This instruction goes through micro-operations FA, FL, FM, FN, FO, FP, FQ, FS, FV and FZ.

7. DP (ADD) 0001-$I_3I_2I_1I_0$

This is a one-byte indexable instruction wherein the operation code is stored in the first four bits and an operand address is stored in the last four bits. This instruction causes the contents of an SPM-Register identified by the address portion to be added to the contents of the A-Register and the results stored in the A-Register. This instruction goes through micro-operations, FA, FK, FM, FN, FO, FP, FQ, FR, FT and FZ.

8. DP-15 (Add) 0001-1111

When a DP instruction identifies address location 1111 it becomes a three-byte non-indexable instruction with the second and third bytes containing an operand. This operand is added to the contents of the A-Register and the results stored in the A-Register. This instruction goes through micro-operations FA, FL, FM, FN, FO, FP, FQ, FS, FT, and FZ.

9. BP (subtract) 0011-$I_3I_2I_1I_0$

This is a one-byte indexable instruction wherein the operation code is contained within the first four bits and an operand address is identified by the second four bits. It causes an operand stored in an SPM-Register defined by the operand address to be subtracted from the contents of the A-Register and the results stored in the A-Register. This instruction goes through micro-operations FA, FK, FM, FN, FO, FP, FQ, FR, FU, and FZ.

10. BP-15 (subtract) 0011-1111

When the operand address defined by a BP instruction is 1111 is becomes a three-byte non-indexable instruction. The second and third bytes contain an operand which is subtracted from the contents of the A-Register and the difference stored in the A-Register. This instruction goes through micro-operations FA, FL, FM, FN, FO, FP, FQ, FS, FU and FZ.

11. XP (exclusive-OR) 0000-0$I_2I_1I_0$

This is a one-byte indexable instruction in which the operation code is contained in the five most significant bits and an SPM-Register containing an operand is defined by the three least significant bits. The operand is exclusive-ORed with the contents of the A-Register and the result is stored in the A-Register. This instruction goes through micro-operations FA, FK, FM, FN, FO, FP, FQ, FR, FX and FZ.

12. XP-7 (exclusive-OR) 0000-0111

When an XP instruction defines operand address 111, it becomes a three-byte non-indexable instruction containing an operand in the second and third bytes. This operand is exclusive-ORed with the contents of the A-Register and the result is stored in the A-Register. This instruction goes through micro-operations FA, FL, FM, FN, FO, FP, FQ, FR, FX and FZ.

13. AP (logical AND) 0000-1$I_2I_1I_0$

This is a one-byte indexable instruction wherein the operation code is contained in the five most significant bits and an SPM-Register address containing an operand is defined by the three least significant bits. The operand contained in the addressed SPM-Register is logical ANDed with the contents of the A-Register and the result is stored in the A-Register. A logical AND with a 0 operand is used to clear the A-Register. This instruction goes through micro-operations FA, FK, FM, FN, FO, FP, FQ, FR, FW, and FZ.

14. AP-7 (logical AND) 0000-1111

When the address defined by an AP instruction is 111, it becomes a three-byte non-indexable instruction having an operand contained in the second and third bytes. The operand is logical ANDed with the contents of the A-Register and the result is stored in the A-Register. This instruction goes through the micro-operations FA, FL, FM, FN, FO, FP, FQ, FS, FW and FZ.

Group B instructions obtain all operands from the scratch pad memory. Each SPM page consists of 16 registers with indexing permitted between the two SPM pages. Caution is required when using SPM-2 because an interrupt will replace the contents of SPM-2 with a return address. This can be circumvented with the use of an interrupt disable discrete. In addition, the use of a Group A instruction will replace the contents of the SPM-2 Register with either data or a return address, requiring the transfer of SPM-2 data to another SPM-Register before a Group A instruction is used if the data is to be preserved.

15. TI (transfer indirect) 0110-0111

This is a one-byte non-indexable instruction having the above operation code. It causes the address of the next instruction to be obtained from SPM-2 and the return address stored in SPM-2. It goes through micro-operations FA, FY and FZ.

16. IS (index) 0110-1$I_2I_1I_0$

This is a one-byte indexable functional modifier having the operation code contained in the five most significant bits and an address defining an SPM-Register containing an operand contained in the three least significant bits. A first index (IP or IS) instruction following a second index (IP or IS) instruction will cause the operand address of the second index (IP or IS) instruction to be indexed by the operand of the first index (IP or IS9 instruction. Multilevel indexing is thus permissible without limit. Only SPM-Registers 0 through 7 of each SPM page may be used as index registers. This is a single byte functional modifier programmed immediately prior to an instruction to be indexed. This instruction goes through micro-operations FA, FV and FZ.

17. DS (Add) 0101-$I_3I_2I_1I_0$

This is a one-byte indexable instruction wherein the four most significant bits define the operation code and the four least significant bits define an SPM-Register address containing an operand. The operand in the addressed SPM-Register is added to the contents of the A-Register and the sum is stored in the A-Register. This introduction goes through micro-operations FA, FT and FZ.

18. BS (subtract) 0111-$I_3I_2I_1I_0$

This is a one-byte indexable instruction wherein the four most significant bits define the operation code and the four least significant bits define a scratch pad memory address containing an operand. The addressed operand is subtracted from the contents of the A-Register and the difference is stored in the A-Register. This introduction goes through micro-operations FA, FU and FZ.

19. XS (exclusive-OR) 0100-0$I_2I_1I_0$

This is a one-byte indexable instruction wherein the five most significant bits define the operation code and the three least significant bits define an SPM address containing an operand. The operand is exclusive-ORed with the contents of the A-Register and the result is stored in the A-Register. This instruction goes through micro-operations FA, FX and FZ.

20, AS (logical AND) 0100-1$I_2I_1I_0$

This is a one-byte indexable instruction wherein the five most significant bits define the operation code and the three least significant bits define an SPM address containing an operand. The addressed operand is logical ANDed with the contents of the A-Register and the result is stored in the A-Register. This instruction goes through micro-operations FA, FW and FZ.

The following Group C type instructions relate to operations generally involving the A-Register.

21. SS (store (A) in SPM) 1000-$I_3I_2I_1I_0$

This is a one-byte indexable instruction wherein the four most significant bits identify the operation code and the four least significant bits define an SPM address. The contents of the A-Register are placed in the addressed SPM-Register and also preserved in the A-Register. This instruction uses micro-operations FA, FAC and FZ.

22. SL (shift left) 1001-00$I_1I_0$

This is a one-byte non-indexable instruction wherein the six most significant bits define the operation code and the two least significant bits define the number of shifts. The contents of the A-Register are shifted left by the binary number defined by $(I_1I_0)+1$. In other words, $\bar{I}_1, \bar{I}_0=1$ shift, $\bar{I}_1 I_0=2$ shifts, $I_1\bar{I}_0=3$ shifts, and $I_1 I_0=4$ shifts. 0's are shifted into the vacated least significant bits of the A-Register. This instruction goes through micro-operations FA, FAD and FZ.

23. SE (shift end around) 1001-11$I_1 I_0$

This is a one-byte indexable instruction wherein the six most significant bits identify the operation code and the two least significant bits identify a number of shifts. The number of bits shifted can be indexed up to a maximum of 16 bits. The contents of the A-Register are shifted by the binary number represented by $(I_1 I_0)+1$. That is, $\bar{I}_1,\bar{I}_0=1$ shift, $\bar{I}_1 I_0=2$ shifts, $I_1\bar{I}_0=3$ shifts, and $I_1 I_0=4$ shifts. Additional shifts are accomplished by indexing. The end around shift is effectively a right shift where the least significant bit is shifted out of the A-Register and recirculated into the most significant bit position of the A-Register. This instruction goes through micro-operations FA, FAF and FZ.

24. SR (shift right) 1001-10$I_1 I_0$

This is a one-byte indexable instruction wherein the six most significant bits identify the operation code and the two least significant bits identify a number of shifts. The number of bits shifted can be indexed up to a maximum of 16 bits. The contents of the A-Register are shifted right as indexed or by a number of bits equal to the binary number defined by $(I_1 I_0)+1$. That is, $\bar{I}_1, \bar{I}_0=1$ shift, $\bar{I}_1 I_0=2$ shifts, $I_1\bar{I}_0=3$ shifts, and $I_1 I_0=4$ shifts. The sign bit of the A-Register is continuously shifted into the most significant bit position. This instruction goes through micro-operations FA, FAE and FZ.

25. EX (input/output word) 1010-$I_3 I_2 I_1 I_0$

This is a one-byte indexable instruction wherein the four most significant bits identify the operation code and the four least significant bits identify an I/O channel address. The contents of the A-Register are output to the addressed channel while the contents of the addressed channel are simultaneously loaded into the A-Register. A shift enable signal is output to gate 16 clock pulses to the selected channel. This instruction goes through micro-operations FA, FAB, and FZ.

26. EX-15 (input/output word) 1010-1111

This instruction clears the A-Register by shifting in the contents of a non-existent input channel which are all zeros. This instruction goes through micro-operations FA, FAB and FZ.

27. LD (load accumulator) 1011-$I_3 I_2 I_1 I_0$

This is a one-byte indexable instruction wherein the four most significant bits identify the operation code and the four least significant bits identify an SPM address containing an operand. The operand in the addressed SPM-Register is loaded into the A-Register. This instructon goes through micro-operations FA, FAQ and FZ.

Group D instructions relate to the discretes.

28. DC (discrete output) 110$I_4$-$I_3 I_2 I_1 I_0$

This is a one-byte indexable instruction wherein the three most significant bits define the operation code and the five least significant bits define an output channel address. A discrete output signal, an inverted 3 microsecond pulse is generated on the addressed output channel. This instruction goes through micro-operations FA, FH and FZ.

29. SK (skip on discrete) 111$I_4$-$I_3 I_2 I_1 I_0$

This is a one-byte indexable instruction wherein the three most significant bits identify the operation code and the five least significant bits identify a discrete input channel address. If a discrete exists on the addressed channel, three bytes (usually a transfer instruction) are skipped and the next instruction is obtained from the fourth byte following the skip on discrete instruction. If a discrete does not exist on the addressed channel, the next instruction (usually a three-byte transfer instruction) is obtained from the three bytes immediately following the skip on discrete instruction. This instruction goes through micro-operations FA, FAG and FZ.

Two rules create exceptions to the above micro operation flow paths.

1. When an interrupt occurs during the execution of an instruction, the instruction will not terminate with the FZ micro-operation but instead will continue through the FAK, FAL, FAM, FAN, FAO micro-operations.

2. Whenever an instruction normally going through the FA micro-operation is preceded by an index functional modifier (IS or IP) it will go through FB in lieu of FA.

SCHEMATIC DIAGRAMS

As previously noted the data processor is physically layed out on a series of printed circuit boards interconnected by a Mother board. The schematic drawings in FIGS. 6–17 show columns of numbers and letters representing plug interconnections and common signal connections, which are summarized in Table IV. The registers and logic gates are implemented with SN 7400 series integrated circuits. The registers and flip flops are shown in detail in FIGS. 6–17 and the various logical equations such as the inputs to these elements are defined in Table I and Table II. Although the illustrated registers and flips flops, combined with the equations in Table I, Table II, and Table III are sufficient to completely define the operation of the data processor 12 (FIG. 1), groups of logical functions have been shown on the printed circuit boards on which they are actually implemented. It should be understood, however, that the location of gates developing logical signals is largely determined by availability of space and primary or intermediary subsignals and may or may not be related to the ultimate use of a particular logical signal.

The numerous computer signals are defined with both, letters and numbers. The signal definitions in FIGS. 6 thru 17 correspond with the signal definitions in the logical equations and with the micro-operation designations. Each logic card shown in FIGS. 6 thru 17 have pin designations that correspond to the signals on that logic card, with those pin designations repeated for each card. The signals for each logic card and the pin designation that corresponds to that signal on that card are shown in Table IV. The pin designations are listed in the left hand column, while the signals corresponding to those pin designations are listed in columns under the card designations (such as cards A, B, C, etc) and the Figure references (such as FIGS. 6, 7, 8, etc).

As shown in FIG. 6 the A-Logic printed circuit board includes the A-Register 130, its associated full adder 132 and the A carry flip-flop $K_7$ 138. Also shown is the M-Register 112, its associated full adder 139, and the carry flip-flop 140. The A-Register overflow detector flip-flop $OF_1$ 134 and logic dates 135 are also located on the A-Logic board.

As shown in FIG. 7 the B-Logic printed circuit board includes the bit counter, flip-flop $B_0$ 150, $B_1$ 152, $B_2$ 154 and $B_3$ 156. Flip-flops $B_4$ 158, $B_5$ 160, $B_6$ 162 and $B_7$ 164 produce the asymmetric main clock signal P3. Also included on this board is the bit time decode logic 166, logic gates 168 and various other logic gates.

As shown in FIG. 8 the C-Logic printed circuit board includes various logic gates 17 as well as the C-Register which includes flip-flops $C_3$ 172, $C_2$ 174, $C_1$ 176, $C_0$ 178, $K_{11}$ 180 and $K_{10}$ 182.

Figure 9:
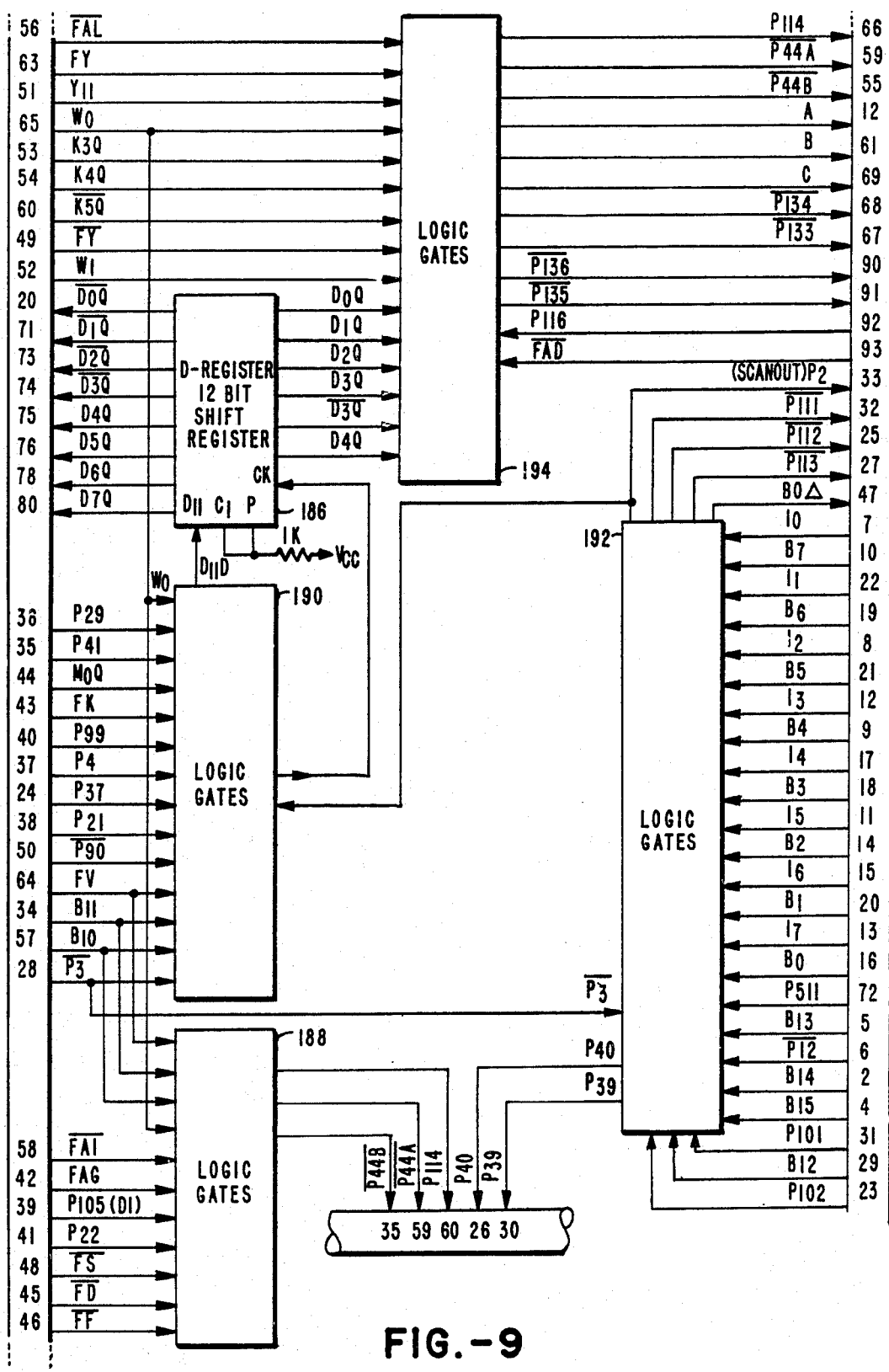
FIG. 9 is a schematic and block diagram representation of the D logic circuit board.

As shown in FIG. 9 the D-Logic printed circuit board includes the D-Register 186 as well as varius logic gates 188, 190, 192 and 194.

Figure 10:
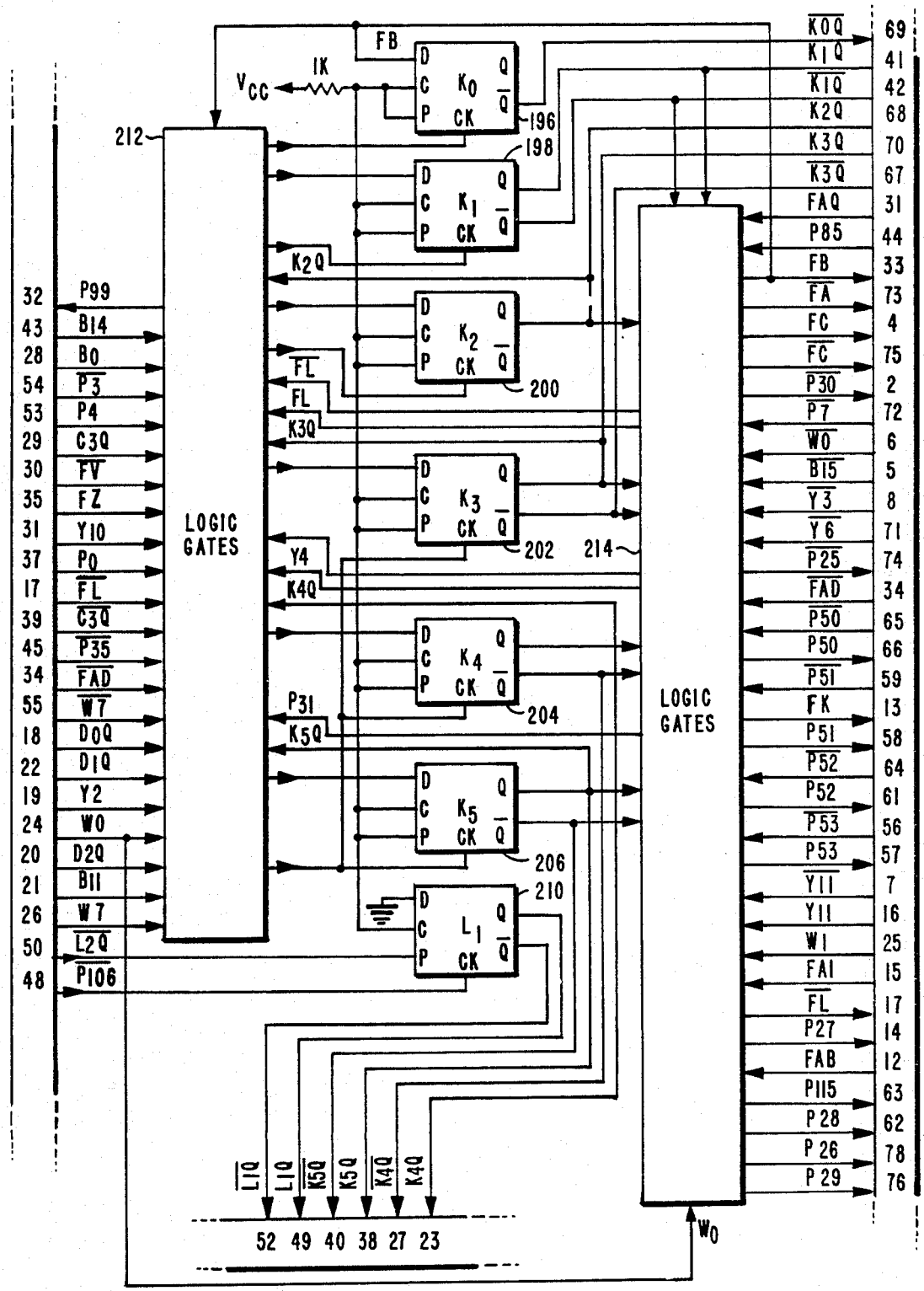
FIG. 10 is a schematic and block diagram representation of the K logic circuit board.

As shown in FIG. 10 the K-Logic printed circuit board includes flip-flops $K_0$ 196, $K_1$ 198, $K_2$ 200, $K_3$ 202, $K_4$ 204, $K_5$ 206, and $L_1$ 210. Also included are various logic gates 212 and 214.

As shown in FIG. 11 the W-Logic printed circuit board includes the word counter composed of flip-flops $W_2$ 220, $W_1$ 222 and $W_0$ 224 as well as the flip-flop $L_2$ 226. Also included are various logic gates 228, 230 and 232.

Figure 12:
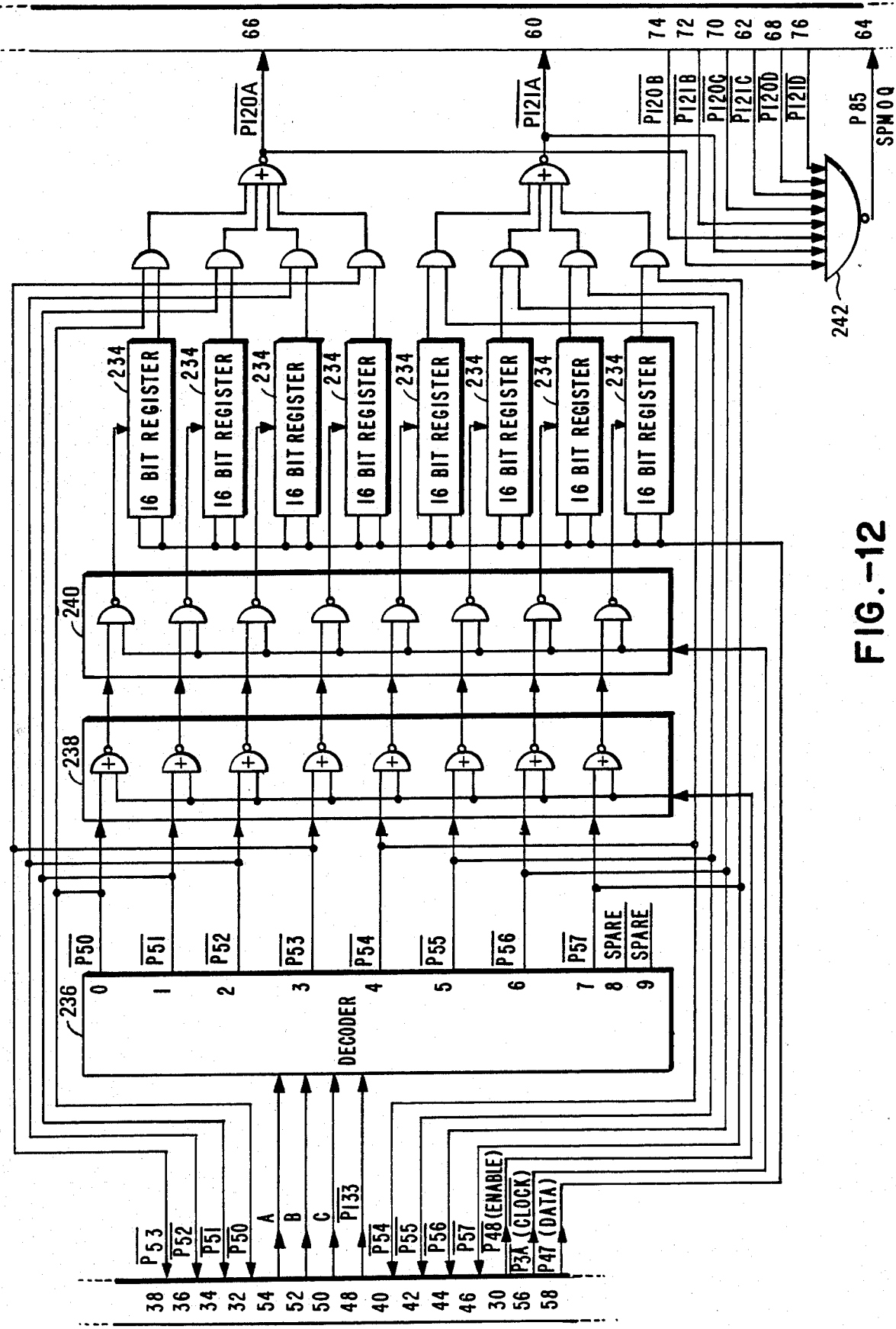
FIG. 12 is a schematic and block diagram representation of the SPM circuit board.

As shown in FIG. 12 an A section Scratch Pad Memory printed circuit board includes eight paris of integrated circuit shift registers 234. A binary coded decimal to decimal decoder 236 generates memory select signals $\overline{P50}$ through $\overline{P57}$ which is gated through a first series of gates 238. This first gated signal in turn gates a clock signal $\overline{P3A}$ through a second series of gates 240 to clock a selected one of the registers. The outputs from the registers 234 are multiplexed into signals $\overline{P120A}$ and $\overline{P121A}$, each carrying outputs from four of the registers. Three additional scratch pad memory sections B, C and D, identical with A shown in FIG. 12 provide corresponding output signals P120B, 121B, 120C, 121C, 120D and 121D. These in turn are multiplexed by NAND gate 242 into a single output signakl P85. The signals in the B, C and D sections correspond to those of the A section and are defined according to terminal numbers as follows:

| Terminal No. | A | B | C | D |
| --- | --- | --- | --- | --- |
| 30 | $\overline{P48}$ | $\overline{P48}$ | $\overline{P48}$ | $\overline{P48}$ |
| 32 | $\overline{P50}$ | $\overline{P58}$ | $\overline{P66}$ | $\overline{P74}$ |
| 34 | $\overline{P51}$ | $\overline{P59}$ | $\overline{P67}$ | $\overline{P75}$ |
| 36 | $\overline{P52}$ | $\overline{P60}$ | $\overline{P68}$ | $\overline{P76}$ |
| 38 | $\overline{P53}$ | $\overline{P61}$ | $\overline{P69}$ | $\overline{P77}$ |
| 40 | $\overline{P54}$ | $\overline{P62}$ | $\overline{P70}$ | $\overline{P78}$ |
| 42 | $\overline{P55}$ | $\overline{P63}$ | $\overline{P71}$ | $\overline{P79}$ |
| 44 | $\overline{P56}$ | $\overline{P64}$ | $\overline{P72}$ | $\overline{P80}$ |
| 46 | $\overline{P57}$ | $\overline{P65}$ | $\overline{P73}$ | $\overline{P81}$ |
| 48 | $\overline{P133}$ | $\overline{P134}$ | $\overline{P135}$ | $\overline{P136}$ |
| 50 | C | C | C | C |
| 52 | B | B | B | B |
| 54 | A | A | A | A |
| 56 | $\overline{P3A}$ | $\overline{P3B}$ | $\overline{P3C}$ | $\overline{P3D}$ |
| 58 | P47 | P47 | P47 | P47 |
| 60 | $\overline{P121A}$ | $\overline{P121B}$ | $\overline{P121C}$ | $\overline{P121D}$ |
| 62 | $\overline{P121C}$ | | | |
| 64 | P85 | | | |
| 66 | $\overline{P120A}$ | $\overline{P120B}$ | $\overline{P120C}$ | $\overline{P120D}$ |
| 68 | $\overline{P120D}$ | | | |
| 70 | $\overline{P120C}$ | | | |
| 72 | $\overline{P121B}$ | | | |
| 74 | $\overline{P120B}$ | | | |
| 76 | $\overline{P121D}$ | | | |

Figure 13:
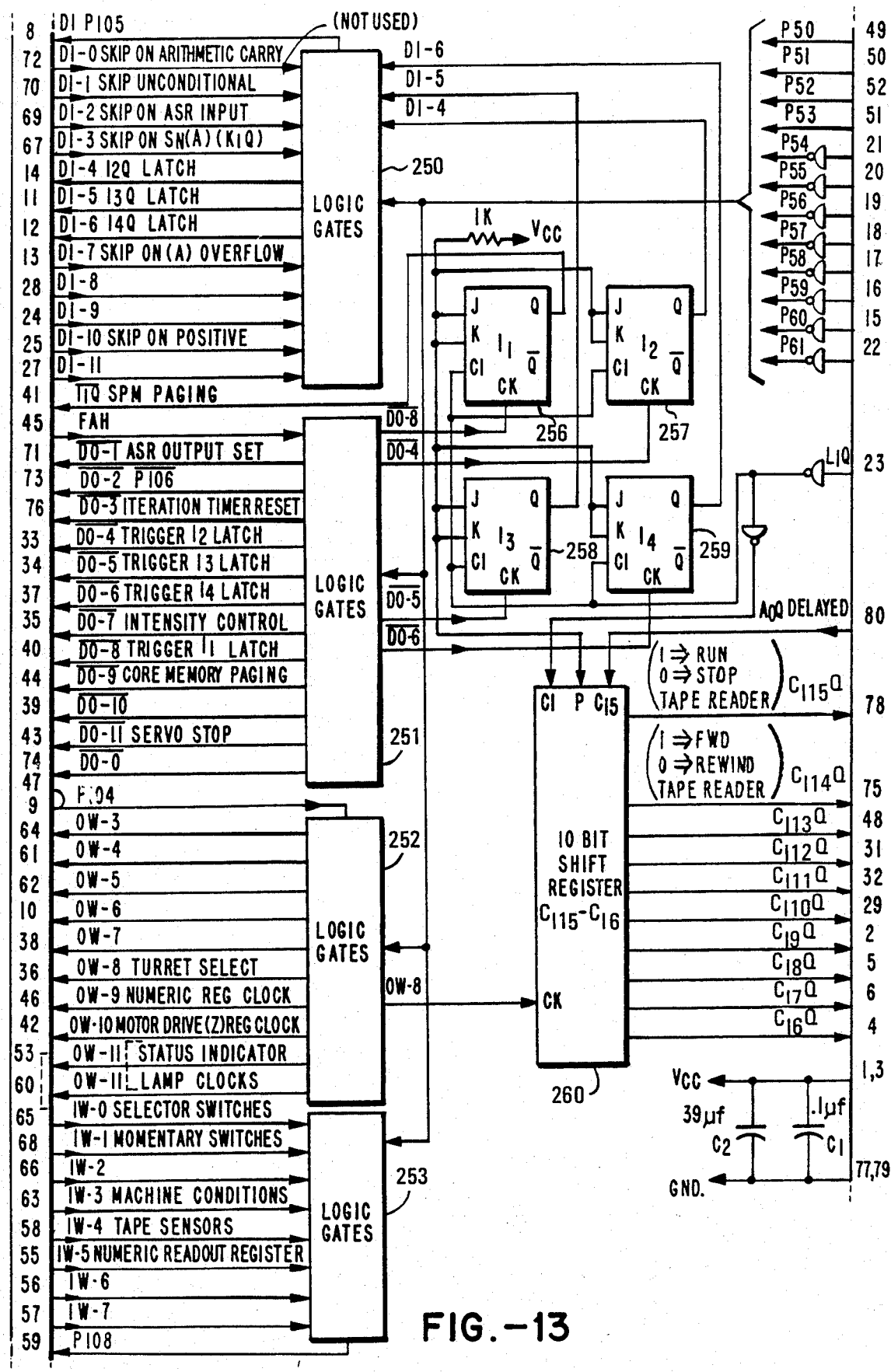
FIG. 13 is a schematic and block diagram representation of the 1FA-1 circuit board.

As shown in FIG. 13 the IFA-1 printed circuit board contains logic gates 250, 251, 252 and 253 providing input/output functions. The IFA-1 board accepts input and output type instruction micro-operation signals as well as address signals to encode or decode the varius inputs and outputs. The input and output words are exchanged with the A-Register in the data processor 12 (FIG. 4). The input words (IW) are multiplexed by logic gates 253 into signal P108 which is input to the A-Register. Information is output from the A-Register to the various entities by connecting the entities to $A_0Q$ and clocking a selected entity with a gated clock P104 as determined by logic states 252, shown as output word (OW) signals. Discrete input signals are multiplexed into signal P105 by logic gates 250. Discrete output signals (DO) are decoded and gated by logic gates 251. Micro-operation FAH provides the gating signal. The discrete input signals are accessed with skip on discrete decision instructions, and each discrete output signal (DO) provides a short negative going pulse when selected with a discrete output instruction. The I-Register flip-flops 256, 257, 258 and 259 perform the function of latches toggled or set with the discrete outputs. The $I_1$ flip-flop 256 is used to directly provide a Scratch Pad Memory paging function. Outputs from the flip flops $I_2$ 257, $I_3$ 258 and $I_4$ 259 become discrete inputs. A $C_I$-Register 260 is loaded with output word 8 and used for general system functions. This interface C-Register shown in FIGS. 13 and 15 will be referred to as the $C_I$-Register hereafter to distinguish it from the data processor C-Register shown in FIG. 8. The signals P50-P61 are decoded operand addresses from the data processor.

As shown in FIG. 13, the $C_I$-Register 260 contains a plurality of discrete commands $C_{I15}Q$-$C_{I6}Q$, where the command conditions are packed together in the data processor A-Register using well known programming methods. This packed word is then output to the $C_I$ register 260 with an EX-8 instruction generating the OW-8 gated clock from logic gates 252 to the clock input CK of the $C_I$ register 260. The contents of the A-Register are shifted into the $C_{I15}$ input to the $C_I$ register 260 as the $A_0Q$ signal on pin 80. The data processor packs a tape reader run/stop bit into the most significant bit position corresponding to the $C_{I15}Q$ bit shown on pin 78, where a logical one commands the tape reader 16 to run and a logical zero commands the tape reader 16 to stop. The data processor packs a tape reader forward/rewind bit in the next most significant bit position corresponding to the $C_{I14}Q$ bit shown on pin 75, where a logical one commands the tape reader 16 to run forward and a logical zero commands the tape reader 16 to rewind under control of the tape reader run/stop command $C_{I15}Q$ on pin 78. These tape reader controls are described in detail in the technical manual for the Remex tape reader previously referenced herein. Other discrete commands from the data processor are shown as signals $C_{I13}Q$-$C_{I6}Q$ on pins 75, 48, 31, 32, 29, 2, 5, 6 and 4 respectively and are used for controlling other system operations such as shown in FIG. 1 as machine auxiliary control signals 26 for direct control of various machine operations as described previously.

Figure 14A:
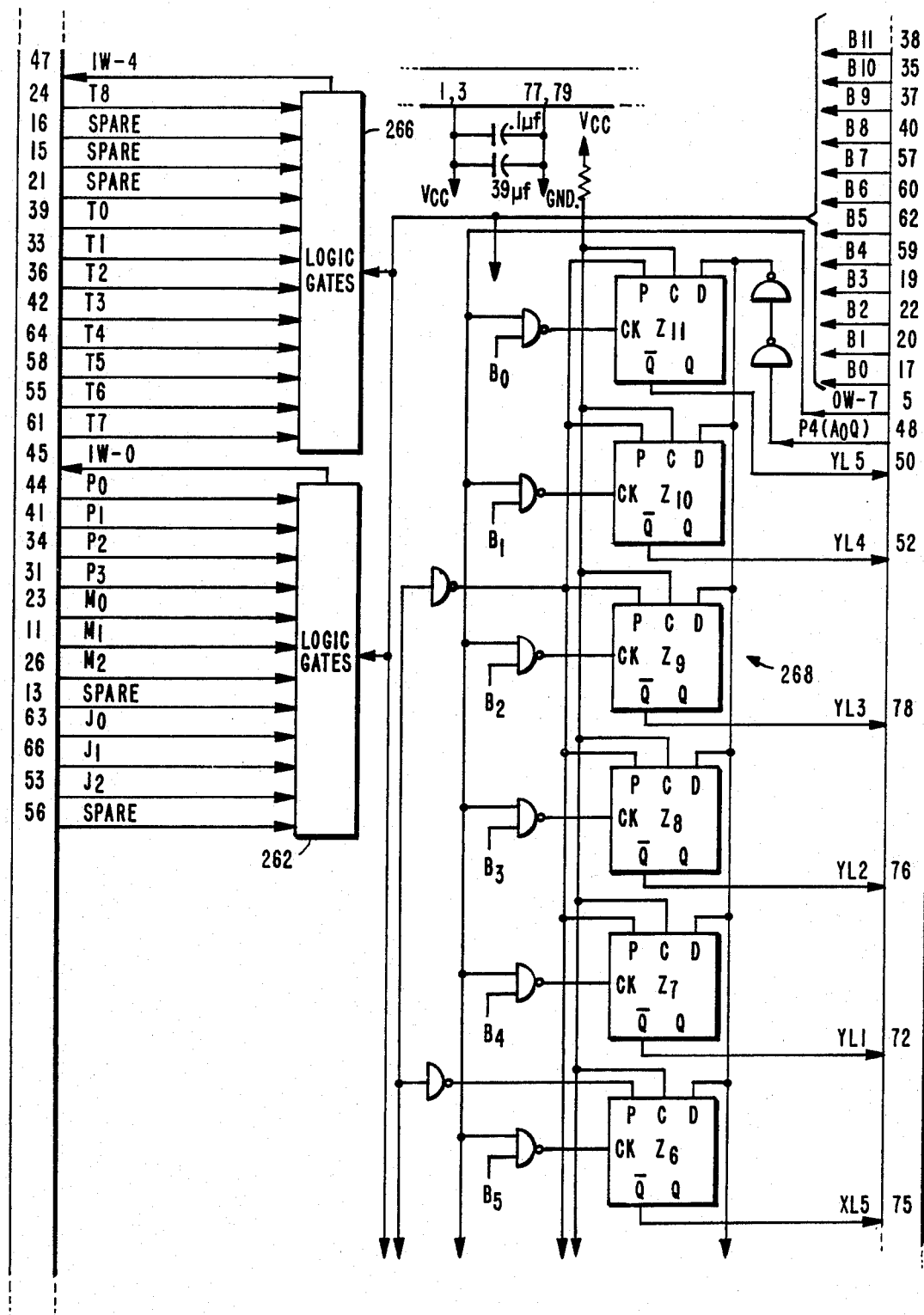
FIG. 14 is a schematic and block diagram representation of the IFA-2 circuit board and tape reader input arrangement comprising FIGS. 14A and 14B showing the IFA-2 circuit board arrangement, FIG. 14C showing a tape reader input arrangement, FIG. 14D showing tape reader waveforms, FIG. 14E showing a data processor program flow diagram for processing tape reader input signals, and FIG. 14F showing a logical mechanization for processing tape reader input signals.
Figure 14B:
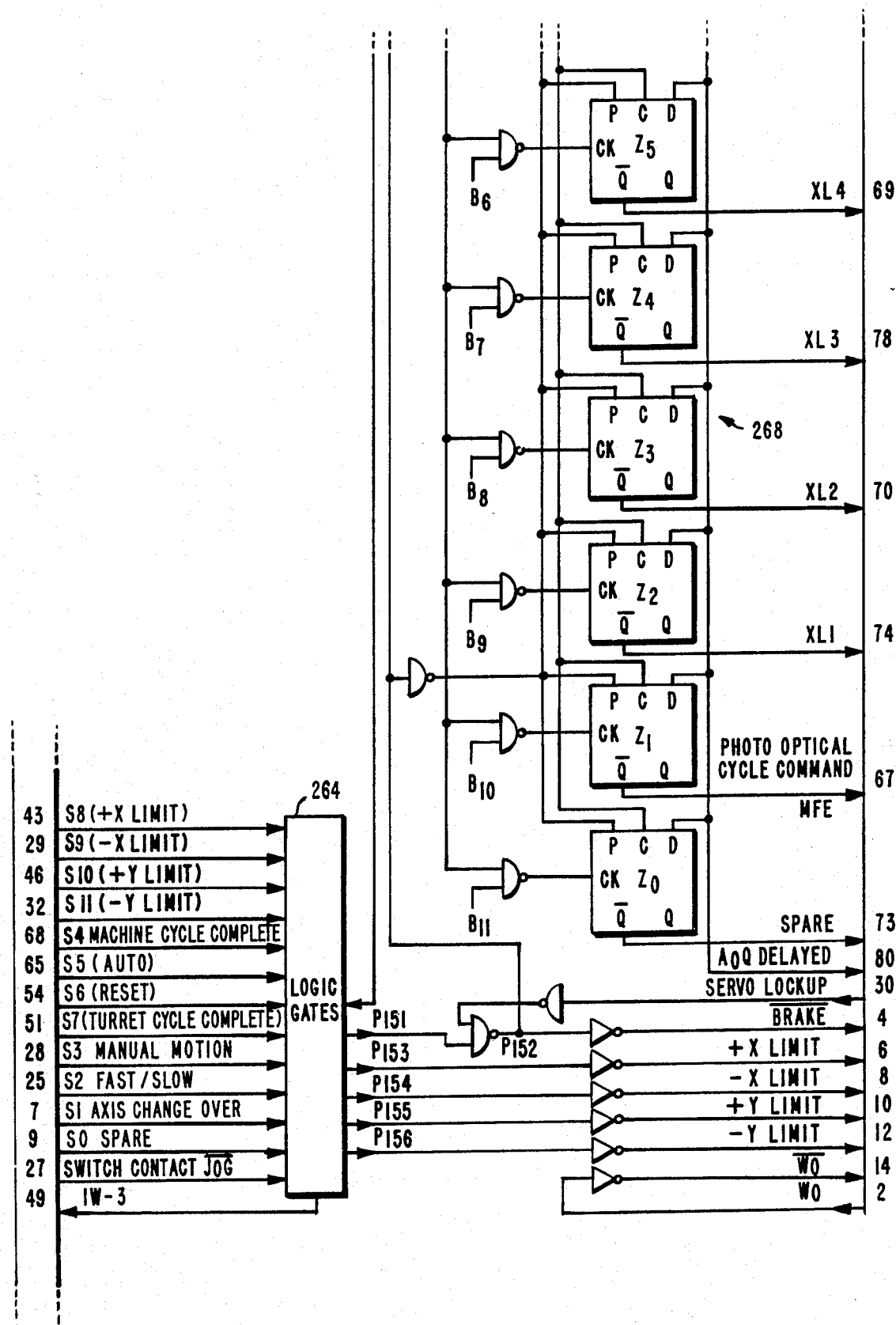
Figure 14C:
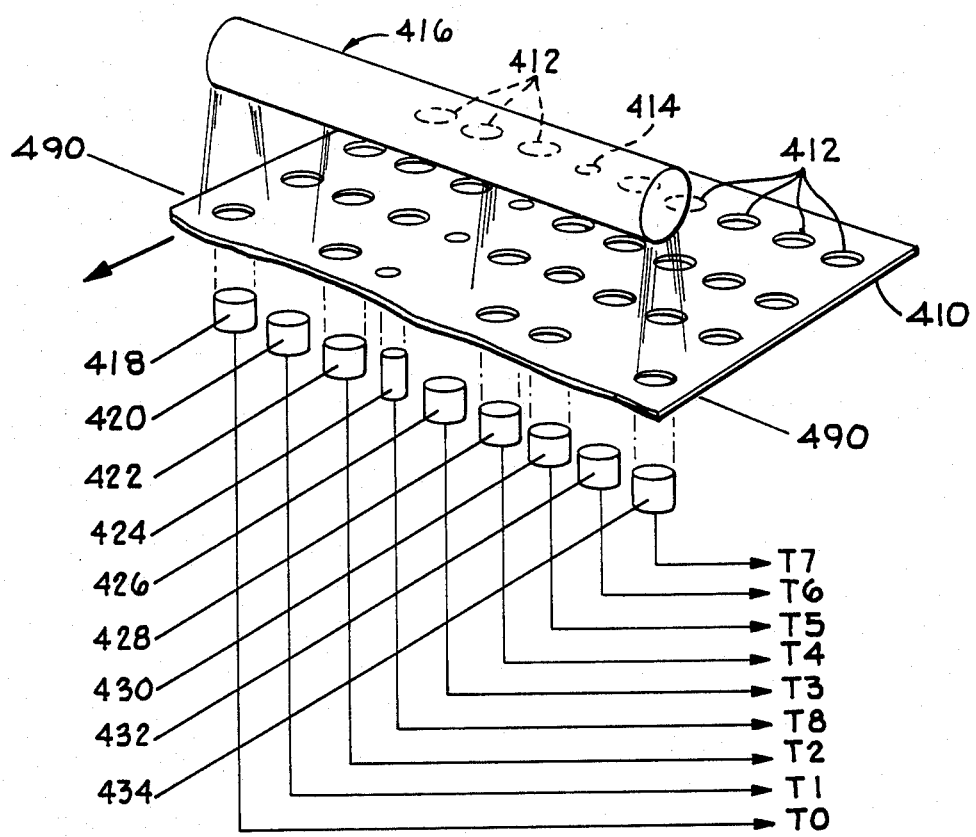
Figure 14F:
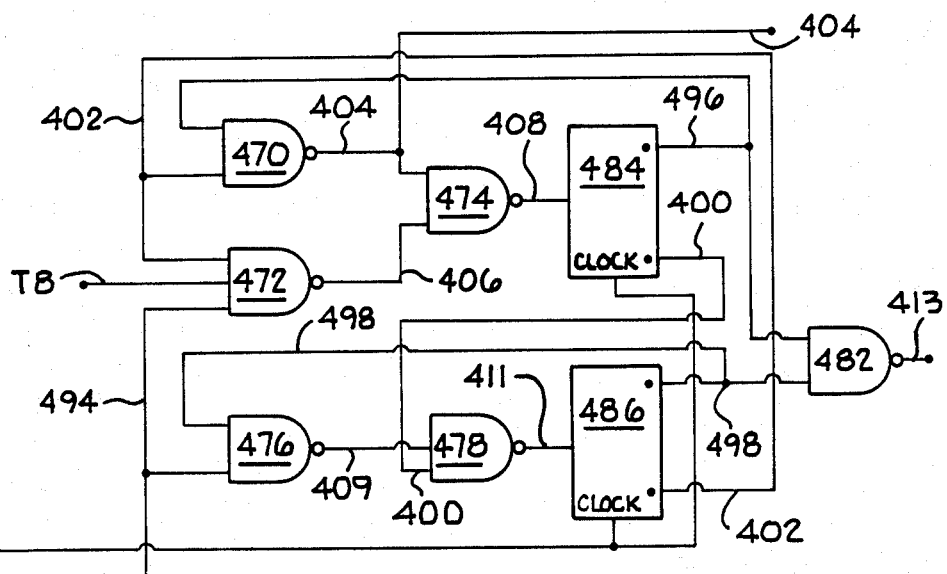
Figure 14F:
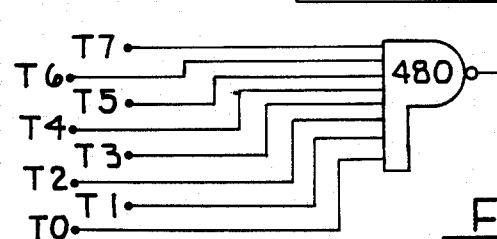
Figure 14D:
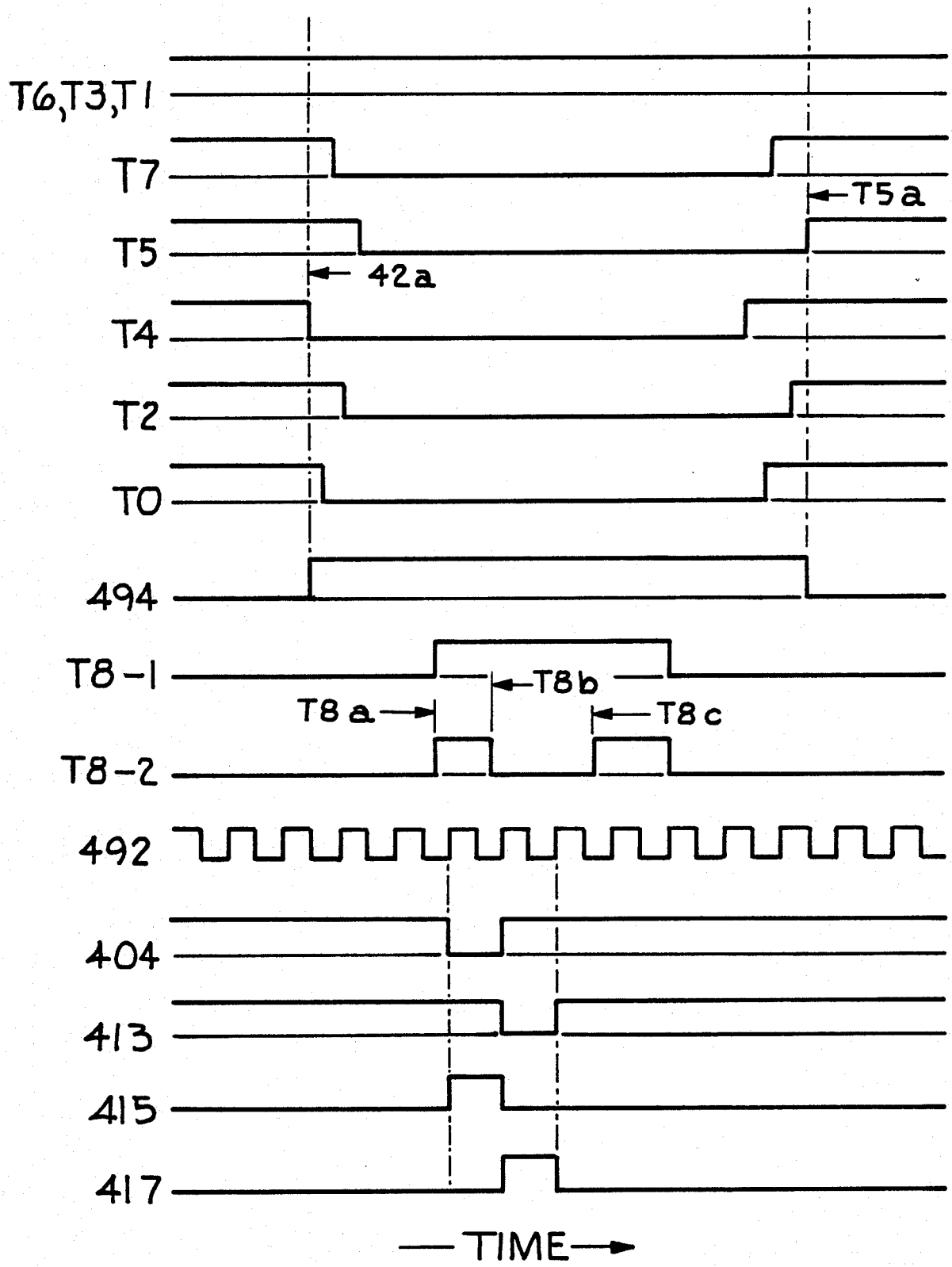
Figure 14E:
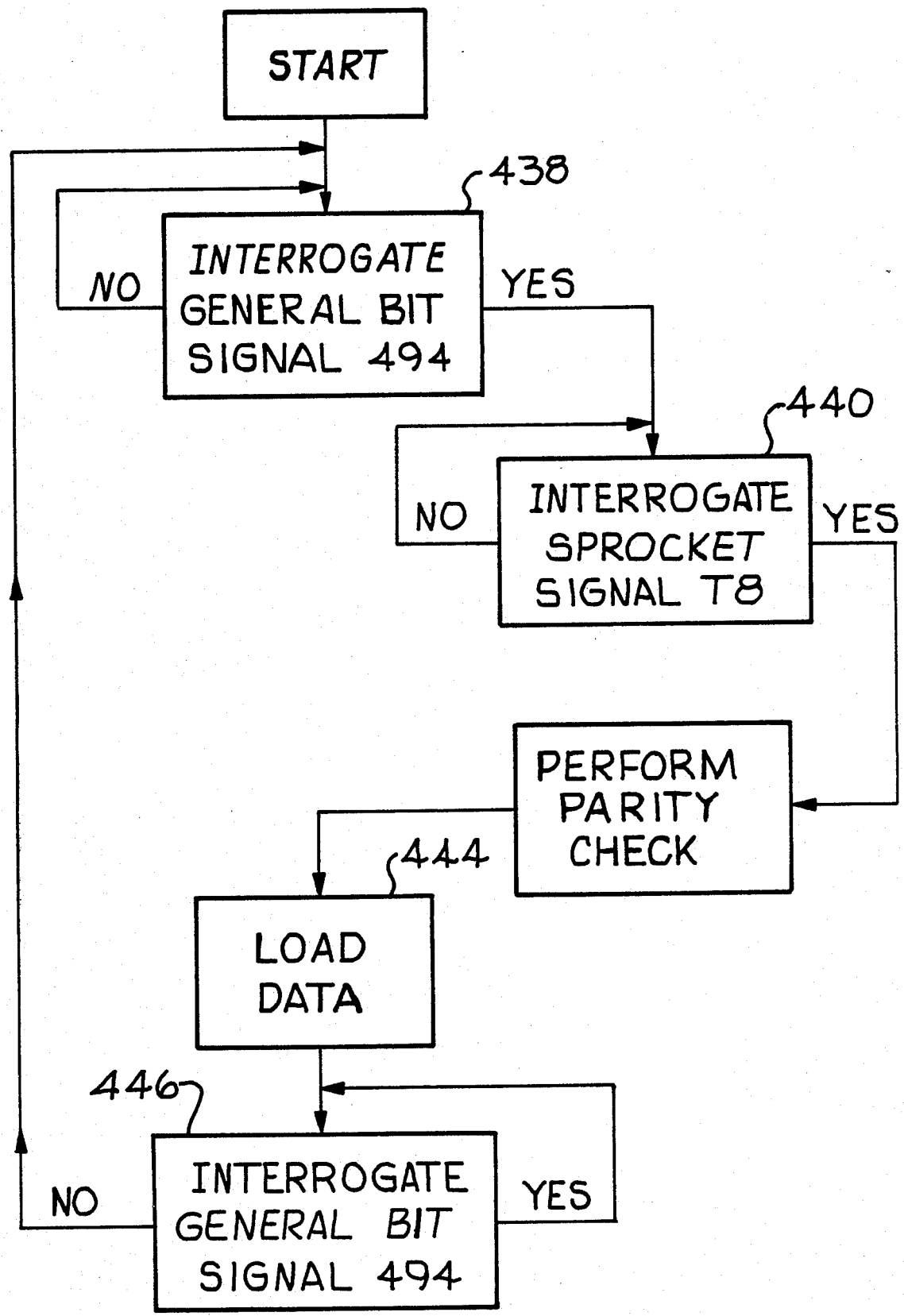
Figure 15A:
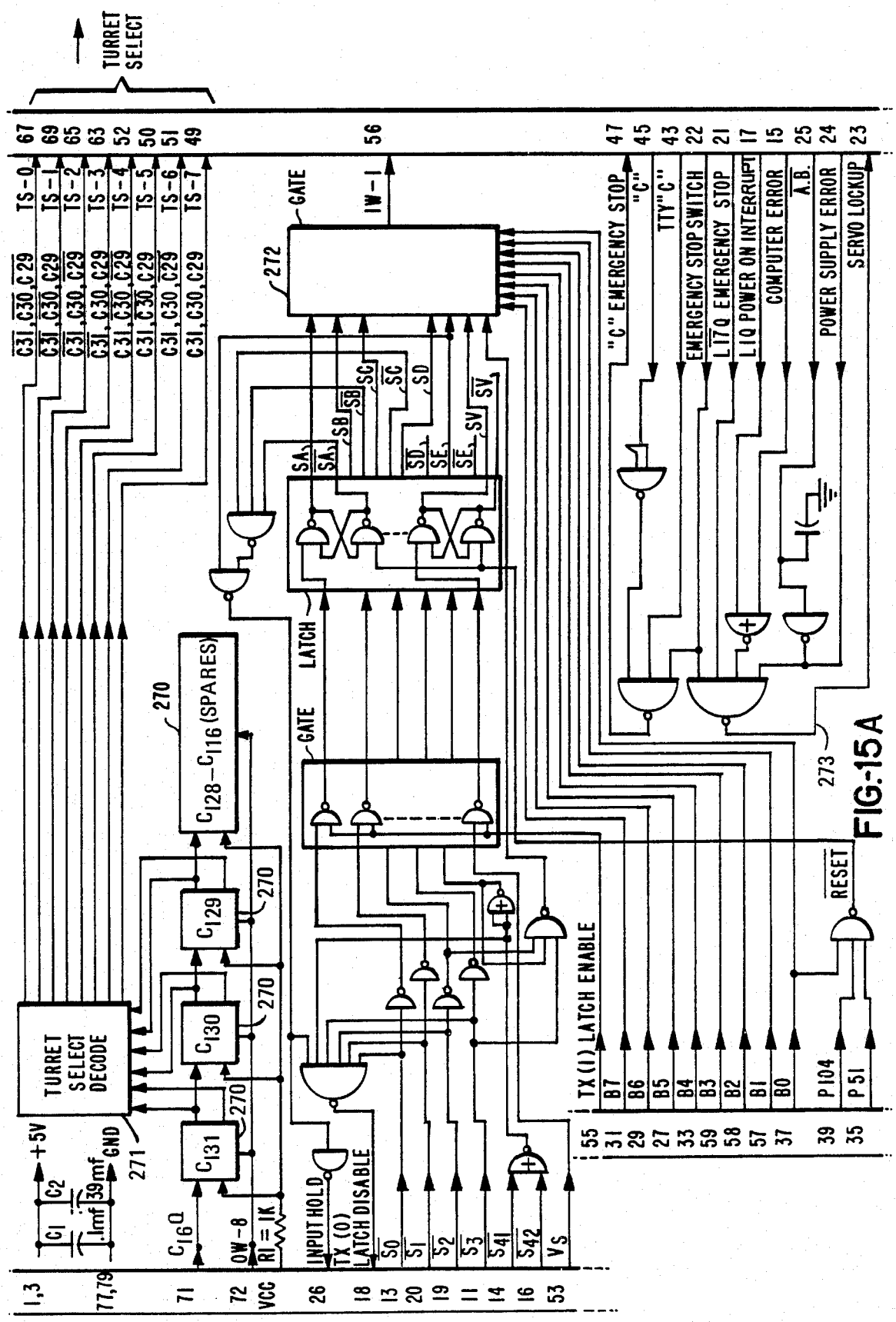
FIG. 15 is a schematic and block diagram representation of the IFA-3 circuit board comprising FIG. 15A showing the complete IFA-3 circuit board and FIG. 15B showing the control panel signal processing circuits on the IFA-3 circuit board.

As shown in FIGS. 14A and 14B, the IFA-2 printed circuit board provides for the scan-in of input words "zero", "three", and "four" to convert the parallel input lines to a serial input that can be processed with the input word multiplexer on the IFA-1 card. Logic gates 262 scan control panel selector switch signals into input word $-0$, logic gates 264 scan non-system adapted machine auxiliary control signals 26 (FIG. 1) into input word $-3$ and logic gates 266 scan rudimentary intrinsic tape reader input signals into input word $-4$.

These machine auxiliary control signals are scanned into the data processor A-Register with logic gates 264 as serial word IW-3 shown on pin 49 upon execution of an EX-3 instruction. Machine limit switch signals S8-S11 shown on pins 43, 29, 46, and 32 respectively are received for examination by the data processor to interlock motion. Machine Cycle Complete signal S4 shown on pin 68 is received for use by the data processor to determine if a machine command such as a discrete command has been executed to interlock machine operations. Turret Cycle Complete signal S7 shown on pin 51 is received by the data processor to determine if a turret command such as described herein has been executed to interlock machine operations. Operator control signals such as the Switch Contact Jog signal shown on pin 27 is received from machine mounted operator control devices and is used in parallel with operator control devices on the panel 14 such as Jog switches 41 and 52 (FIG. 2A) through interpretation by the data processor under program control as discussed previously for the switches mounted on the control panel 14 (FIG. 1). Other machine auxiliary control signals such as signals S5, S6, S3, S2, S1, and S0 shown on pins 65, 54, 28, 25, 7, and 9 respectively are examined by the data processor to determine machine conditions.

The Z-Register 268 includes flip-flops $Z_{11}$ through $Z_0$ and is a static register loaded with output word $-7$ to set system discrete conditions such as for machine control. It should be noted that this register does not have ambiguous outputs during the shift frame due to selective clocking of the flip-flops in this register. The Z-Register 268 contains a plurality of discrete commands shown as YL5-YL1, XL5-XL1, MFE and $\overline{Z_0Q}$ which are packed together in the data processor A-Register using well known programming methods. The packed word is then output to the Z-Register 268 with an EX-7 instruction generating the OW-7 gated clock shown on pin 5 from logic gates 252 (FIG. 13) to clock flip-flops $Z_{11}$-$Z_0$ as selected with bit time signals shown as $B_0$-$B_{11}$ respectively to the two-input NAND gates with outputs shown connected to the clock inputs CK of the Z-Register flip-flops. Discrete commands from the data processor are shown as signals YL5-YL1, XL5-XL1, MFE, and $\overline{Z_0Q}$ to pins 50, 52, 78, 76, 72, 75, 69, 78, 70, 74, 67, and 73 respectively and are used for controlling various system operations such as shown in FIG. 1 as machine auxiliary control signals 26 for direct control of various machine operations as described previously. For example, a Photo Optical Cycle Command signal MFE is shown on pin 67 to control a photo machine operation.

As shown in FIG. 15, the IFA-3 printed circuit board provides an extension 270 ($C_{I31}$ through $C_{I16}$) to the C-Register on IFA-1 (FIG. 13) and performs the auxiliary function of decoding some of the discrete conditions for machine turret select 271. The data processor packs a turret select code into the word output to the $C_I$-Register in positions corresponding to the $C_{I31}$, $C_{I30}$, and $C_{I29}$ stages of $C_I$-Register extension 270 to excite the Turret Select Decode for generating turret select signals TS-0 through TS-7. Turret change can be enabled with discrete command signals such as previously described. The data processor can monitor the Turret Cycle Complete signal S7 on pin 51 (FIG. 14B) to determine when the turret has been properly repositioned for interlocking system operations. Logic gates 272 provide the input gating, latching and logical functions associated with the momentary switch logic inputs from the control panel and multiplex them into input word $-1$. In addition, special gating for computer interrupts is provided and the servo lockup 273 is used to disable the machine drives when a detrimental condition is sensed.

The interface assembly (IFA-1, IFA-2 and IFA-3) is not an interface in the conventional sense but constitutes a distributed group of functions that are normally associated with the data processor or the various system entitles. The interface assembly also performs the function of signal distribution between the data processor and various system extremities.

Figure 16A:
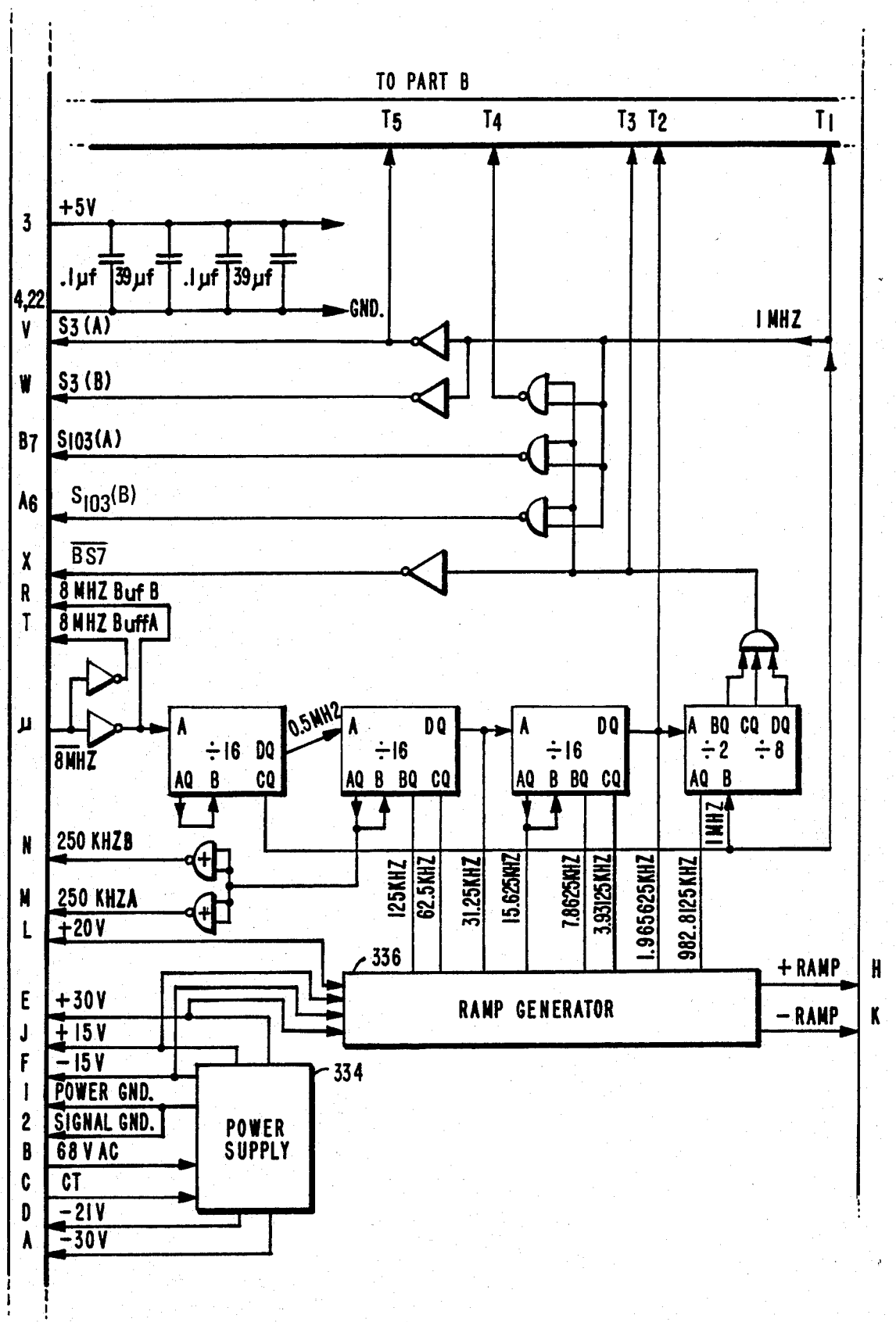
FIGS. 16A and 16B is a schematic and block diagram representation of the servo common board circuit board.
Figure 16B:
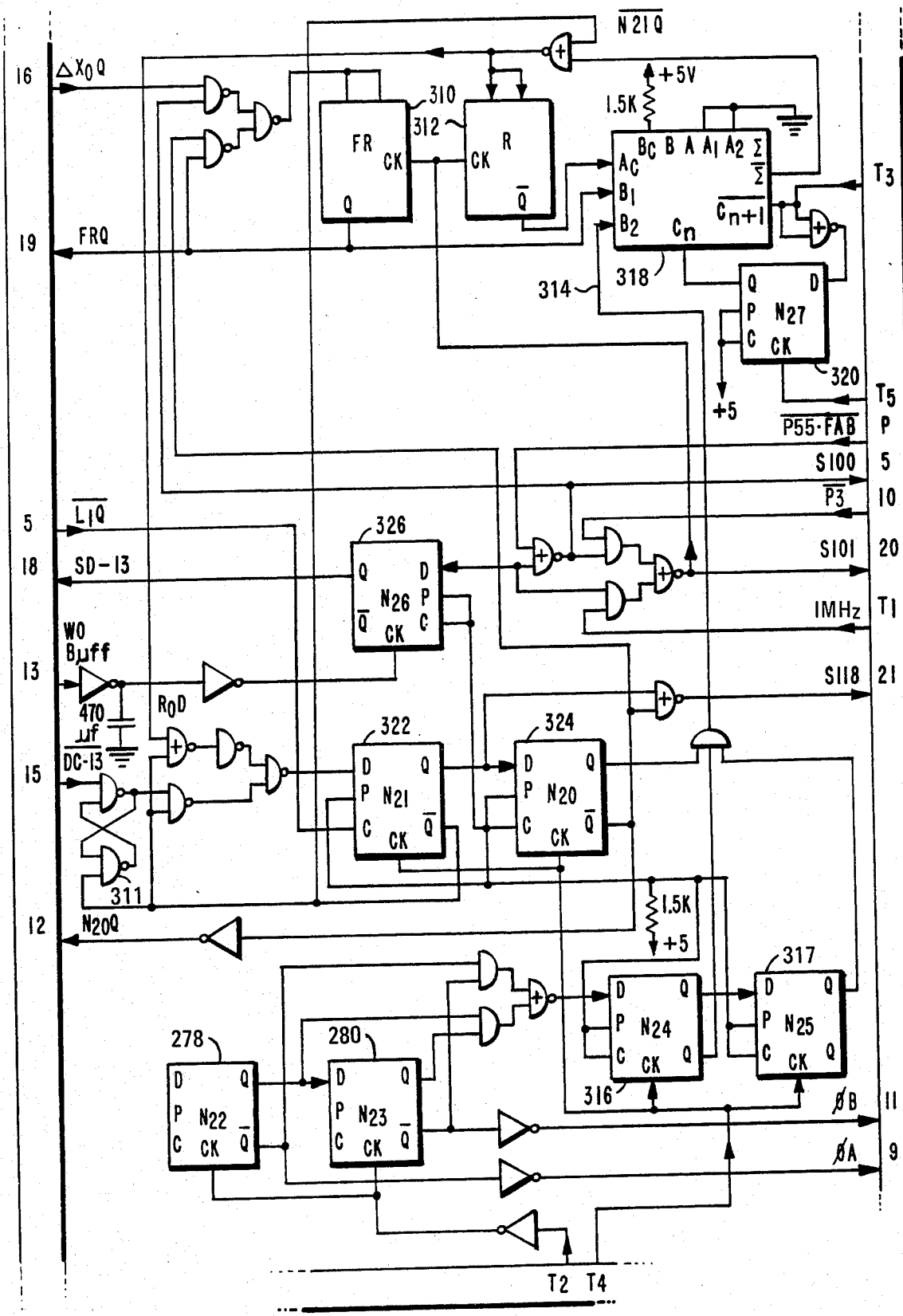
Figure 17A:
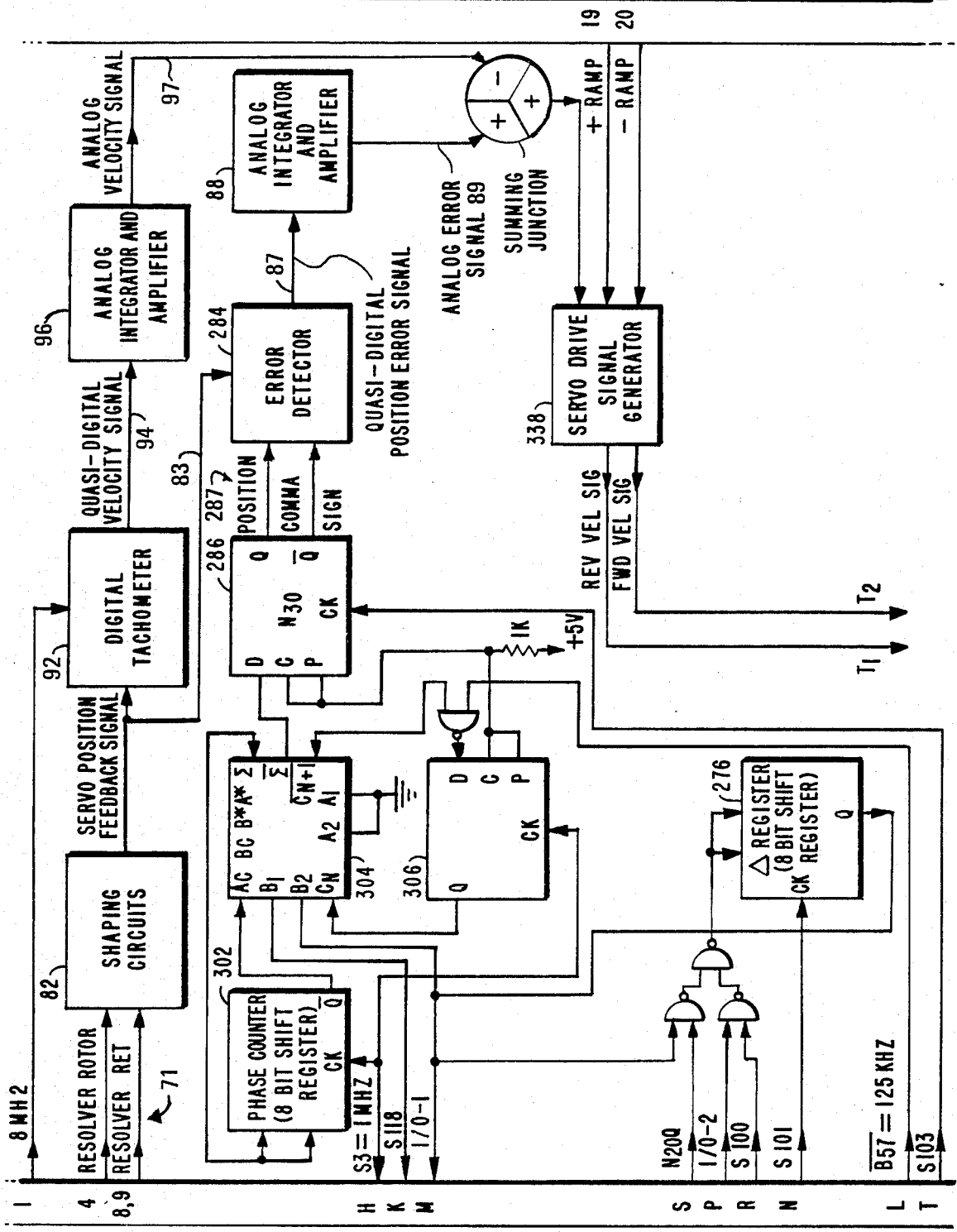
FIGS. 17A and 17B is a schematic and block diagram representation of the servo channel board circuit board.
Figure 17B:
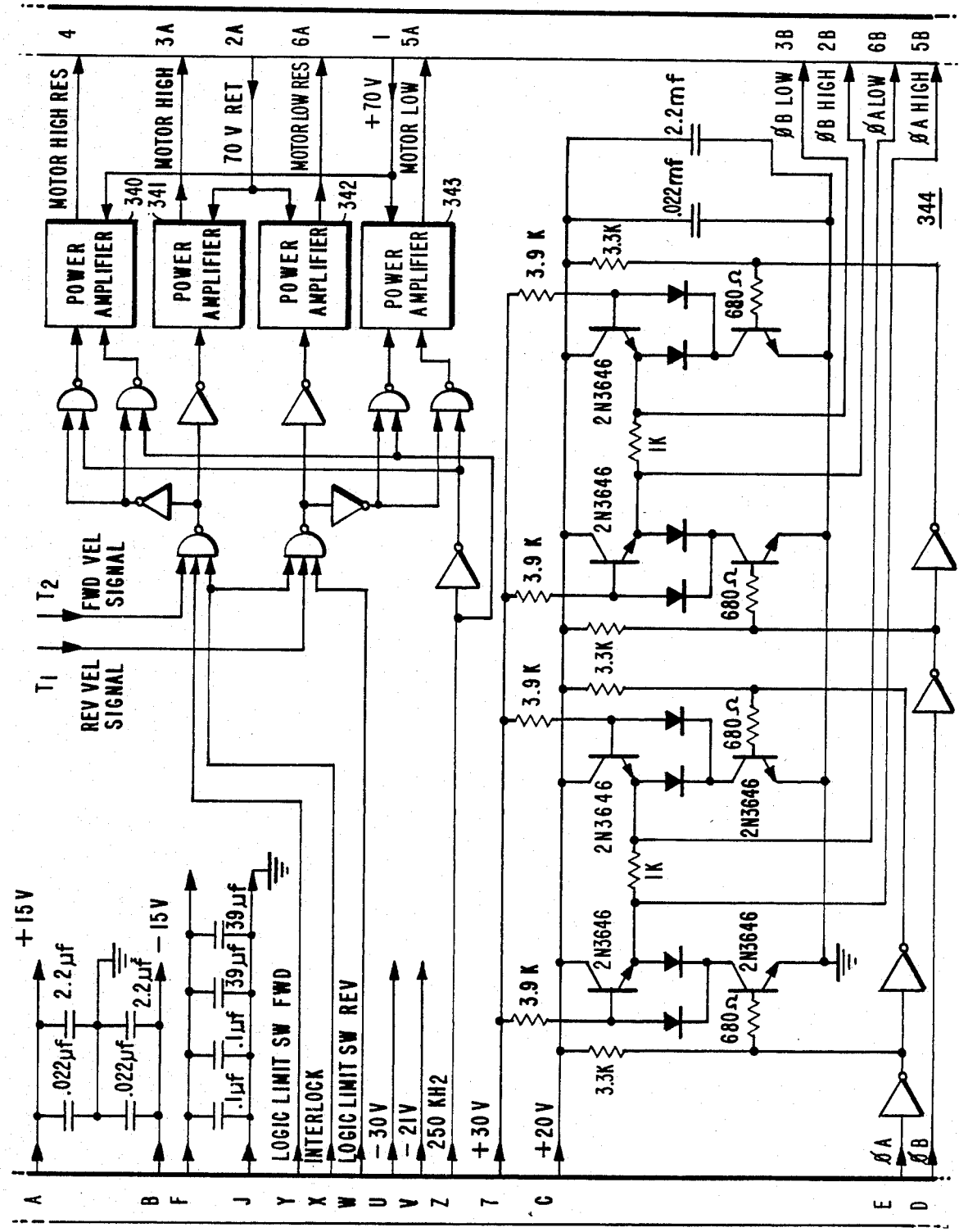

As shown in FIGS. 16A and 16B the servo common board provides control signals for servo operation and updating. The three servos 20, 21 and 22 (FIG. 1) are identical in this embodiment of the invention and exemplified by the X-axis servo 20 as shown in FIGS. 17A and 17B. The three servo channel boards, the servo common board and the A-Register are serially connected in a loop. Data passes from the A-Register and is input to a Δ-Register 276 (FIG. 17A) on the X-axis servo board via I/O channel-2. Data then passes from the X-axis channel board via I/O channel-1 to the I/O channel-2 of the Y-axis servo board (not shown). Similarly, data passes out of the Y-axis servo board into the Z-axis servo board (not shown) and out of the Z-axis servo board to the common board F-Register 312 and back to the A-Register. Thus, communication is provided between the data processor, the three servo channel boards and the servo common board.

Figure 18:
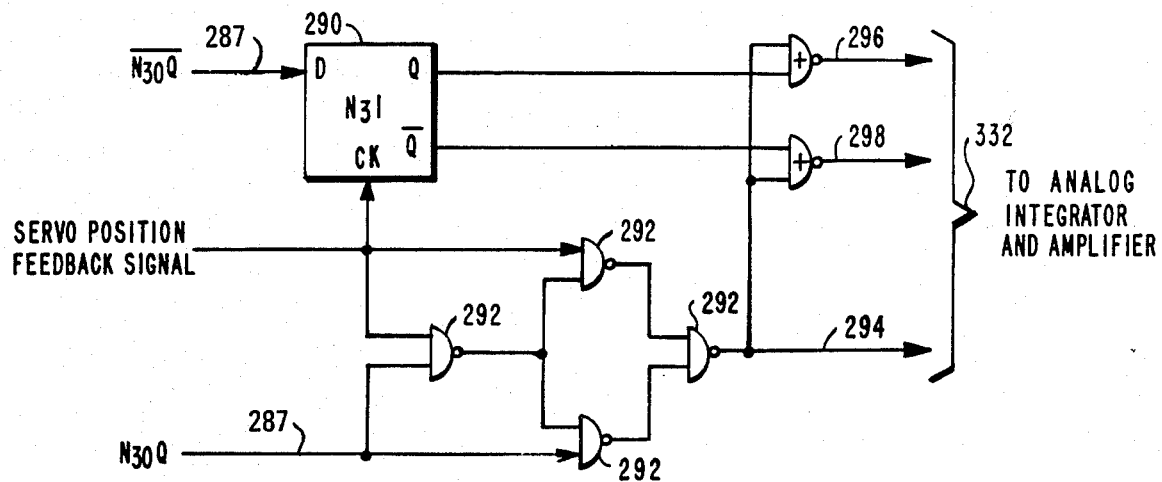
FIG. 18 is a schematic and block diagram representation of an error detector shown generally in FIG. 17A.

The servo drives generate control signals to position the servo motors in response to these commands transferred from the data processor. A resolver 78 (FIG. 3) is used to provide a closed servo feedback loop. Resolvers are exicted with digital square waves generated on the common board by a flip flop counter, $N_{22}$ 278 and $N_{23}$ 280. The resolver output signal is a square wave that is processed on the servo board with shaping circuits 82 and applied to an error detector 284 which also receives command signals from a flip-flop $N_{30}$ 286. A quasi-digital position error signal 87 from the error detector 284 is connected to an analog error signal by an analog integrator and amplifier 88. The command signal, which is a square wave, is generated by the phase counter 302, whichis continually incremented to form a square wave, where the phase of that square wave is changed by a number in the $\Delta$-Register 276 with a full adder 304 and carry flip-flop 306. The command signal 287 is a square wave with a phase that is advanced or retarded with a positive or negative $\Delta$ command number. The phase counter sign bit $N_{30}$ 286 provides a command square wave which is compared with the resolver feedback square wave 83 in the error detector 284 to generate an error signal. As shown in FIG. 18 this error signal has a polarity defined by the $N_{31}$ flip-flop 290 which defines whether the feedback signal leads or lags the command signal. NAND gates 292 provide an exclusive or function defining the out-of-phase condition of the feedback and command square waves with an output pulse 294 having a width that is proportional to the magnitude of the error. The error signal is actually a two wire ternary signal, wherein the line 296 or 298 that contains the pulse defines the polarity and the width of the pulse defines the magnitude.

The contour commands are provided to the servos 20, 21, and 22 by the data processor 12 under program control. They are generated successively in real time at an elemental device determined rate and consist of whole number delta commands for each of the servos to command intermediate path defining points along the contour, known to those skilled in the art as interpolation commands. These commands are provided in real time under data processor program control, wherein real time is herein intended to mean having a time characteristic associated with the time related response of the elemental extremity.

Figure 19:
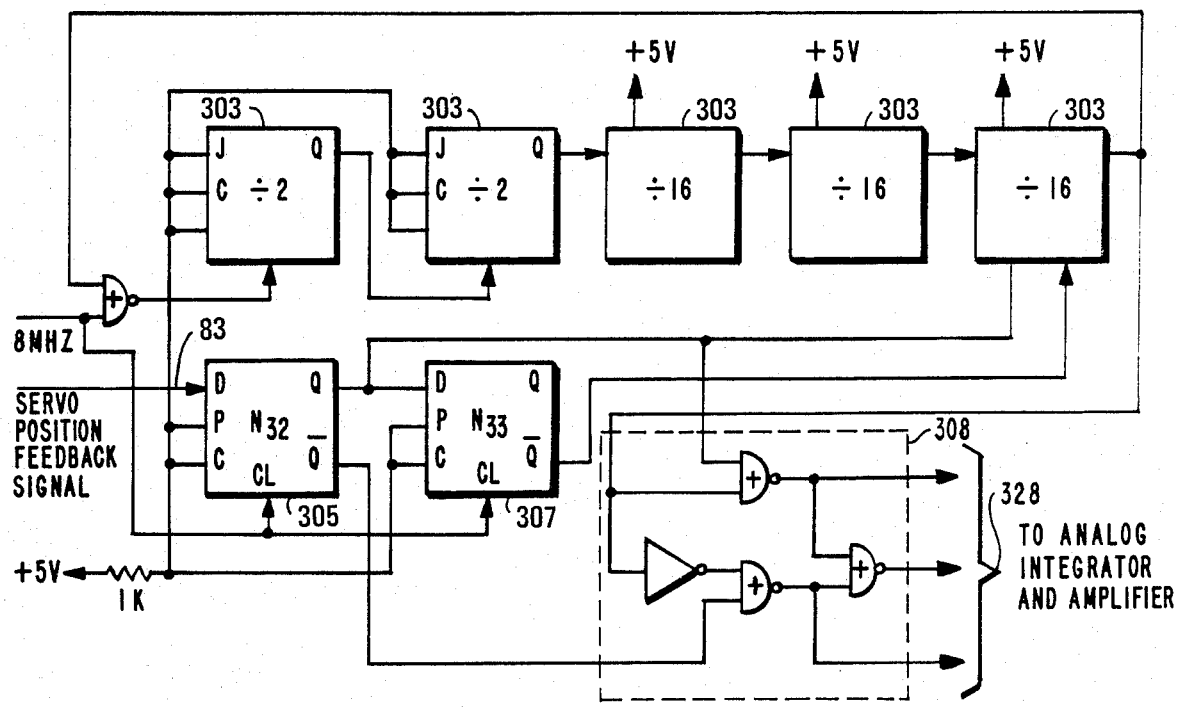
FIG. 19 is a schematic and block diagram representation of a digital tachometer shown generally in FIG. 17A.

As shown in FIG. 17 and more particularly in FIG. 19 the feedback signal is processed with a digital tachometer 92 which compares the input square wave 83 from the resolver 78 with a reference square wave generated in the tachometer 92. Flip flops $N_{32}$ 305 and $N_{33}$ 307 synchronize the reference square wave counter 303 with the feedback signal 83, while the output gates 308 detect the pulse width difference between the reference and feedback square waves as indicative of velocity. The polarity of this velocity is defined by whether the reference square wave is of a greater or lesser period than the feedback square wave.

The calculations for the commands which are loaded into the $\Delta$ register 276 (FIG. 17) are performed in the data processor under program control. This capability eliminates the need for the digital differential analyzer computational elements typically used for contouring. The relative magnitudes of the $\Delta$ parameters loaded into the plurality of channel card $\Delta$ registers define the relative position commands or, as a function of time, the relative velocity commands of the plurality of servo channels. As these commands are executed, the three servo axes are driven relative to each other to provide fully synchronized operation controlled through the computations in the data processor.

As shown in FIG. 16, the data processor also controls the speed at which the $\Delta$ parameters increment the phase counter. The data processor loads a number into the FR-Register 310, and this number is added to the R-Register 312 every half cycle, as controlled by the signal 314 from the excitation counter composed of flip-flops $N_{25}$ 317 and $N_{24}$ 316. When the R-Register 312 overflows, an update is commanded causing adder 318 and associated carry flip-flop $N_{27}$ 320 to add the contents of the $\Delta$-Register 276 to the phase counter 302 (FIG. 17) to execute the contour command. The mode control flip flops $N_{21}$ 322 and $N_{20}$ 324 are reset to request additional contour information from the data processor through the $N_{26}$ flip flop 326 and its SD 13 output signal. It should be noted that this SD-13 (hexadecimal) is the same as the previously described SD-11 (decimal), where hexadecimal and decimal numbers may in general be interchanged herein. After loading new contour commands, the data processor will generate the DC13 signal to initiate another contour step.

An alternate technique would replace the $N_{30}$ flip-flop 286 (FIG. 17) with a toggle flip flop which would be clocked by a data processor discrete output command at appropriate times thereby generating an output square wave with the timing of that discrete output command controlling the phase and thereby defining the whole number position command. This controlled square wave is an intrinsic signal form which is used directly by the servos in the error detector 284 (FIG. 17) as the command input. It is generated directly by the data processor with a precisely timed discrete output under program control as defined by the contouring computations.

The data processor can operate interactively in conjunction with the servo intrinsic signal forms where the square wave servo has parameters such as velocity 94, position 83, and position error 87 available in square wave form. The data processor can interrogate these square wave signals as discrete inputs with the skip on discrete instructions and derive the parameter from the pulse width or phase of the square waves.

As shown in FIG. 16 the common board further includes a power supply 334, a ramp generator 336 generating ramp functions used by a servo drive signal generator 338 (FIG. 17), and counters generating signals used by the ramp generator 336.

As shown in FIG. 17, the channel board further includes motor drive power amplifiers 340, 341, 342 and 343 as well as resolver excitation 344.

TABLE I

A-Register $A_{15}D = FAD \cdot [(K_2Q \cdot P50) + (K_3Q \cdot P51) + (K_4Q \cdot P52) + (K_5Q \cdot P53)] + (FAQ \cdot SPM_0Q) + (FAB \cdot P108) + (FAE \cdot K_1Q) + A_0Q \cdot FW \cdot SPM_0Q + A_0Q[FAC + FAF + W0 + (FD + FG) \cdot (B_3Q + B_2Q)] + (FT + FU + FX) (\Sigma A)$ $\overline{A_N \text{ Clock}} = \overline{P_3} \cdot [FAQ + FAB + FAE + FW + FAC + FAD + FAF + W0 + FT + FU + FX + (FD + FG) \cdot (B_3Q + B_2Q)]$ A-Adder $\Sigma A = [(P2 \cdot FB) + (FT + FU + FX) \cdot A_0Q + FC] \oplus [FU \oplus SPM_0Q] \oplus [K_7Q + FU \cdot B15]$ $\overline{A_C} = A_0Q \cdot P18 + FB \cdot P2$ $A^* = \overline{FC}$ $A_1 = A_2 = B_1 = B_2 = \text{Ground}$ $\overline{B_C} = P85 + FU$ $C_N = K_7Q + FU \cdot B15$
$C_{N+1}A = [(P2 \cdot FB) + (FT + FU + FX) \cdot A_0Q + FC] \cdot [FU \oplus SPM_0Q] + [(P2 \cdot FB) + (FT + FU + FX \cdot A_0Q + FC] \cdot [K_7Q + FU \cdot B15] + [FU \oplus SPM_0Q] \cdot [K_7Q +$

TABLE I-continued

FU·B15]

B Flip Flops $B_0T = B0[\overline{D_0Q} \cdot (C_3Q \cdot \overline{C_2Q} \cdot \overline{C_1Q} \cdot C_0Q \cdot K_{11}Q \cdot W0) + \overline{Y6} \cdot W1 \cdot \overline{C_3Q} \cdot C_2Q + FAB + FAC + FAD + FAH]$ $B_0 \text{ Clock} = \overline{P3\Delta}$ $B_1T = B_0Q + B0 \cdot [\overline{D_1Q} \cdot (C_3Q \cdot \overline{C_2Q} \cdot \overline{C_1Q} \cdot C_0Q \cdot K_{11}Q \cdot W0) + \overline{Y6} \cdot W1 \cdot W1 \, \overline{C_3Q} \cdot C_2Q + FAB + FAC + FAD + FAH]$ $B_1 \text{ Clock} = \overline{P3\Delta}$ $B_2T = B_0Q + B_1Q +$
$B0 \cdot [\overline{D_2Q} \cdot (C_3Q \cdot \overline{C_2Q} \cdot \overline{C_1Q} \cdot C_0Q \cdot K_{11}Q \cdot W0) + \overline{Y6} \cdot W1 \cdot \overline{C_3Q} \cdot C_2Q +$
$FAB + FAC + FAD + FAH + W3 \cdot \overline{Y11} +$
$C_2Q \cdot C_3Q \cdot W0 + K_2Q \cdot \overline{K_1Q} \cdot W0 + \overline{Y11} \cdot W0 + W6]$ $B_2 \text{ Clock} = \overline{P3\Delta}$ $B_3T = B_0Q + B_1Q + B_2Q +$
$B0 \cdot [\overline{D_3Q} \cdot (C_3Q \cdot \overline{C_2Q} \cdot \overline{C_1Q} \cdot C_0Q \cdot K_{11}Q \cdot W0) +$
$\overline{Y6} \cdot W1 \cdot \overline{C_3Q} \cdot C_2Q + FAB + FAC + FAD + FAH +$
$W1 + W4 + W5 + FE + FM]$ $B_3 \text{ Clock} = \overline{P3\Delta}$

C-Register $C_0D = I4$ $\overline{C_0 \text{ Clock}} = \overline{P3} \cdot B0 \cdot (FAM + FZ)$
$C_1D = I5$ $\overline{C_1 \text{ Clock}} = \overline{P3} \cdot B0 \cdot (FAM + FZ)$ $C_2D = \overline{I6} \cdot (FAM + FZ)$ $\overline{C_2 \text{ Clock}} = \overline{P3} \cdot B0 \cdot (FR + FS + FAI + FJ + FAM + FZ)$ $C_3D = I7$ $\overline{C_3 \text{ Clock}} = \overline{P3} \cdot B0 \cdot (FAM + FZ)$

D-Register $D_{11}D = P2 \cdot (FA + FC) + B11 \cdot FJ + B10 \cdot (FR + FS) + M_0Q \cdot FK + \Sigma A \cdot FB + (FD + FG)(B_3Q + B_2Q) \cdot A_0Q$ $\overline{D_N \text{ Clock}} = \overline{P3} \, [FJ + FK + FR + FS + FD + FG \cdot (B_3Q + B_2Q) + W0]$

M-Register $M_{11}D = P43 = B9 \cdot FAL + (FD + FY) \cdot SPM_0Q + D_0Q \cdot FR + FK \cdot K_7Q + (\Sigma M \cdot B10) \cdot (FAI + FAG \cdot P105 + (\Sigma M \cdot B11) \cdot [FAG \cdot P105 +$
$(\overline{B_3Q} + \overline{B_2Q}) \cdot W0 + FS + FO + FG + FJ]$ $\overline{M_N \text{ Clock}} = \overline{P42} = \overline{P3} \cdot [(B_3Q + B_2Q) \cdot (FAL + FY) + FK + FR + FD + FAI + FAG \cdot P105 +$
$(\overline{B_3Q} + \overline{B_2Q}) \cdot W0 + FS + FO + FG + FJ]$

M-Adder $\Sigma M = M_0Q \oplus K_8Q \oplus P44$
$A_1 = A_2 = B_1 = B_2 = \text{Ground}$
$C_N = K_8Q$ $C_{N+1}M = (M_0Q \cdot K_8Q) + (M_0Q \cdot P43) + (K_8Q \cdot P43)$ $\overline{A_C} = M_0Q$ $\overline{B_C} = P_{44}A$ $\overline{B^*} = P_{44}B$

W Flip Flops $W_0T = FR + FS + FJ + [FZ \cdot \overline{L_1Q} \cdot (\overline{\text{interrupt}} + K_1Q)]$ $W_0 \text{ Clock} = P3 \cdot B0$
$W_1T = W_0Q + FZ \cdot Y10$
$W_1 \text{ Clock} = P3 \cdot B0$
$W_2T = W_0Q \cdot W_1Q$
$W_2 \text{ Clock} = P3 \cdot B0$

Z-Register $Z_ND = A_0Q \text{ (Delayed)}$ $\overline{Z_N \text{ Clock}} = OW\text{-}7 \cdot Bi, \text{ where } i = 11 - N$

$C_{15-6}$-Register $C_{15}D = A_0Q \text{ (Delayed)}$
$C_N \text{ Clock} = OW\text{-}8 \text{ (Turret Select)}$

K-Register $K_0D = FB$ $\overline{K_0 \text{ Clock}} = \overline{P3} \cdot B14$ $K_1D = (FA + FB) \cdot C_3Q \cdot A_0Q + FV + \overline{Y10} \cdot FZ + FC \cdot \Sigma A$ $\overline{K_1 \text{ Clock}} = \overline{P3} \cdot B0 \cdot [FV + FL + W0 + W7 + (\overline{Y10} + C_3Q) \cdot FZ]$ $K_2D = FAD \cdot A_0Q + FC$ $\overline{K_2 \text{ Clock}} = \overline{P3} \cdot (FZ + FAD + W7 + FC)$ $K_3D = FAD \cdot K_2Q + FL + FV \cdot D_0Q$ $\overline{K_3 \text{ Clock}} = \overline{P3} \cdot [C_3Q \cdot FZ + FL \cdot B11 + B0 \cdot W0 + B0 \cdot W7 + FV + FAD]$
$K_4D = FL \cdot Y4 + D_1Q + FAD \cdot K_3Q$ $\overline{K_4 \text{ Clock}} = \overline{P3} \cdot [C_3Q \cdot FZ + FL \cdot B11 + B0 \cdot W0 + B0 \cdot W7 + FV + FAD]$
$K_5D = Y2 \cdot W0 + FV \cdot D_2Q + FAD \cdot K_4Q + FL \cdot K_5Q$ $\overline{K_5 \text{ Clock}} = \overline{P3} \cdot [C_3Q \cdot FZ + FL \cdot B11 + B0 \cdot W0 + B0 \cdot W7 + FV + FAD]$ $\overline{K_7D} = [C_{N+1}A \cdot \overline{B0} \cdot \overline{FK} \cdot \overline{FX} + FK \cdot D_0Q]$ $\overline{K_7 \text{ Clock}} = \overline{P3} \cdot [FK + FAQ + FAB + FAE + FW + FAC + FAF + FAD + FT + FU + FX + W0 + (FD + FG) \cdot (B_3Q + B_2Q)]$ $K_8D = C_{N+1}M \cdot \overline{B0}$ $\overline{K_8 \text{ Clock}} = \overline{P3} \cdot [(B_3Q + B_2Q) \cdot (FAL + FY) + FK + FR + FD + FAI + FAG \cdot P105 +$
$(\overline{B_3Q} + \overline{B_2Q}) \cdot W0 + FS + FO + FG + FJ]$ $K_{10}D = I2$ $\overline{K_{10} \text{ Clock}} = \overline{P3} \cdot B0 \cdot (FAM + FZ)$

TABLE I-continued $K_{11}D = I3$ $\overline{K_{11} \text{ Clock}} = \overline{P3} \cdot B0 \cdot (FAM + FZ)$

I Flip-Flops (FIG. 13)

$I_1T = V_{CC}$ $\overline{I_1 \text{ Clock}} = D0\text{-}8$ $I_2T = V_{CC}$ $\overline{I_2 \text{ Clock}} = D0\text{-}4$ $I_3T = V_{CC}$ $\overline{I_3 \text{ Clock}} = D0\text{-}5$ $I_4T = V_{CC}$ $\overline{I_4 \text{ Clock}} = D0\text{-}6$

L-Register $L_1D = 0$ $L_1P = \overline{L_2Q}$ (Power Supply Active Signal)

$L_1 \text{ Clock} = \overline{P106} = \text{Discrete Output 2}$ $L_2D = P87$
$L_2 \text{ Clock} = W0$

A Overflow Flip-Flop ($OF_j$)

$OF_j)D = (\overline{A_0Q \cdot P18}) \cdot (\overline{FB \cdot P2}) \cdot (\overline{P85 \oplus FU}) \cdot$
$K_7Q + A_0Q \cdot P18 + FB \cdot P2 \cdot (P85 \oplus FU) \cdot \overline{K_7Q}$ $\overline{OF_j \text{ Clock}} = (FT + FU) \cdot \overline{P3}$

Lamp Display Register ($L_3$-$L_{15}$)

$L_{15}D = A_0Q$
$L_N \text{ Clock} = OW\text{-}11$

Numeric Display Register ($N_0$-$N_{15}$)

$N_{15}D = A_0Q$
$N_N \text{ Clock} = OW\text{-}9$

TABLE II

P Terms $P0 = \Sigma A$
$P1 = \Sigma M$
$P2 = [I0 \cdot B7 + I1 \cdot B6 + I2 \cdot B5 + I3 \cdot B4 + I4 \cdot B3 + I5 \cdot B2 + I6 \cdot B1 + I7 \cdot B0 \cdot$
$[FN + FQ] + (B13 \cdot I2) \cdot (\overline{C3Q} + C_2Q + C_1Q + \overline{C_0Q}) + I1 \cdot B14 +$
$I0 \cdot B15 + I4 \cdot B11 \cdot C_3Q \cdot C_2Q + (I3 \cdot B12) \cdot$
$[\overline{(C_3Q + \overline{C_0Q})} + (C_3Q \cdot \overline{C_2Q} \cdot \overline{C_1Q} \cdot C_0Q)]$ $P3 = \overline{P109 \cdot B_4Q} + \overline{(B_5Q \cdot B15 + 8mc \cdot \overline{B15}) \cdot B_4Q} = \text{Master Clock}$ $P3\Delta = P3 \text{ delayed clock}$
$P4 = A_0Q$ $P7 = (\overline{C_1Q} \ \overline{C_0Q} + K_{11}Q)K_{10}Q \ \overline{K_0Q} \ D_1Q \ D_2Q$ $P11 = \overline{C_3Q} \cdot C_2Q$ $P12 = C_0Q \cdot \overline{C_1Q} \cdot \overline{C_2Q} \cdot C_3Q$ $P14 = C_3Q \cdot \overline{C_2Q} \cdot \overline{C_1Q} \cdot C_0Q \cdot K_{11}Q \cdot W0$ $P15 = C_2Q \cdot C_3Q$

TABLE II-continued $P16 = Y38 \cdot C_0Q \rightarrow FT + FU$
$P17 = FW + FX + FU + FT + FAC + FAQ$
$P18 = FT + FU + FX$
$P21 = B_2Q + B_3Q$ $P22 = \overline{B_2Q} + \overline{B_3Q}$ $P24 = B0 \cdot \overline{P3} = B0(\overline{\text{Early Clock}})$ $P25 = \overline{K_1Q} \cdot K_2Q$ $P26 = K_4Q + K_5Q$ $P27 = \overline{Y11} \cdot \overline{K_5Q} \cdot \overline{K_1Q}$ $\overline{P28} = FAD \cdot (K_2Q \cdot P50 + K_3Q \cdot P51 + K_4Q \cdot P52 + K_5Q \cdot P53) + FAQ \cdot P85$
$P29 = FA + FC$
$P30 = FC + FB$
$P31 = FA + FB$ $P33 = W3 \cdot \overline{Y11} + (C_2Q \cdot C_3Q + \overline{K_1Q} \cdot K_2Q + \overline{Y11})W0 + W6$ $P35 = W0 + W7$
$P36 = W2 + W5$
$P37 = FD + FG$ $P38 = W1 + W4 + W5 + W2 \cdot \overline{Y11}$ $P39 = FAM + FZ$
$P40 = (FR + FS + FAI + FJ) + (FAM + FZ)$
$P41 = FR + FS$ $P42 = \overline{P3} \cdot [(B_3Q + B_2Q) \cdot (FAL + FY) + FK + FR + FD + FAI +$
$FAG \cdot P105 + (\overline{B_3Q} + \overline{B_2Q}) \cdot W0 + FS + F0 + FG + FJ]$ $P44 = P44A + P44B = B10 \cdot (FAI + FAG \cdot P105) + B11 \cdot$
$(FAG \cdot P105 + \overline{B_2Q} \cdot W0 + \overline{B_3Q} \cdot W0 + FS + F0 + FG + FJ)$ $P44A = (FAI + FAG \cdot P105)B10$ $P44B = (FAG \cdot P105 + (\overline{B_2Q} + \overline{B_3Q})W0 + FS + F0 + FG + FJ)B11$ $P47 = W1 \cdot SPM_0Q \cdot \overline{FY} \cdot \overline{C_3Q} \cdot C_2Q + P2 \cdot$
$(FN + FO) + [FD + (B_3Q + B_2Q) \cdot$
$(FAL + FY)(B_3Q + B_2Q)]M_0Q + P88$
$P48 = FAL + FY + FN + FQ + B_2Q \cdot FE + FW + FX + FU +$
$FT + \underline{FAC} + FC + FB + FD + FAQ$
$P50 = P133 \cdot \underline{A} \cdot \underline{B} \cdot C$
$P51 = P133 \cdot \underline{A} \cdot B \cdot \underline{C}$
$P52 = P133 \cdot \underline{A} \cdot \underline{B} \cdot C$
$P53 = P133 \cdot A \cdot \underline{B} \cdot \underline{C}$
$P54 = P133 \cdot A \cdot \underline{B} \cdot \underline{C}$
$P55 = P133 \cdot A \cdot B \cdot \underline{C}$
$P56 = P133 \cdot A \cdot B \cdot C$
$P57 = P133 \cdot \underline{A} \cdot B \cdot \underline{C}$
$P58 = P134 \cdot \underline{A} \cdot \underline{B} \cdot C$
$P59 = P134 \cdot \underline{A} \cdot B \cdot \underline{C}$
$P60 = P134 \cdot \underline{A} \cdot \underline{B} \cdot C$
$P61 = P134 \cdot A \cdot \underline{B} \cdot \underline{C}$
$P62 = P134 \cdot A \cdot B \cdot C$
$P63 = P134 \cdot A \cdot B \cdot \underline{C}$
$P64 = P134 \cdot A \cdot B \cdot C$
$P65 = P134 \cdot A \cdot B \cdot C$ $A = FAL + W0 \cdot K_3Q + Y11 \cdot \overline{FY} \cdot W1 \cdot D_0Q$ TABLE II-continued $B = W0 \cdot K_4Q + Y11 \cdot \overline{FY} \cdot W1 \cdot D_1Q + FY + \overline{Y11 \cdot W0}$ $C = W0 \cdot K_5Q + Y11 \cdot \overline{FY} \cdot W1 \cdot D_2Q$ P85 = SPM$_0$Q (all registers)
P87 = External interrupt
P88 = FAQ·SPM$_0$Q+FB·SPM$_0$Q+FC·ΣA+FAC·A$_0$Q
P89 = External interrupt
P90 = (FR+FS)+(FD+FG)

$P91 = Y6 \cdot W1 \cdot \overline{C_3Q} \cdot C_2Q + FAB + FAC + FAD + FAH$

P92 = B7·B$_4$Q·(P36+P91) = Cycle initiate command
P93 = B3·B$_4$Q·(P36+P91) = Restore command $\overline{P97} = (FAL+FY)(B_3Q+B_2Q)$

P98 = FAL+FY $P99 = \overline{\Sigma A \cdot FB}$ $P101 = \overline{B11 \cdot I4 \cdot C_2Q \cdot C_3Q}$ $P102 = \overline{(\overline{C_0Q} + \overline{C_3Q}) + (C_0Q \cdot \overline{C_1Q} \cdot \overline{C_2Q} \cdot C_3Q)}$ $P103 = \overline{(K_5Q \cdot \overline{Y11})(M_9Q + \overline{M_{10}Q} + \overline{M_{11}Q})}$ = RW Mode $P104 = \overline{P3} \cdot FAB$ P105 = P50·DI−0+P51·DI−1+P52·DI−2+P53·DI−3+
P54·DI−4+P55·DI−5+P56·DI−6+P57·DI−7+
P58·DI−8+P59·DI−9+P60·DI−10+P61·DI−11
(Discrete Input DI−n To Data Processor)
P106 = FAH·P51 = DO-2 (Resets L$_1$ flip flop during power turn-on)
P108 = IW−0·P50+IW−1·P51+IW−2·P52+IW−3·P53+
IW−4·P54+IW−5·P55+IW−6·P56+IW−7·P57

$P109 = B_5Q \cdot B15 + 8mc \cdot \overline{B15}$ $P110 = \overline{M_9Q + \overline{M_{10}Q} + \overline{M_{11}Q}}$ $P111 = \overline{I6} \cdot P59 = \overline{I6}(FAM+FZ)$ $P112 = (FR+FS+FAI+FJ+FAM+FZ)B0 \cdot \overline{P3}$ $P113 = (FAM+FZ)B0 \cdot \overline{P3}$ $\overline{P114} = FAI + FAG \cdot P105 + (\overline{B_3Q} + \overline{B_2Q}) \cdot W0 + FS + FO + FG + FJ$

P115 = FAQ+FAB $P116 = (\overline{FAB + FAG + FAH})I_1Q$

P120 = SPM$_0$Q (4 registers)
P121 = SPM$_0$Q (4 registers)

$\overline{P133} = Y11 \cdot \overline{FY} \cdot W1 \cdot \overline{D_4Q} \cdot \overline{D_3Q}$ $\overline{P134} = Y11 \cdot \overline{FY} \cdot W1 \cdot \overline{D_4Q} \cdot D_3Q$ $\overline{P135} = Y11 \cdot \overline{FY} \cdot W1 \cdot D_4Q \cdot \overline{D_3Q}$ $\overline{P136} = Y11 \cdot \overline{FY} \cdot W1 \cdot D_4Q \cdot D_3Q$ $\overline{P151} = \overline{JOG} \cdot (\overline{S8} + \overline{S9} + \overline{S10} + \overline{S11})$ P152 = Servo Lockup + $\overline{JOG} \cdot (\overline{S8} + \overline{S9} + \overline{S10} + \overline{S11})$ $P153 = \overline{S8}$ $P154 = \overline{S9}$ $P155 = \overline{S10}$ $P156 = \overline{S11}$ $P158 = \overline{\overline{Y11} \cdot K_5Q \cdot W2}$

P511 = FN+FQ

Memory Output Lines

I$_7$ - Most Significant Bit
I$_6$ - Second Significant Bit
I$_5$ - Third Significant Bit
I$_4$ - Fourth Significant Bit
I$_3$ - Fifth Significant Bit
I$_2$ - Sixth Significant Bit
I$_1$ - Seventh Significant Bit
I$_0$ - Least Significant Bit

Y Terms $Y1 = (\overline{C_1Q \cdot C_0Q} + K_{11}Q)K_{10}Q \cdot \overline{K_0Q} \cdot D_1Q \cdot D_0Q + Y6 + K_1Q \cdot K_2Q$ $Y2 = \overline{Y11} \cdot \overline{K_{11}Q} \cdot K_{10}Q \cdot C_1Q \cdot \overline{C_0Q} \cdot \overline{D_1Q} \cdot D_0Q$ $Y3 = \overline{C_3Q} \cdot \overline{C_2Q} \cdot C_1Q \cdot \overline{C_0Q} \cdot \overline{K_{11}Q} \cdot K_{10}Q \cdot I1 \cdot \overline{I0}$ $Y4 = K_1Q \cdot K_2Q + Y6$ $Y5 = Y3 + K_2Q$ $Y6 = C_1Q \cdot \overline{C_0Q} \cdot \overline{K_{11}Q} \cdot D_0Q$ $Y7 = \overline{L_3Q} + K_1Q$ $Y10 = (P89+Y7)\overline{L_1Q}$ $Y11 = C_2Q + C_3Q$ $Y38 = \overline{Y6} \cdot W1 \cdot \overline{C_3Q} \cdot C_2Q$ $Y39 = C_3Q \cdot \overline{C_2Q} \cdot W1$

Terms $B0 = \overline{B_3Q} \cdot \overline{B_2Q} \cdot \overline{B_1Q} \cdot \overline{B_0Q}$ $B1 = \overline{B_3Q} \cdot \overline{B_2Q} \cdot \overline{B_1Q} \cdot B_0Q$ $B2 = \overline{B_3Q} \cdot \overline{B_2Q} \cdot B_1Q \cdot \overline{B_0Q}$ $B3 = \overline{B_3Q} \cdot \overline{B_2Q} \cdot B_1Q \cdot B_0Q$ $B4 = \overline{B_3Q} \cdot B_2Q \cdot \overline{B_1Q} \cdot \overline{B_0Q}$ $B5 = \overline{B_3Q} \cdot B_2Q \cdot \overline{B_1Q} \cdot B_0Q$ $B6 = \overline{B_3Q} \cdot B_2Q \cdot B_1Q \cdot \overline{B_0Q}$

TABLE II-continued $B7 = \overline{B_3Q} \cdot B_2Q \cdot B_1Q \cdot B_0Q$ $B8 = B_3Q \cdot \overline{B_2Q} \cdot \overline{B_1Q} \cdot \overline{B_0Q}$ $B9 = B_3Q \cdot \overline{B_2Q} \cdot \overline{B_1Q} \cdot B_0Q$ $B10 = B_3Q \cdot \overline{B_2Q} \cdot B_1Q \cdot \overline{B_0Q}$ $B11 = B_3Q \cdot \overline{B_2Q} \cdot B_1Q \cdot B_0Q$ $B12 = B_3Q \cdot B_2Q \cdot \overline{B_1Q} \cdot \overline{B_0Q}$ $B13 = B_3Q \cdot B_2Q \cdot \overline{B_1Q} \cdot B_0Q$ $B14 = B_3Q \cdot B_2Q \cdot B_1Q \cdot \overline{B_0Q}$ $B15 = B_3Q \cdot B_2Q \cdot B_1Q \cdot B_0Q$

W Terms $W0 = \overline{W_2Q} \cdot \overline{W_1Q} \cdot \overline{W_0Q}$ $W1 = \overline{W_2Q} \cdot \overline{W_1Q} \cdot W_0Q$ $W2 = \overline{W_2Q} \cdot W_1Q \cdot \overline{W_0Q}$ $W3 = \overline{W_2Q} \cdot W_1Q \cdot W_0Q$ $W4 = W_2Q \cdot \overline{W_1Q} \cdot \overline{W_0Q}$ $W5 = W_2Q \cdot \overline{W_1Q} \cdot W_0Q$ $W6 = W_2Q \cdot W_1Q \cdot \overline{W_0Q}$ $W7 = W_2Q \cdot W_1Q \cdot W_0Q$

Input Words

IW-0 = B11·P3+B10·P2+B9·P1+B8·P0+B7·Spare+ B6·J2+B5·J1+B4·J0+B3·M2+B2·M1+B1·M0+ B0·Spare (Selector Switch Scanout and Input Channel-0)

IW-1 = B7·SA+B6·SB+B5·SC+B4·SD+B3·SE+B2·Spare+ B1·SV+B0·$\overline{SJ}$ (Momentary Switch Scanout and Input Channel-1)

IW-2 = Spare

IW-3 = B11·S11+B10·S10+B9+S9+B8·S8+B7·S7+ B6·S6+B5·S5+B4·S4+B3·S3+B2·S2+B1·S1+B0· Spare (Auxiliary Control Signals)

IW-4 = B11·T0+B10·T1+B9·T2+B8·T3+B7·T4+ B6·T5+B5·T6+B4·T7+B3·Spare+B2·Spare+B1· Spare+B0·T8 (Elemental Tape Reader Inputs)

IW-5 = NRR$_0$Q (Numeric Display Register)

IW-6 = Spare

IW-7 = Spare

Output Words

OW-3 = $\overline{P53 \cdot P104}$

OW-4 = $\overline{P54 \cdot P104}$

TABLE II-continued

OW-5 = $\overline{P55 \cdot P104}$

OW-6 = $\overline{P56 \cdot P104}$

OW-7 = $\overline{P57 \cdot P104}$

OW-8 = $\overline{P58 \cdot P104}$

OW-9 = $\overline{P59 \cdot P104}$

OW-10 = $\overline{P60 \cdot P104}$

OW-11 = $\overline{P61 \cdot P104}$

Discrete Outputs

D0-0 = FAH·P50
D0-1 = FAH·P51
D0-2 = FAH·P52
D0-3 = FAH·P53
D0-4 = FAH·P54
D0-5 = FAH·P55
D0-6 = FAH·P56
D0-7 = FAH·P57
D0-8 = FAH·P58
D0-9 = FAH·P59
D0-10 = FAH·P60
D0-11 = FAH·P61

S Terms

S3 = 1MHZ

S100 = FAB·$\overline{N_{20}Q}$

S101 = $\overline{S100 + S3 \cdot N_{20}Q}$

S103 = $\overline{\overline{S3 \cdot BS7}}$

BS7 = Bit time 7 in the servo bit time counter

S118 = $N_{20}Q \cdot \overline{N_{21}Q}$ $\emptyset A = N_{22}Q$
$\emptyset B = N_{23}Q$

TABLE III $FA = W0 \cdot \overline{K_1Q} \cdot (\overline{B15 \cdot Y3} + K_2Q)$ $FB = W0 \cdot K_1Q \cdot (\overline{B15 \cdot Y3} + K_2Q)$ $FC = W0 \cdot (B15 \cdot \overline{C_3Q} \cdot \overline{C_2Q} \cdot C_1Q \cdot \overline{C_0Q} \cdot \overline{K_{11}Q} \cdot K_{10}Q \cdot I_1 \cdot \overline{I_0} + K_2Q)$ $FD = \overline{C_3Q} \cdot \overline{C_2Q} \cdot K_5Q \cdot W1$ $FE = \overline{C_3Q} \cdot \overline{C_2Q} \cdot K_5Q \cdot W2$ $FF = \overline{C_3Q} \cdot \overline{C_2Q} \cdot K_5Q \cdot W3$ $FG = \overline{C_3Q} \cdot \overline{C_2Q} \cdot K_5Q \cdot W4$ $FH = \overline{C_3Q} \cdot \overline{C_2Q} \cdot K_5Q \cdot W5$ $FI = \overline{C_3Q} \cdot \overline{C_2Q} \cdot K_5Q \cdot W6$ $FJ = \overline{C_3Q} \cdot \overline{C_2Q} \cdot (\overline{K_4Q} + K_5Q) \cdot W7$ $FK = \overline{C_3Q} \cdot \overline{C_2Q} \cdot \overline{K_5Q} \cdot (B11 \cdot \overline{Y1} + K_3Q) \cdot \overline{FAI}$ $FL = \overline{C_3Q} \cdot \overline{C_2Q} \cdot \overline{K_5Q} \cdot (B11 \cdot Y1 + K_3Q) \cdot W1$ $FM = \overline{C_3Q} \cdot \overline{C_2Q} \cdot \overline{K_5Q} \cdot \overline{K_1Q} \cdot W2$ TABLE III-continued $FN = \overline{C_3Q} \cdot \overline{C_2Q} \cdot \overline{K_5Q} \cdot \overline{K_1Q} \cdot W3$ $FO = \overline{C_3Q} \cdot \overline{C_2Q} \cdot \overline{K_5Q} \cdot \overline{K_1Q} \cdot W4$ $FP = \overline{C_3Q} \cdot \overline{C_2Q} \cdot \overline{K_5Q} \cdot \overline{K_1Q} \cdot W5$ $FQ = \overline{C_3Q} \cdot \overline{C_2Q} \cdot \overline{K_5Q} \cdot \overline{K_1Q} \cdot W6$ $FR = \overline{C_3Q} \cdot \overline{C_2Q} \cdot \overline{K_5Q} \cdot K_4Q \cdot \overline{K_3Q} \cdot \overline{K_1Q} \cdot W7$ $FS = \overline{C_3Q} \cdot \overline{C_2Q} \cdot \overline{K_5Q} \cdot K_4Q \cdot K_3Q \cdot \overline{K_1Q} \cdot W7$ $FT = Y38 \cdot \overline{C_1Q} \cdot C_0Q$ $FU = Y38 \cdot C_1Q \cdot C_0Q$ $FV = Y38 \cdot C_1Q \cdot \overline{C_0Q}$ $FW = Y38 \cdot \overline{C_1Q} \cdot \overline{C_0Q} \cdot K_{11}Q$ $FX = Y38 \cdot \overline{C_1Q} \cdot \overline{C_0Q} \cdot \overline{K_{11}Q}$ $FY = \overline{C_3Q} \cdot C_2Q \cdot C_1Q \cdot \overline{C_0Q} \cdot \overline{K_{11}Q} \cdot K_{10}Q \cdot D_0Q \cdot W1$ $FZ = (C_3Q + C_2Q)W2$ $FAB = C_3Q \cdot \overline{C_2Q} \cdot C_1Q \cdot \overline{C_0Q} \cdot W1$ TABLE III-continued $FAC = C_3Q \cdot \overline{C_2Q} \cdot \overline{C_1Q} \cdot \overline{C_0Q} \cdot W1$ $FAD = C_3Q \cdot \overline{C_2Q} \cdot \overline{C_1Q} \cdot C_0Q \cdot \overline{K_{11}Q} \cdot W1$ $FAE = C_3Q \cdot \overline{C_2Q} \cdot \overline{C_1Q} \cdot C_0Q \cdot K_{11}Q \cdot \overline{K_{10}Q} \cdot W1$ $FAF = C_3Q \cdot \overline{C_2Q} \cdot \overline{C_1Q} \cdot C_0Q \cdot K_{11}Q \cdot K_{10}Q \cdot W1$ $FAG = C_3Q \cdot C_2Q \cdot C_1Q \cdot W1$ $FAH = C_3Q \cdot C_2Q \cdot \overline{C_1Q} \cdot W1$ $FAI = \overline{C_3Q} \cdot \overline{C_2Q} \cdot K_2Q \cdot \overline{K_1Q} \cdot W1$ $FAJ = L_1Q \cdot W3$ $FAK = \overline{L_1Q} \cdot \overline{P89} \cdot Y7 \cdot W3$ $FAL = K_1Q \cdot W4$ $FAM = K_1Q \cdot W5$ $FAN = K_1Q \cdot W6$ $FAO = K_1Q \cdot W7$ $FAP = \overline{C_3Q} \cdot C_2Q \cdot Y6 \cdot \overline{K_{10}Q} \cdot W1$ $FAQ = C_1Q \cdot C_0Q \cdot Y39$

TABLE IV

| | Logic Card | | | | | | | | | |
|---|---|---|---|---|---|---|---|---|---|---|
| | A | B | C | D | K | W | SPM | IFA-1 | IFA-2 | IFA-3 |
| | | | | | Reference Figure | | | | | |
| Pin | 6 | 7 | 8 | 9 | 10 | 11 | 12 | 13 | 14 | 15 |
| 1 | Vcc | Vcc | Vcc | Vcc | Vcc | Vcc | Vcc | Vcc | Vcc | Vcc |
| 2 | — | — | — | B14 | $\overline{P30}$ | — | — | C9Q | W0 | — |
| 3 | Vcc | Vcc | Vcc | Vcc | Vcc | Vcc | Vcc | Vcc | Vcc | Vcc |
| 4 | M6Q | — | — | B15 | FC | — | — | C6Q | — | — |
| 5 | M8Q | — | — | B13 | $\overline{B15}$ | P27 | — | C8Q | OW-7 | — |
| 6 | M7Q | B9 | — | $\overline{P12}$ | $\overline{W0}$ | P24 | — | C7Q | — | — |
| 7 | $\overline{M_{10}Q}$ | 8 MHZ | I2 | I0 | $\overline{Y11}$ | FAM | — | — | S1 | — |
| 8 | M9Q | B8 | — | I2 | $\overline{Y3}$ | Y11 | — | P105 | — | — |
| 9 | $\overline{M_{11}Q}$ | — | I3 | B4 | — | $\overline{FAL}$ | — | P104 | S0 | — |
| 10 | — | B6 | I4 | B7 | — | KIQ | — | OW-6 | — | — |
| 11 | P110 | — | I5 | I5 | — | $\overline{FD}$ | — | DI-5 | M1 | $\overline{S3}$ |
| 12 | $\overline{P110}$ | B5 | I7 | A | FAB | $\overline{P38}$ | — | DI-6 | — | — |
| 13 | — | — | $\overline{P113}$ | I7 | FK | P48 | — | DI-7 | — | $\overline{S0}$ |
| 14 | P110 | B4 | $\overline{P111}$ | B2 | P27 | — | — | DI-4 | $\overline{W0}$ | $\overline{S41}$ |
| 15 | FK | — | $\overline{P112}$ | I6 | FA1 | K5Q | — | P60 | — | — |
| 16 | FW | B3 | FAG | B0 | Y11 | Y10 | — | P59 | — | $\overline{S42}$ |
| 17 | — | — | $\overline{FV}$ | I4 | FL | W0 | — | P58 | B0 | — |
| 18 | W0 | B2 | P17 | B3 | D0Q | — | — | P57 | — | — |
| 19 | $\overline{FAD}$ | B0 | $\overline{FAH}$ | B6 | Y2 | K4Q | — | P56 | B3 | $\overline{S2}$ |
| 20 | $\overline{FAF}$ | B1 | W1 | $\overline{DCQ}$ | D2Q | W7 | — | P55 | B1 | $\overline{S1}$ |
| 21 | P16 | $\overline{P3}$ | C3Q | B5 | B11 | K3Q | — | P54 | — | — |
| 22 | P115 | — | P16 | I1 | DIQ | $\overline{FS}$ | — | P61 | B2 | — |
| 23 | $\overline{FAC}$ | B4Q | $\overline{K0Q}$ | P102 | — | — | — | L1Q | M0 | — |
| 24 | $\overline{FR}$ | — | $\overline{P7}$ | P37 | W0 | $\overline{P36}$ | — | DI-9 | T8 | — |
| 25 | D0Q | P93 | D1Q | $\overline{P112}$ | W1 | $\overline{P35}$ | — | DI-10 | S2 | — |
| 26 | P97 | — | — | P40 | W7 | $\overline{FR}$ | — | — | M2 | TX(0) |
| 27 | P114 | B7 | $\overline{Y6}$ | $\overline{P113}$ | — | K3Q | — | DI-11 | — | B5 |
| 28 | $\overline{FY}$ | P92 | $\overline{FAC}$ | $\overline{P3}$ | B0 | W1 | — | DI-8 | S3 | — |
| 29 | P98 | — | $\overline{FU}$ | B12 | C3Q | FA1 | — | C10Q | S9 | B6 |
| 30 | — | — | FU | P39 | $\overline{FV}$ | $\overline{PAJ}$ | $\overline{P48}$ | — | — | — |
| 31 | FAB | P3 | Y2 | P101 | Y10 | P87 | — | C12Q | P3 | B7 |

TABLE IV-continued

| | | | | | | | | | |
|---|---|---|---|---|---|---|---|---|---|
| 32 | P108 | — | $\overline{FAB}$ | $\overline{P111}$ | P99 | FJ | $\overline{P50}$ | C11Q | S11 | — |
| 33 | FAE | — | FY | P2 | FB | $\overline{FJ}$ | — | $\overline{D0\text{-}4}$ | T1 | B4 |
| 34 | $K_1Q$ | B15 | FY | B11 | $\overline{FAD}$ | P26 | $\overline{P51}$ | $\overline{D0\text{-}5}$ | P2 | — |
| 35 | FC | $\overline{P36}$ | I0 | P41 | FZ | P40 | — | $\overline{D0\text{-}7}$ | B10 | P51 |
| 36 | P28 | $\overline{B15}$ | — | P29 | — | $\overline{W7}$ | $\overline{P52}$ | OW-8 | T2 | — |
| 37 | $\overline{B0}$ | P109 | $\overline{FAF}$ | P4 | P0 | FZ | — | $\overline{D0\text{-}6}$ | B9 | B0 |
| 38 | FAQ | — | — | P21 | — | $\overline{P15}$ | $\overline{P53}$ | OW-7 | B11 | — |
| 39 | $\overline{FAL}$ | — | FAQ | P105 | $\overline{C3Q}$ | $\overline{P25}$ | — | $\overline{D0\text{-}10}$ | T0 | P104 |
| 40 | $\overline{P88}$ | P22 | $\overline{P12}$ | P99 | — | $\overline{W0}$ | $\overline{P54}$ | $\overline{D0\text{-}8}$ | $B_8$ | — |
| 41 | P21 | — | $\overline{D1Q}$ | P22 | $\overline{K1Q}$ | $\overline{P33}$ | — | $\overline{I1Q}$ | P1 | — |
| 42 | B9 | — | — | FAG | $\overline{K1Q}$ | — | $\overline{P55}$ | OW10 | T3 | — |
| 43 | FX | P21 | D0Q | FK | B14 | $\overline{F0}$ | — | $\overline{D0\text{-}11}$ | S8 | TTY"C" |
| 44 | P37 | $\overline{B0}$ | — | W0Q | P85 | P37 | $\overline{P56}$ | $\overline{D0\text{-}9}$ | P0 | — |
| 45 | $\overline{K_5Q}$ | — | FAB | $\overline{FD}$ | $\overline{P35}$ | $\overline{FF}$ | — | FAH | IW-0 | "C" |
| 46 | — | P24 | — | $\overline{FF}$ | — | P41 | $\overline{P57}$ | DW-9 | S10 | — |
| 47 | $\overline{FD}$ | — | $\overline{C3Q}$ | B0Δ | — | P98 | — | P104 | IW-4 | "C" |
| 48 | Y11 | $\overline{P38}$ | — | $\overline{FS}$ | $\overline{P106}$ | L1Q | $\overline{P133}$ | C13Q | P4 | — |
| 49 | B0 | — | P102 | $\overline{FY}$ | — | P2 | — | P50 | IW-3 | TS-7 |
| 50 | — | $\overline{D3Q}$ | — | $\overline{P90}$ | $\overline{L2Q}$ | — | C | P51 | YL5 | TS-5 |
| 51 | FU | — | — | Y11 | — | $\overline{P30}$ | — | P53 | S7 | TS-6 |
| 52 | — | $\overline{D2Q}$ | — | W1 | — | P97 | B | P52 | YL4 | TS-4 |
| 53 | B15 | — | — | K3Q | P4 | $\overline{K1Q}$ | — | OW-11 | J2 | $V_S$ |
| 54 | $\overline{P4}$ | $\overline{D1Q}$ | — | K4Q | $\overline{P3}$ | K2Q | A | — | S6 | — |
| 55 | P103 | — | I1 | $\overline{P44B}$ | $\overline{W7}$ | P39 | — | IW-5 | T6 | TX(1) |
| 56 | $\overline{P110}$ | $\overline{D_0Q}$ | — | $\overline{FAL}$ | $\overline{P53}$ | Y11 | $\overline{P3A}$ | IW-6 | — | IW-1 |
| 57 | $K_5Q \cdot \overline{Y11}$ | — | — | B10 | P53 | $\overline{P90}$ | — | IW-7 | B7 | B1 |
| 58 | — | P14 | — | $\overline{FAI}$ | P51 | B2Q | P47 | IW-4 | T5 | B2 |
| 59 | — | $\overline{P91}$ | Y11 | P44A | P51 | P17 | — | P108 | B4 | B3 |
| 60 | P85 | $\overline{P33}$ | — | $\overline{K5Q}$ | — | P47 | — | OW-11 | B6 | — |
| 61 | $\overline{P3C}$ | — | — | B | P52 | P88 | — | OW-4 | T7 | — |
| 62 | P2 | — | — | — | P28 | P511 | $\overline{P121C}$ | OW-5 | B5 | — |
| 63 | $\overline{FC}$ | — | $\overline{P91}$ | FY | P115 | M0Q | — | IW-3 | J0 | TS-3 |
| 64 | FB | B14 | — | FV | $\overline{P52}$ | $\overline{P89}$ | P85 | OW-3 | T4 | — |
| 65 | P0 | — | $\overline{P15}$ | W0 | $\overline{P50}$ | — | — | IW-0 | S5 | TS-2 |
| 66 | P4 | B13 | $\overline{Y3}$ | P114 | P50 | L3Q | — | IW-2 | J1 | — |
| 67 | D1-7 | — | $\overline{FAD}$ | $\overline{P133}$ | K3Q | — | — | D1-3 | MFE | TS-0 |
| 68 | $\overline{P44A}$ | B12 | FX | $\overline{P134}$ | K2Q | P3 | $\overline{P120D}$ | IW-1 | S4 | — |
| 69 | $\overline{P44B}$ | — | FW | C | $\overline{K0Q}$ | P11 | — | D1-2 | XL4 | TS-1 |
| 70 | $M_1Q$ | B11 | FAE | — | K3Q | — | $\overline{P120C}$ | D1-1 | XL2 | — |
| 71 | $M_0Q$ | — | — | $\overline{D1Q}$ | Y6 | $\overline{FY}$ | — | $\overline{D0\text{-}1}$ | — | C14Q |
| 72 | $M_2Q$ | B2Q | Y11 | P511 | P7 | P85 | $\overline{P121B}$ | D1-0 | YL1 | OW-8 |
| 73 | $M_3Q$ | — | $\overline{Y11}$ | $\overline{D2Q}$ | $\overline{FA}$ | — | — | $\overline{D0\text{-}2}$ | — | — |
| 74 | FT | B10 | W0 | $\overline{D3Q}$ | $\overline{P25}$ | — | $\overline{P120B}$ | $\overline{D0\text{-}0}$ | XL1 | — |
| 75 | $M_4Q$ | — | P14 | $\overline{D4Q}$ | $\overline{FC}$ | $\overline{LZQ}$ | — | C14Q | XL5 | — |
| 76 | $M_5Q$ | — | B11 | D5Q | P26 | — | $\overline{P121D}$ | $\overline{D0\text{-}3}$ | YL2 | — |
| 77 | GRD | GRD | GRD | GRD | GRD | GRD | GRD | GRD | GRD | GRD |
| 78 | — | — | P101 | D6Q | P26 | — | — | C15Q | YL3 | — |
| 79 | GRD | GRD | GRD | GRD | GRD | GRD | GRD | GRD | GRD | GRD |
| 80 | — | — | — | D7Q | — | — | — | A0Q | — | — |

TABLE IV-continued

| | | | | | | | | | | |
|---|---|---|---|---|---|---|---|---|---|---|
| 90 | — | — | — | $\overline{P136}$ | — | — | — | — | — | — |
| 91 | — | — | — | $\overline{P135}$ | — | — | — | — | — | — |
| 92 | — | — | — | P116 | — | — | — | — | — | — |
| 93 | — | — | — | $\overline{FAD}$ | — | — | — | — | — | — |

| | Logic Card | |
|---|---|---|
| | Servo Common | Servo Channel |
| | Reference Figure | |
| Pin | 16 | 17 |
| 1 | GND | 8 MHZ |
| 2 | GND | — |
| 3 | — | — |
| 4 | — | Resolver Rotor |
| 5 | $\overline{L_1Q}$ | — |
| 6 | — | — |
| 7 | — | +30 V |
| 8 | — | Resolver Ret. |
| 9 | φA | Resolver Ret. |
| 10 | $\overline{P3}$ | — |
| 11 | φB | — |
| 12 | N20Q | — |
| 13 | W$_0$ | — |
| 14 | — | — |
| 15 | $\overline{DC-13}$ | — |
| 16 | ΔX0Q | — |
| 17 | — | — |
| 18 | SD-13 | — |
| 19 | FRQ | +Ramp |
| 20 | S101 | −Ramp |
| 21 | S118 | — |
| A | −30 V | — |
| B | 68 VAC | — |
| C | CT | +20 V |
| D | −21 V | φB |
| E | +30 V | φA |
| F | −15 V | — |
| G | — | — |
| H | +Ramp | S3 = 1 MHZ |
| I | — | +70 V |
| J | +15 V | — |
| K | −RAMP | S118 |
| L | +20 V | $\overline{BS7}$ = 125 KHZ |
| M | 250 KHZ | 1/0-1 |
| N | 250 KHZ | S101 |
| O | — | — |
| P | $\overline{FAB}$ | 1/0-2 |
| Q | — | — |
| R | 8 MHZ | S100 |
| S | — | N20Q |
| T | 8 MHZ | S103 |
| U | — | −30 V |
| V | S3 | −21 V |
| W | S3 | — |
| X | $\overline{BS7}$ | — |
| Y | — | — |
| Z | — | 250 KHZ |
| 2A | — | 70 V Ret |
| 3A | — | Motor High |
| 4A | — | — |
| 5A | — | Motor Low |
| 6A | — | Motor Low Res. |
| 2B | — | φB |
| 3B | — | φB |
| 4B | — | — |
| 5B | — | φA |
| 6B | — | φA |
| A6 | S104(B) | — |
| B7 | S103(B) | — |
| T1 | 1 MH$_2$ | — |
| T5 | — | — |
| μ | $\overline{8\ MHZ}$ | — |

TABLE V

| Micro Operation | Word Time | Bit Times |
|---|---|---|
| FA | 0 | 16 |
| FB | 0 | 16 |
| FC | 0 | 16 |
| FD | 1 | 12 |
| FE | 2 | 8 |
| FF | 3 | 1 |
| FG | 4 | 12 |
| FH | 5 | 8 |
| FI | 6 | 8 |
| FJ | 7 | 12 |
| FK | 1 | 12 |
| FL | 1 | 1 |
| FM | 2 | 8 |
| FN | 3 | 8 |
| FO | 4 | 12 |
| FP | 5 | 8 |
| FQ | 6 | 8 |
| FR | 7 | 12 |
| FS | 7 | 12 |
| FT | 1 | 16 |
| FU | 1 | 16 |
| FV | 1 | 16 |
| FW | 1 | 16 |
| FX | 1 | 16 |
| FY | 1 | 16 |
| FZ | 2 | 8 |
| FAA | — | — |
| FAB | 1 | 16 |
| FAC | 1 | 16 |
| FAD | 1 | 16 |
| FAE | 1 | 1-16 |
| FAF | 1 | 1-16 |
| FAG | 1 | 12 |
| FAH | 1 | 12 |
| FAI | 1 | 12 |
| FAJ | 3 | 16 |
| FAK | 3 | 16 |
| FAL | 4 | 16 |
| FAM | 5 | 8 |
| FAN | 6 | — |
| FAO | 7 | 12 |
| FAP | — | — |
| FAQ | 1 | 16 |

CONCLUSION

Although there has been described above a specific arrangement of a numerical control system in accordance with the invention for the purpose of illustrating the manner in which the invention may be used to advantage, it will be appreciated that the invention is not limited thereto. Accordingly, any and all modifications, variations or equivalent arrangements which may occur to those skilled in the art should be considered to be within the scope of the invention.

What I claim is:

1. A machine control system comprising:
an operator input device for generating a machine direction signal in response to an operator action;
an integrated circuit stored program computer including
(a) an integrated circuit read only main memory for storing instructions,
(b) an integrated circuit alterable memory for storing computer operands,
(c) input logic for generating a computer input signal in response to the machine direction signal generated by said operator input device under control of the instructions stored in said main memory,
(d) storing logic for storing a machine direction related operand in said alterable memory under control of the instructions stored in said main memory in response to the computer input signal generated by said input logic,
(e) processor logic for processing a machine direction related operand stored in said alterable memory under control of the instructions stored in said main memory, and
(f) an output circuit for generating a machine direction command signal in response to the processing of the machine direction related operand by said processor logic; and
a machine controller for controlling direction of a machine in response to the machine direction command signal generated by said output circuit.

2. A machine control system, said system comprising:
an operator direction control device for generating an operator direction control signal to control direction of a machine;
an integrated circuit processor for controlling direction of a machine, said processor including
(a) an integrated circuit main memory for storing a program,
(b) integrated circuit input logic for generating a direction control input signal in response to the operator direction control signal generated by said operator direction control device under control of the program stored in said main memory,
(c) integrated circuit processing logic for processing the direction control input signal under control of the program stored in said main memory, and
(d) integrated circuit direction control output logic for generating a direction control output signal under control of the program stored in said main memory in response to the processing of the direction control input signal by said processing logic; and
a controller for controlling direction of motion of a machine in response to the direction control output signal generated by said direction control output logic.

3. The system as set forth in claim 1 above, further comprising a relay for controlling a machine in response to the machine direction command signal.

4. The system as set forth in claim 1 above, wherein said system is a numerical control system and wherein said system further comprises numerical control means for controlling a numerically controlled machine in response to the machine direction command signal.

5. The system as set forth in claim 4 above, further comprising a machine tool for cutting a part under control of said numerical control means.

6. A machine control system comprising:
an operator direction control device for generating a machine direction control signal in response to an operator action;
a stored program computer for processing digital operands under control of a stored program, said computer including
(a) an integrated circuit read only main memory for storing a program,
(b) an integrated circuit alterable memory for storing operands,
(c) storing logic for storing an operand in said alterable memory under control of the program stored in said main memory in response to the machine direction control signal generated by said operator direction control device, (d) processing logic for processing operands stored in said alterable memory under control of the program stored in said main memory, (e) control output logic for generating a machine direction control signal under control of the program stored in said main memory in response to an operand stored in said alterable memory, and (f) motion display output logic for generating a motion display output signal under control of the program stored in said main memory in response to an operand stored in said alterable memory;

a machine controller for controlling direction of motion of a machine in response to the machine motion direction control signal generated by said control output logic; and a motion display for displaying motion information to an operator in response to the motion display output signal generated by said motion display output logic.

7. The system as set forth in claim 1 above, further comprising a machine for performing a machine operation in response to the machine command signal, wherein said machine includes an error mechanism, wherein said processor logic includes means for processing the computer operands stored in said alterable memory to compensate for said machine error mechanism under control of the instructions stored in said read only main memory, and wherein said machine direction command signal is an error compensated machine direction command signal to compensate for the machine error mechanism generated in response to the processing of the machine direction related operand by said processing logic.

8. The system as set forth in claim 1 above, wherein said processor logic includes means for processing the computer operands stored in said alterable memory to compensate for a machine error mechanism, said system further comprising a machine for performing an error compensated machine operation under control of the machine controller.

9. A machine control system comprising:
an operator input device for generating a machine turret signal in response to an operator action;
an integrated circuit stored program computer including
(a) an integrated circuit read only main memory for storing instructions,
(b) an integrated circuit alterable memory for storing computer operands,
(c) input logic for generating a computer input signal in response to the machine turret signal generated by said operator input device under control of the instructions stored in said main memory,
(d) storing logic for storing a machine turret related operand in said alterable memory under control of the instructions stored in said main memory in response to the computer input signal generated by said input logic,
(e) processor logic for processing a machine turret related operand stored in said alterable memory under control of the instructions stored in said main memory, and
(f) an output circuit for generating a machine turret command signal in response to the processing of the machine turret related operand by said processor logic;

a machine controller for controlling a machine turret in response to the machine turret command signal generated by said output circuit; and a machine turret for positioning a machine element under control of the machine controller.

10. The system as set forth in claim 1 above, further comprising a magnetic control element for providing a mechanical control operation under control of the machine controller.

11. The system as set forth in claim 1 above, wherein said output circuit includes a pulse modulation circuit for generating the machine direction command signal as a pulse modulated machine direction command signal to control a machine in response to the computer operands stored in said alterable memory.

12. The system as set forth in claim 1 above, wherein said output circuit includes a pulse modulation circuit for generating the machine direction command signal as a pulse width modulated machine direction command signal in response to the computer operands stored in said alterable memory.

13. The system as set forth in claim 1 above, further comprising a frequency circuit for generating a frequency-related signal in response to the machine direction command signal.

14. A control system comprising:
an operator input device for generating an operator command signal;
a stored program data processor for processing digital information under control of a stored program, said data processor including
(a) an integrated circuit read only main memory for storing a control program,
(b) an integrated circuit alterable memory for storing operands,
(c) operator input logic for generating an operator input signal in response to the operator command signal generated by said operator input device,
(d) storing logic for storing operands in said alterable memory under control of the program stored in said main memory in response to the operator input signal generated by said operator input logic,
(e) processing logic for processing the operands stored in said alterable memory under control of the program stored in said main memory, and
(f) output logic for generating a control signal under control of the program stored in said main memory in response to the processing of operands by said processing logic; and
a process controller for controlling a process in response to the control signal generated by said output logic.

15. The system as set forth in claim 1 above, further comprising a digital-to-analog converter for generating an analog signal in response to the machine direction command signal.

16. The system as set forth in claim 1 above, further comprising an amplifier for generating an amplified signal in response to the machine direction command signal.

17. The system as set forth in claim 1 above, further comprising a power amplifier for generating a power-amplified signal in response to the machine direction command signal.

18. The system as set forth in claim 1 above, further comprising means for generating a square wave control signal in response to the machine direction command signal.

19. The system as set forth in claim 1 above, further comprising means for generating a velocity signal in response to the machine direction command signal.

20. The system as set forth in claim 1 above, further comprising means for generating a frequency-related signal in response to the machine direction command signal.

21. The system as set forth in claim 1 above, further comprising a phase locked loop for controlling phase relationships in response to the machine direction command signal.

22. A machine control system comprising:
an operator input device for generating a machine direction signal in response to an operator action;
an integrated circuit stored program computer including
(a) an integrated circuit read only main memory for storing instructions,
(b) an integrated circuit alterable memory for storing computer operands,
(c) an error detector for detecting a computer error under control of the instructions stored in said main memory,
(d) an error output circuit for generating an error output signal under control of the instructions stored in said main memory,
(e) input logic for generating a computer input signal in response to the machine direction signal generated by said operator input device under control of the instructions stored in said main memory,
(f) storing logic for storing a machine direction related operand in said alterable memory under control of the instructions stored in said main memory in response to the computer input signal generated by said input logic,
(g) processor logic for processing a machine direction related operand stored in said alterable memory under control of the instructions stored in said main memory, and
(h) an output circuit for generating a machine direction command signal in response to the processing of the machine direction related operand by said processor logic;
a machine controller for controlling direction of a machine in response to the machine direction command signal generated by said output circuit; and
an error display for displaying an error condition in response to the error output signal generated by said error output circuit.

23. The system as set forth in claim 1 above, further comprising an elemental extremity for performing an extremity-related operation in response to the machine direction command signal.

24. The system as set forth in claim 1 above, further comprising a minimal interface circuit for controlling a machine in response to the machine direction command signal.

25. A machine control system comprising:
a feedback device for generating a feedback signal related to a condition of a machine;
an operator input device for generating a machine direction signal in response to an operator action;
an integrated circuit stored program computer including
(a) an integrated circuit read only main memory for storing instructions,
(b) an integrated circuit alterable memory for storing computer operands,
(c) input logic for generating a computer input signal in response to the machine direction signal generated by said operator input device under control of the instructions stored in said main memory,
(d) feedback logic for generating a computer feedback signal in response to the feedback signal generated by said feedback device under control of the instructions stored in said main memory,
(e) storing logic for storing a machine direction related operand in said alterable memory under control of the instructions stored in said main memory in response to the computer input signal generated by said input logic,
(f) processor logic for processing a machine direction related operand stored in said alterable memory under control of the instructions stored in said main memory in response to the computer feedback signal generated by said feedback logic, and
(g) an output circuit for generating a machine direction command signal in response to the processing of the machine direction related operand by said processor logic; and
a controller for controlling direction of a machine in response to the machine direction command signal generated by said output circuit.

26. The system as set forth in claim 1 above, wherein said output circuit includes a sequential circuit for generating the machine direction command signal as a sequence of digital bits.

27. A machine control system comprising:
an operator input device for generating a rotation input signal;
a stored program computer for generating a rotation command output signal in response to the rotation input signal, said computer including
(a) an integrated circuit main memory for storing computer instructions,
(b) an integrated circuit alterable memory for storing at least one operand,
(c) input logic for generating a computer input signal in response to the rotation input signal generated by said operator input device,
(d) processor logic for processing the operand stored in said alterable memory under control of the instructions stored in said main memory in response to the rotation related computer input signal generated by said input logic, and
(e) output logic for generating the rotation command output signal in response to the processing of the operand stored in said alterable memory under control of the computer instructions stored in said main memory; and
a controller for controlling rotational path of a machine in response to the rotation command output signal generated by said output logic.

28. A machine control system comprising:
an operator command device for generating operator input signals in response to operator activation, said operator input device including
(a) a motion command operator device for generating an operator motion command signal in response to operator action, (b) a stop command operator device for generating an operator stop command signal in response to operator action, and (c) a direction command operator device for generating an operator direction command signal in response to operator action;

an integrated circuit computer for controlling a machine, said computer including (a) an integrated circuit read only main memory for storing a computer program, (b) integrated circuit motion command input logic for generating a motion command input signal under control of the computer program stored in said main memory in response to the operator motion command signal generated by said motion command operator device, (c) integrated circuit stop command input logic for generating a stop command input signal under control of the computer program stored in said main memory in response to the operator stop command signal generated by said stop command operaator device, (d) integrated circuit direction command input logic for generating a direction command input signal under control of the computer program stored in said main memory in response to the operator direction command signal generated by said direction command operator device, (e) integrated circuit motion control processing logic for generating a motion control output signal under control of the computer program stored in said main memory in response to the motion command input signal generated by said motion command input logic, (f) integrated circuit stop control processing logic for generating a stop control output signal under control of the computer program stored in said main memory in response to the stop command input signal generated by said stop command input logic, and (g) integrated circuit direction control processing logic for generating a direction control output signal under control of the computer program stored in said main memory in response to the direction command input signal generated by said direction command input logic; and a controller for controlling a machine, said controller including (a) a motion controller for controlling motion of a machine in response to the motion control output signal generated by said motion control processing logic, (b) a stop controller for controlling stopping of motion of said machine in response to the stop control output signal generated by said stop control processing logic, and (c) a direction controller for controlling direction of motion of said machine in response to the direction control output signal generated by said direction control processing logic.

29. A machine control system comprising:

an operator input device for generating a motor speed input signal;

a stored program computer for generating a motor speed command output signal in response to the motor speed input signal, said computer including (a) an integrated circuit main memory for storing computer instructions, (b) an integrated circuit alterable memory for storing at least one operand, (c) input logic for generating a computer input signal in response to the motor speed input signal generated by said operator input device, (d) processor logic for processing the operand stored in said alterable memory under control of the instructions stored in said main memory in response to the motor speed related computer input signal generated by said input logic, and (e) output logic for generating the motor speed command output signal in response to the processing of the operand stored in said alterable memory under control of the computer instructions stored in said main memory; and a controller for controlling speed of a motor in response to the motor speed command output signal generated by said output logic.

30. A machine control system comprising:

an operator input device for generating a velocity input signal;

a stored program computer for generating a velocity command output signal in response to the velocity input signal, said computer including (a) an integrated circuit main memory for storing computer instructions, (b) an integrated circuit alterable memory for storing at least one operand, (c) input logic for generating a computer input signal in response to the velocity input signal generated by said operator input device, (d) processor logic for processing the operand stored in said alterable memory under control of the instructions stored in said main memory in response to the velocity related computer input signal generated by said input logic, and (e) output logic for generating the velocity command output signal in response to the processing of the operand stored in said alterable memory under control of the computer instructions stored in said main memory; and a controller for controlling velocity of machine motion in response to the velocity command output signal generated by said output logic.

31. A machine control system comprising:

a speed input device for generating a speed input signal in relation to a desired speed;

a stored program computer for generating a speed command output signal in response to the speed input signal, said computer including (a) an integrated circuit main memory for storing computer instructions, (b) an integrated circuit alterable memory for storing at least one operand, (c) input logic for generating a computer input signal in response to the speed input signal generated by said speed input device, (d) processor logic for processing the operand stored in said alterable memory under control of the instructions stored in said main memory in response to the computer input signal generated by said input logic, and (e) output logic for generating the speed command output signal in response to the processing of the operand stored in said alterable memory with said processor logic under control of the computer instructions stored in said main memory; and a controller for controlling speed of a machine in response to the speed command output signal generated by said output logic.

32. A machine control system comprising:
a plurality of input devices for generating digital input signals, said plurality of input devices including
   (a) an operator speed control input device for generating an operator speed control signal in response to operator activation and
   (b) an operator stop control input device for generating an operator stop control signal in response to operator activation;
a stored program digital computer for controlling a machine under control of a stored program, said digital computer including
   (a) an integrated circuit read only main memory for storing a program,
   (b) speed control input logic for generating a speed control input signal under control of the program stored in said main memory in response to the operator speed control signal generating by said operator speed control input device,
   (c) stop control input logic for generating a stop control input signal under control of the program stored in said main memory in response to the operator stop control signal generated by said operator stop control input device,
   (d) speed control processing logic for generating a speed control output signal under control of the program stored in said main memory in response to the speed control input signal generated by said speed control input logic, and
   (e) stop control processing logic for generating a stop control output signal under control of the program stored in said main memory in response to the stop control input signal generated by said stop control input logic; and
a machine controller for controlling a machine, said machine controller including
   (a) a speed controller for controlling speed of a machine in response to the speed control output signal generated by said speed control processing logic and
   (b) a stop controller for stopping motion of a machine in response to the stop control output signal generated by said stop control processing logic.

33. A machine control system comprising:
an operator input device for generating a rotation input signal;
a stored program computer for generating a rotation command output signal in response to the rotation input signal, said computer including
   (a) an integrated circuit main memory for storing computer instructions,
   (b) an integrated circuit alterable memory for storing at least one operand,
   (c) input logic for generating a computer input signal in response to the rotation input signal generated by said operator input device,
   (d) processor logic for processing the operand stored in said alterable memory under control of the instructions stored in said main memory in response to the rotation related computer input signal generated by said input logic, and
   (e) output logic for generating the rotation command output signal in response to the processing of the operand stored in said alterable memory under control of the computer instructions stored in said main memory; and
a digital-to-analog converter for generating an analog signal in response to the rotation command output signal generated by said output logic to control rotational path of a machine.

34. The system as set forth in claim 27 above, wherein said controller includes an amplifier for generating an amplified signal in response to the output signal.

35. The system as set forth in claim 27 above, wherein said controller includes a power amplifier for generating a power control signal in response to the output signal.

36. The system as set forth in claim 27 above, wherein said input device includes means for generating the input signal in response to a controlled condition of a machine and wherein said computer includes means for generating the output signal in response to the input signal.

37. A machine control system comprising:
an operator input device for generating a position input signal;
a stored program computer for generating a position command output signal in response to the position input signal, said computer including
   (a) an integrated circuit main memory for storing computer instructions,
   (b) an integrated circuit alterable memory for storing at least one operand,
   (c) input logic for generating a computer input signal in response to the position input signal generated by said operator input device,
   (d) processor logic for processing the operand stored in said alterable memory under control of the instructions stored in said main memory in response to the position related computer input signal generated by said input logic, and
   (e) output logic for generating the position command output signal in response to the processing of the operand stored in said alterable memory under control of the computer instructions stored in said main memory; and
a controller for controlling position of a machine element in response to the position command output signal generated by said output logic.

38. A machine control system comprising:
an operator input device for generating a mechanical position input signal;
a stored program computer for generating a mechanical position command output signal in response to the mechanical position input signal, said computer including
   (a) an integrated circuit main memory for storing computer instructions,
   (b) an integrated circuit alterable memory for storing at least one operand,
   (c) input logic for generating a computer input signal in response to the mechanical position input signal generated by said operator input device,
   (d) processor logic for processing the operand stored in said alterable memory under control of the instructions stored in said main memory in responses to the mechanical position related computer input signal generated by said input logic, and (e) output logic for generating the mechanical position command output signal in response to the processing of the operand stored in said alterable memory under control of the computer instructions stored in said main memory; and a controller for changing a mechanical position to change an operating condition of a machine in response to the mechanical position command output signal generated by said output logic.

39. The system as set forth in claim 27 above, wherein said controller includes means for controlling rotational path of a machine tool in response to the rotational command output signal.

40. A machine control system comprising:
an operator input device for generating a rotation input signal;
a stored program computer for generating a rotation command output signal in response to the rotation input signal, said computer including
  (a) an integrated circuit main memory for storing computer instructions,
  (b) an integrated circuit alterable memory for storing at least one operand,
  (c) input logic for generating a computer input signal in response to the rotation input signal generated by said operator input device,
  (d) processor logic for processing the operand stored in said alterable memory under control of the instructions stored in said main memory in response to the rotation related computer input signal generated by said input logic, and
  (e) output logic for generating the rotation command output signal in response to the processing of the operand stored in said alterable memory under control of the computer instructions stored in said main memory; and
a closed loop controller for providing closed loop rotational path control of a machine in response to the rotation command output signal generated by said output logic.

41. The system as set forth in claim 27 above, wherein said input device includes an electro-magnetic sensor for generating the input signal in response to a sensed condition.

42. The system as set forth in claim 27 above, wherein said input device includes an electro-magnetic resolver for generating the input signal in response to resolver position.

43. The system as set forth in claim 27 above, wherein said input device includes mechanical input device for generating the input signal in response to a mechanical condition.

44. The system as set forth in claim 27 above, wherein said input device includes a mechanical switch for generating the input signal in response to switch actuation.

45. A machine control system comprising:
an operator motion control device for generating an operator motion control signal to control motion of a machine;
an integrated circuit processor for controlling motion of a machine, said processor including
  (a) an integrated circuit main memory for storing a program,
  (b) integrated circuit input logic for generating a motion control input signal in response to the operator motion control signal generated by said operator motion control device under control of the program stored in said main memory,
  (c) integrated circuit processing logic for processing the motion control input signal under control of the program stored in said main memory,
  (d) integrated circuit motion control output logic for generating a motion control output signal under control of the program stored in said main memory in response to the processing of the motion control input signal by said processing logic, and
  (e) integrated circuit operator display output logic for generating a motion display output signal under control of the program stored in said main memory in response to the processing of the motion control input signal by said processing logic;
a machine for providing motion in response to the motion control output signal generated by said motion control output logic; and
an operator display for displaying machine motion information to an operator in response to the motion display output signal generated by said operator display output logic.

46. The system as set forth in claim 2 above, wherein said machine control system is a process control system, wherein said machine is a process machine, wherein the operator direction control device is a push button switch, and wherein the direction control output signal is a machine plus and minus direction control signal.

47. The system as set forth in claim 32 above, wherein said machine is a machine tool, wherein said operator speed control input device is a cycle start momentary switch, wherein said operator stop control input device is a cycle stop momentary switch, and wherein said machine controller is a closed loop servo.

48. The system as set forth in claim 45 above, wherein said machine control system is a machine tool control system, wherein said machine is a milling machine, and wherein said operator motion control device is a momentary switch.

* * * * *